United States Patent
Tanizaki et al.

(10) Patent No.: US 8,339,850 B2
(45) Date of Patent: Dec. 25, 2012

(54) SEMICONDUCTOR DEVICE

(75) Inventors: Hiroaki Tanizaki, Itami (JP); Yuichi Kunori, Tokyo (JP); Tomoshi Futatsuya, Tokyo (JP); Kenji Koda, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 376 days.

(21) Appl. No.: 12/766,624

(22) Filed: Apr. 23, 2010

(65) Prior Publication Data
US 2010/0290292 A1 Nov. 18, 2010

(30) Foreign Application Priority Data

May 15, 2009 (JP) ................................ 2009-119016

(51) Int. Cl.
G11C 11/34 (2006.01)
G11C 16/04 (2006.01)
G11C 16/06 (2006.01)
G11C 5/14 (2006.01)

(52) U.S. Cl. ......... 365/185.05; 365/185.01; 365/185.14; 365/185.18; 365/185.21; 365/185.29; 365/189.09

(58) Field of Classification Search ............. 365/185.01, 365/185.05, 185.14, 185.18, 185.21, 185.29, 365/189.09
See application file for complete search history.

(56) References Cited

U.S. PATENT DOCUMENTS

| | | | | |
|---|---|---|---|---|
| 7,209,386 B2* | 4/2007 | Yeh | ...................... | 365/185.03 |
| 7,366,015 B2* | 4/2008 | Kobayashi et al. | ...... | 365/185.05 |
| 2008/0251832 A1 | 10/2008 | Chih et al. | | |
| 2010/0044773 A1* | 2/2010 | Ishigaki et al. | ............... | 257/320 |

FOREIGN PATENT DOCUMENTS

| | | |
|---|---|---|
| JP | 01-091395 | 4/1989 |
| JP | 2008-270708 | 11/2008 |

* cited by examiner

Primary Examiner — Ly D Pham
(74) Attorney, Agent, or Firm — McDermott Will & Emery LLP

(57) ABSTRACT

The present invention provides a semiconductor device having a nonvolatile memory function capable of shortening an erase time and executing data access efficiently. When, under the control of a command register/control circuit, an erase voltage is applied to an embedded erase gate wiring disposed in a memory cell boundary region, and an electrical charge is transferred between a floating gate and an embedded erase gate to thereby perform an erase operation, a read selection voltage is applied to a memory gate line and an assist gate line during the application of the erase voltage to thereby carry out the reading of data.

6 Claims, 65 Drawing Sheets

|  |  | MG | SL | AG | BL(D) | EG |
|---|---|---|---|---|---|---|
| WRITE | SELECTION | 10 | 5 | 1.5 | 0 | OPEN (OR 0) |
|  | NON-SELECTION | 0 | 0 | 0 | 1.5 | |
| ERASE | SELECTION | 0 | 0 | OPEN | OPEN | 10 |
|  | NON-SELECTION |  |  |  |  | 0 |
| READ | SELECTION | 0 | 0 | 1.5 | 1.0 | OPEN (OR 0) |
|  | NON-SELECTION |  |  | 0 | 0 | |

SEMICONDUCTOR DEVICE

CROSS-REFERENCE TO RELATED APPLICATIONS

The disclosure of Japanese Patent Application No. 2009-119016 filed on May 15, 2009 including the specification, drawings and abstract is incorporated herein by reference in its entirety.

BACKGROUND OF THE INVENTION

The present invention relates to a semiconductor device having the function of storing information therein on a non-volatile basis, and particularly to a semiconductor device having nonvolatile memory cells each storing information therein on a non-volatile basis according to the amount of an electrical charge accumulated in a charge storage layer such as a floating gate. More specifically, the present invention relates to a configuration for performing data access in parallel during an erase operation mode.

A flash memory is of a memory which stores information therein on a non-volatile basis. The flash memory has been widely used for the storage of boot program information to a processor and the storage of an application data/program such as download data to a portable device, etc.

A mixed flash memory built in a microcomputer normally has a memory size which ranges from a few KB (K bytes) to a few hundred KB. When an erase operation is carried out in a normal NOR-type flash memory cell, it is necessary to apply −10V to a control gate thereof and apply 10V to a substrate region. This substrate erase voltage is transferred to source and bit lines through source and drain regions of a memory cell transistor. Thus, upon a verify operation for confirming an erase state of the memory cell, there is a need to reset each region to an initial state for the execution of verify reading, and erase verify is performed after a predetermined time has elapsed from the stop of the supply of the erase voltage. A problem therefore arises in that the erase operation becomes long.

As the flash memory, there is known a memory in which a background operation mode (BGO mode) for performing data read access on another memory bank while an erase operation is being performed on one memory bank is supported. The flash memory equipped with the BGO mode however needs a plurality of banks. A small-scale memory like the mixed flash memory built in the microcomputer is accompanied by a problem that its area increases due to plural bank configurations and the area of the microcomputer increases correspondingly.

There is known a flash memory equipped with a suspend mode in order to improve access efficiency in an erase mode. In the suspend mode, an erase operation is temporarily stopped to perform data reading (external access). After the completion of this read operation, the stopped erase operation is resumed again. Therefore, a control circuit for temporarily stopping the erase operation is required and hence a problem arises in that the area of the control circuit increases. A problem also arises in that the time necessary for erasure becomes long because the erase operation is stopped.

Such a configuration that erase gates are caused to extend in a word line (memory cell row) direction and separated every block, and erasure is performed in block units, has been shown in a patent document 1 (Japanese Unexamined Patent Publication No. Hei 1 (1989)-91395). In a nonvolatile memory cell shown in the patent document 1, a positive high voltage of, for example, 27V is applied to its erase gate upon an erase operation. A bit line, a source line and a control gate thereof are set to 0V. Thus, electrons are pulled out from a floating gate thereof to the erase gate so that the floating gate is positively charged. At data writing, the control gate is set to a positive high voltage of, for example, 21V, the drain is set to 10V, the source is set to 0V, and the control gate is set to, for example, 5V. Thus, hot electrons are generated in the neighborhood of the drain, so that high-energy electrons generated by impact ionization thereof are injected into the floating gate. An erase gate line is coupled in common to erase lines within each block and erasure can hence be performed in block units. Thus, the patent document 1 can realize the shortening of erase time.

Such a configuration that an erase gate is formed by an impurity layer to reduce the size of a memory cell has been shown in a patent document 2 (Japanese Unexamined Patent Publication No. 2008-270708). In the configuration shown in the patent document 2, a first program line, a first erase line and a first word line are disposed in a first direction. The first program line is coupled to a program gate (impurity region) of the memory cell. The first erase line is coupled to an erase gate (impurity region) thereof. The first word line is coupled to a word line node (control gate) thereof. In the patent document 2, an impurity layer that configures the erase gate is placed between an impurity region that configures a program gate line and an impurity region coupled to a bit line. The erase gate line and the program line are arranged in the same direction to thereby allow the impurity region of the erase gate to be shared for each adjacent memory cell in the same row, thus making it possible to reduce a memory cell size. Further, the erase line and the program line are arranged in the same direction to thereby limit a program operation and an erase operation to one page (word line), thus making it possible to suppress the occurrence of program disturbance with respect to another page.

SUMMARY OF THE INVENTION

As shown in the above patent document 1, the erase gate line is disposed in the word line direction, and the control gate and erase gate are disposed in separate form, thereby making it possible to separate the erase gate line to which the erase voltage is applied, and the memory gate line, bit line and source line necessary for writing and reading from one another. In the configuration of the patent document 1, however, the erase voltage is formed over a substrate region, and the reading or writing of data cannot be performed in a state in which the erase voltage has been applied. Consideration is given to the fact that only the erase operation is performed singly. No consideration is given to such a configuration that writing or reading is performed in parallel with the erase operation like the BGO mode or the suspend mode. The high voltage of, for example, 27V has been applied to the erase gate line. When erase verify is carried out, there is a need to read data after the voltage on the erase gate line has been reduced sufficiently. A problem therefore arises in that it becomes difficult to shorten the erase time.

In the configuration shown in the patent document 2, the impurity layers are disposed as the program gate and the erase gate in parallel aside from the source/drain impurity regions of each memory transistor. It is thus possible to share the erase gate region between the adjacent memory cells and reduce the size of the memory cell. In the configuration of the patent document 2, however, the impurity region that configures the program gate and the impurity region that configures the erase gate are disposed within one memory cell region in parallel with the source and drain impurity regions of the memory transistor, thereby causing a problem that it becomes difficult to reduce the memory cell size.

Although the patent document 2 has disclosed that the erase gate region and the program gate region are caused to extend in the same direction as the word line, and the erasure is performed in the page units, no consideration is given to such a configuration that data access is performed in another page or at another block during an erase mode in page units.

Therefore, an object of the present invention is to provide a semiconductor device and a memory cell structure capable of executing data access without exerting an adverse effect on an erase operation upon the erase operation without increasing a memory cell size.

Another object of the present invention is to provide a semiconductor device and a memory cell structure capable of performing data access in a BGO mode or a suspend mode even in a single bank configuration.

In one embodiment of a semiconductor device according to the present invention, the semiconductor device has a plurality of memory cells. Each of the memory cells includes a memory transistor having a floating gate formed over a substrate region and a memory gate disposed over the floating gate; an assist gate transistor which has an assist gate disposed adjacent to the floating gate and the memory gate and which is coupled in series to the memory transistor; and an embedded erase gate formed in the surface of the substrate region. The memory cell stores nonvolatile data therein according to the amount of an electrical charge accumulated in the floating gate.

In the one embodiment, the semiconductor device according to the present invention includes a plurality of memory gate lines disposed corresponding to respective memory cell rows and coupled to their corresponding memory gates of the memory cells in the corresponding rows; a plurality of assist gate lines disposed corresponding to the respective memory cell rows and coupled to their corresponding assist gates of the memory cells in the corresponding rows; embedded erase gate wirings disposed in the substrate region surface, corresponding to respective memory cell columns and coupled to their corresponding embedded erase gates in the corresponding columns; a plurality of source lines disposed corresponding to the respective memory cell columns and coupled to their corresponding first conduction nodes of the memory transistors of the memory cells in the corresponding columns; a plurality of bit lines disposed corresponding to the respective memory cell columns and coupled to their corresponding second impurity regions of the assist gate transistors of the memory cells in the corresponding columns; and a control circuit which generates a control signal for performing an operation designated to each memory cell designated in accordance with an operation mode instruction and an address signal. The control circuit includes an erase controller which, when an erase operation is designated, designates voltages supplied to the source line, the memory gate line and the embedded erase gate wiring for each selected memory cell and controls the erase operation, and a read controller which designates voltages necessary for reading, supplied to the assist gate line and the bit line for the selected memory cell and controls a read operation.

In the one embodiment, the semiconductor device further includes a voltage generator which generates a voltage designated from each of the erase controller and the read controller, an erase circuit which transfers the erase voltage outputted from the voltage generator to the embedded erase gate wiring of each selected memory cell, and a read circuit which supplies the read voltage outputted from the voltage generator to each selected memory cell to read out data stored in the selected memory cell. The read circuit is operation-controlled so as to read the stored data during application of the erase voltage by the erase circuit.

In another embodiment, a semiconductor device according to the present invention includes a memory array, an erase control circuit and a data access control circuit. The memory array is arranged in a matrix form. The memory array has a plurality of nonvolatile memory cells each provided with at least a charge storage layer for storing at least data therein and an erase gate for erasing data, and is divided into a plurality of blocks.

The erase control circuit is provided in common to the blocks and controls the operation of applying an erase voltage to at least the erase gate with respect to the selected block of the memory array to thereby erase data stored in each nonvolatile memory cell in the selected block.

The data access control circuit is provided in common to the blocks and controls the operation of performing data access to each nonvolatile memory cell of the corresponding block different from the selected block during application of the erase voltage to the selected block.

In a further embodiment, a semiconductor device according to the present invention has a memory array having a plurality of nonvolatile memory cells. Each of the nonvolatile memory cells includes a selection transistor which has a single layer selection gate and is selectively brought to conduction in response to a selection signal; a memory transistor of a single layer gate structure, which is coupled in series to the selection transistor and has a charge storage layer placed in a floating state, which accumulates an electrical charge therein and a first impurity region coupled to a source line; and an erase gate which is placed in a memory cell boundary region and which is formed in a surface of an isolation film for separating the adjacent memory cells from each other and transfers an electrical charge to the charge storage layer upon an erase operation.

The semiconductor device further includes a plurality of word lines disposed corresponding to respective memory cell rows and to which the selection gates of the nonvolatile memory cells in their corresponding rows are coupled, and a plurality of bit lines disposed corresponding to respective memory cell columns and to which second impurity regions of the selection transistors of the memory cells in their corresponding columns are coupled.

In yet another embodiment, a semiconductor device according to the present invention includes a memory array having a plurality of nonvolatile memory cells. Each of the nonvolatile memory cells includes a selection transistor which has first and second selection gate layers stacked over each other and electrically short-circuited and which is selectively brought into conduction in response to a selection signal; a memory transistor of a stacked gate structure, which is coupled in series with the selection transistor and has a charge storage layer placed in a floating state, which accumulates an electrical charge therein and a control function which is formed over the chare storage layer and controls the transfer of an electrical charge to the charge storage layer; and an erase gate which is formed over an insulating film for separating the adjacent memory cells from each other in a memory cell boundary region and transfers an electrical charge to the charge storage layer upon an erase operation.

The semiconductor device further includes a plurality of word lines disposed corresponding to respective memory cell rows and coupled to selection gates of the selection transistors of the memory cells in their corresponding rows are coupled, and a plurality of bit lines disposed corresponding to respective memory cell columns and coupled to impurity regions of the selection transistors of the memory cells in their corresponding columns.

An erase gate is provided in each nonvolatile memory cell. An electrical charge is transferred between the erase gate and a charge storage layer. Reading/writing of data is performed in parallel with the application of an erase voltage. Thus, even in a single bank configuration, data access can be carried at a background in an erase operation and hence access efficiency is improved.

An increase in the layout area of each memory cell is suppressed by placing an erase gate over a device isolation region lying between the cells as a memory cell structure.

DETAILED DESCRIPTION OF THE PREFERRED EMBODIMENTS

First Embodiment

Figure 1:
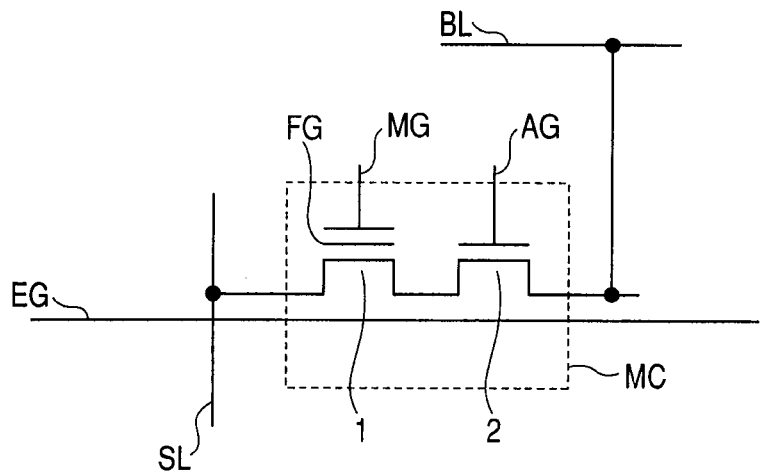
FIG. 1 is a diagram showing a typical equivalent circuit of a memory cell of a semiconductor device according to a first embodiment of the present invention.

FIG. 1 is a diagram schematically showing an electrical equivalent circuit of a memory cell in a semiconductor device employed in the first embodiment of the present invention. In FIG. 1, the memory cell MC includes a memory transistor 1 having a floating gate FG, and an assist gate transistor (selection transistor) 2 coupled in series with the memory transistor 1. The memory transistor 1 is of an N channel MOS transistor (insulated gate field effect transistor) having a stacked gate structure of a floating gate FG and a memory gate MG formed in its upper layer and has a source impurity region coupled to a source line SL. The assist gate transistor 2 is of an N channel MOS transistor of a single layer gate structure having an assist gate AG and has an impurity region coupled to a bit line BL. An impurity region is not formed between these assist gate transistor 2 and memory gate transistor 1.

The memory cell MC further has an erase gate EG. The erase gate EG is formed in the surface of a device isolation region (STI (Shallow Trench Isolation) film) for separating each memory cell so as to consecutively extend along a column direction (bit line extending direction). An electrical charge is transferred between the erase gate EG and the floating gate FG to pull out or draw electrons from the floating gate FG to the erase gate EG, thereby performing an erase operation. An increase in the layout area of the memory cell MC is suppressed by providing the erase gate EG in parallel with the bit line BL in a boundary region of the memory cell MC by an embedded wiring.

Figure 2:
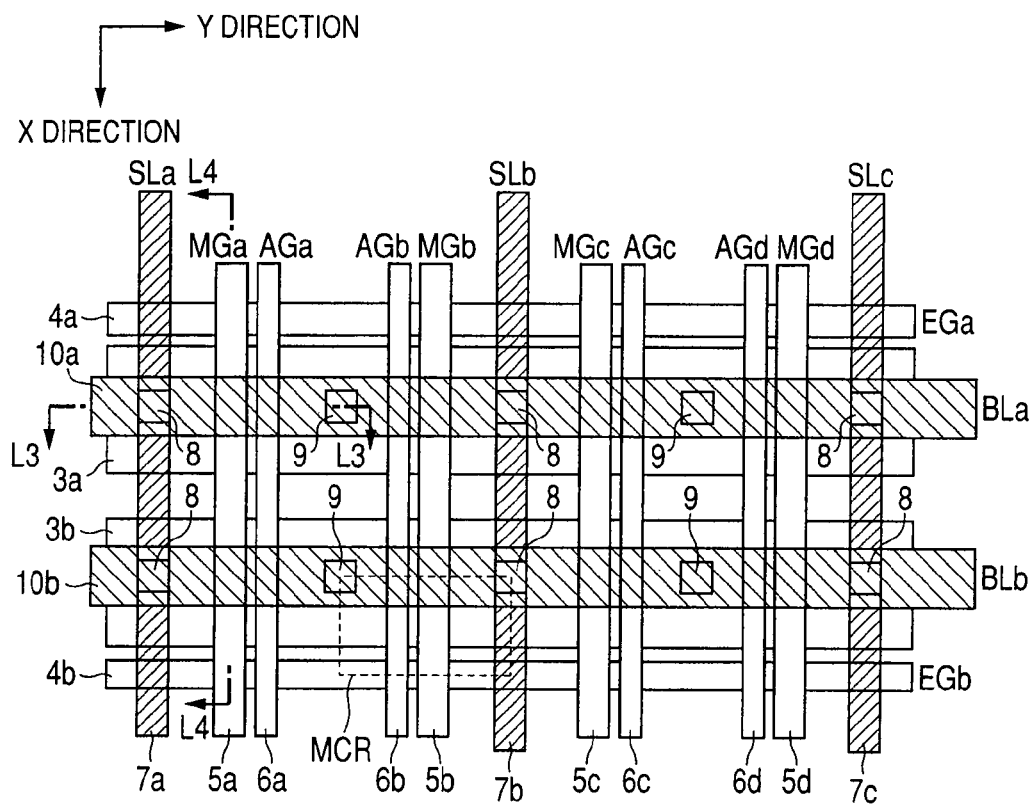
FIG. 2 is a diagram schematically showing a planar layout of each memory cell of the semiconductor device according to the first embodiment of the present invention.

FIG. 2 is a diagram schematically showing a planar layout of memory cells. In FIG. 2, active regions 3a and 3b are arranged so as to be spaced apart from each other along a Y direction (column direction) and to consecutively extend along the Y direction respectively. The memory transistor 1 and the assist gate transistor 2 shown in FIG. 1 are formed in each of the active regions 3a and 3b.

Memory gate wirings 5a through 5d and assist gate wirings 6a through 6d are respectively disposed adjacent to one another so as to consecutively extend in a direction orthogonal to the active regions 3a and 3b, i.e., an X direction (row direction). The memory gate wirings 5a through 5d configure memory gates MGa through MGd, and the assist gate wirings 6a through 6d configure assist gates AGa through AGd, respectively.

Metal wirings 7a through 7c that respectively form source lines SLa through SLc are arranged between the memory gate wirings 5a through 5d so as to consecutively extend in the X direction and to be spaced apart from one another. The source metal wirings 7a through 7c are electrically coupled to their corresponding impurity regions formed in lower active regions by source contacts 8.

Metal wirings 10a and 10b that respectively form bit lines BLa and BLb are respectively disposed over the active regions 3a and 3b so as to consecutively extend in the Y direction. The bit line metal wirings 10a and 10b are coupled to their corresponding impurity regions formed in the active regions 3a and 3b through bit line contacts 9 defined between the assist gate wirings 6a and 6b that configure the assist gates respectively.

The shallow trench isolation film is formed in the device isolation region between the active regions 3a and 3b as will be described later. Embedded erase gate wiring layers 4a and 4b are formed over the shallow trench isolation film so as to consecutively extend along the Y direction and used as erase gates EGa and EGb respectively. The embedded erase gate wiring layers are not provided between the active regions 3a and 3b. An erase gate line is commonly shared for memory cells of two rows.

In the planar layout shown in FIG. 2, a memory cell region MCR indicated by a broken-line block in FIG. 2 includes a bit line contact 9, an assist gate AG, a memory gate MG, a source line contact 8 and an erase gate EG. The bit line contact 9 and the source line contact 8 are shared for memory cells adjacent to each other in the Y direction, and a memory cell layout area is hence reduced. Providing the erase gate line in common to the memory cells provided in two rows makes it possible to set the minimum erase unit to the memory cells of two rows.

Figure 3:
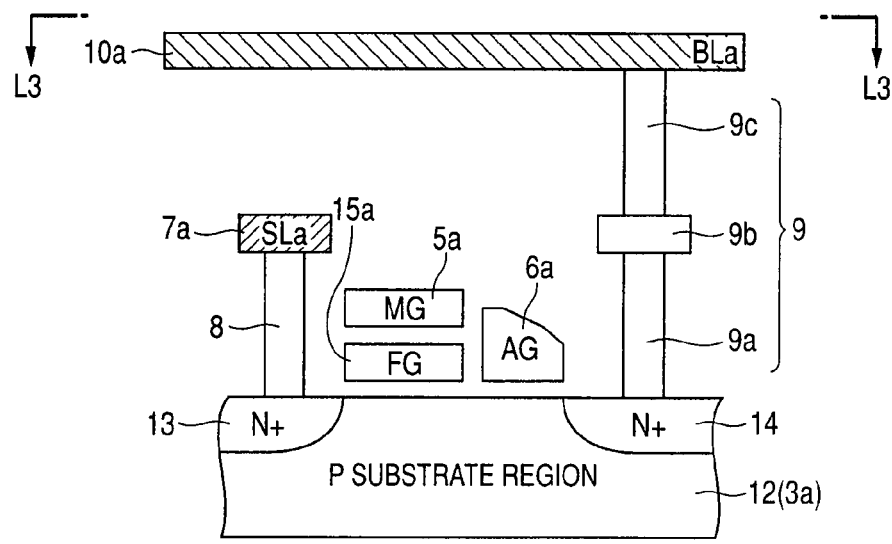
FIG. 3 is a diagram schematically illustrating a sectional structure taken along line L3-L3 shown in FIG. 2.

FIG. 3 is a diagram schematically showing a sectional structure taken along line L3-L3 shown in FIG. 2. In FIG. 3, N-type impurity regions 13 and 14 are formed in the surface of a P-type semiconductor substrate region 12 with being spaced apart from each other. The P-type semiconductor substrate region 12 corresponds to the active region 3a shown in FIG. 2.

The impurity region 13 is electrically coupled via the source line contact 8 to the metal wiring 7a for forming the source line SLa. On the other hand, the impurity region 14 is electrically coupled via the bit line contact 9 to the metal wiring 10a for forming the bit line BLa. The bit line contact 9 includes plugs 9a and 9c and an intermediate wiring 9b provided between these plugs 9a and 9c.

A charge storage layer 15 that configures a floating gate FG, and a gate wiring 5a that forms a memory gate MG are disposed over the substrate region lying between the impurity regions 13 and 14 with both being aligned with each other and stacked on each other. A gate wiring 6a that forms an assist gate AG is disposed adjacent to the floating gate FG and the memory gate MG. The assist gate AG simply selectively forms a channel in the surface of the lower substrate region 12.

Figure 4:
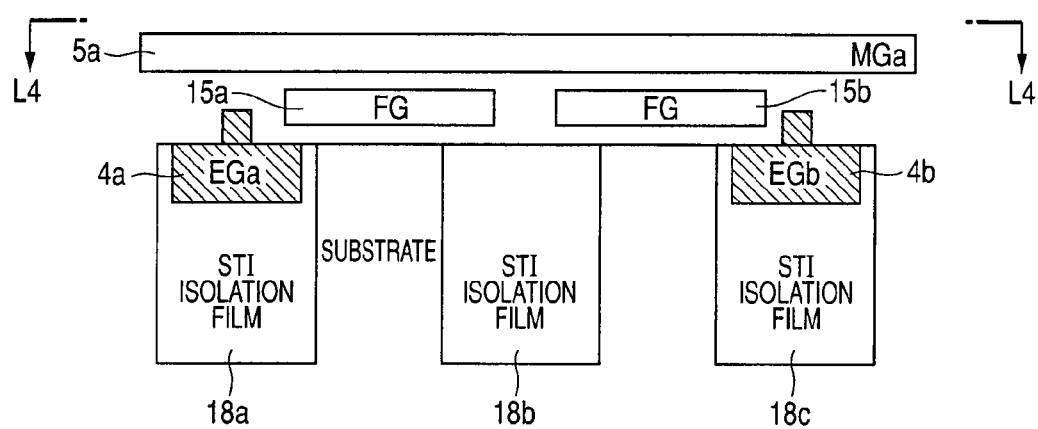
FIG. 4 is a diagram schematically depicting a sectional structure taken along line L4-L4 shown in FIG. 2.

FIG. 4 is a diagram schematically showing a sectional structure taken along line L4-L4 shown in FIG. 2. In a region taken along line L4-L4, the memory gate MGa is formed by the memory gate line 5a, and a channel region exists in the surface of the substrate region at its lower portion. No impurity regions are provided thereat. The respective active regions (3a and 3b) are separated from one another by STI (Shallow Trench Isolation) isolation films 18a, 18b and 18c.

Charge storage layers 15a and 15b that configure the floating gates FG are respectively disposed over the active regions (each not shown clearly; channel forming region of memory transistor accurately). Embedded wiring layers 4a and 4b each having a protrusion at its upper portion are formed in the surfaces of the STI isolation films 18a and 18c. The protrusions thereof adjoin the charge storage layers 15a and 15b that configure the floating gates. Although the embedded wiring layer that configures the erase gate EG is not formed in the central STI isolation film 18b in FIG. 4, the embedded wiring layer may be formed therein.

Figures 5, 6:
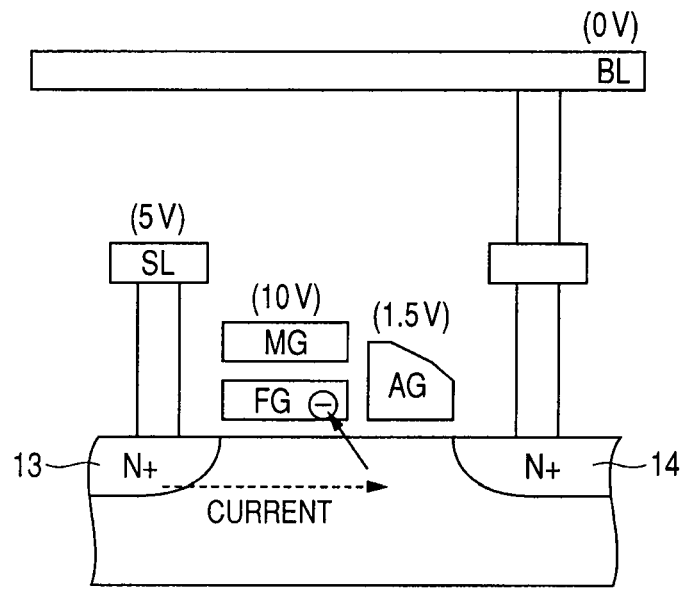
FIG. 5 is a diagram showing, in list form, applied voltages in respective operation modes of the memory cell shown in FIG. 1.
FIG. 6 is a diagram typically illustrating the flow of applied voltages and electrons the at writing-in of the memory cell shown in FIG. 1.

FIG. 5 is a diagram showing, in list form, voltages in respective operation modes, which are applied to the memory gate MG, source line SL, assist gate AG, bit line BL and erase gate EG in the respective operation modes. The respective operation modes will be explained below with reference to the applied voltages shown in FIG. 5.

FIG. 6 is a diagram showing voltages applied to each selected memory cell MC at data writing to the memory cell MC. In this case, as shown in FIG. 5, 10V is applied to the memory gate MG of the selected memory cell MC, and 5V is applied to the source line SL. 1.5V is applied to the assist gate AG, and 0V is set to the bit line BL. The embedded erase gate EG not shown in FIG. 6 is set to an open state or ground voltage (0V).

In this state, a low voltage of 1.5V or so is applied to the assist gate AG, and a channel having a relatively high resistance is formed in its lower substrate surface. Current flows from the source line SL to the bit line BL through the impurity regions 13 and 14. The channel of relatively high resistance has been formed underneath the assist gate AG. Thus, a high electric field is generated in a channel boundary region of this high resistance, and electrons gain energy by the high electric field to assume hot electrons. With the high voltage of the memory gate MG, the generated electrons (hot electrons) are injected into the floating gate FG. Consequently, the threshold voltage of the memory transistor becomes higher.

As for each non-selected memory cell, the memory gate MG, source line SL and assist gate AG are set to 0V, and the bit line BL is set to 1.5V. A non-selected memory gate MG and a non-selected assist gate AG are 0V, a channel is not formed and hence no current flows.

The bit line BL is set to 1.5V with respect to each non-selected memory cell due to the following reasons. Namely, as shown in FIG. 2, the assist gate wirings each configuring the assist gate AG, and the bit lines BL are disposed in the direction orthogonal to one another. Thus, the assist gate AG is 1.5V corresponding to a selected state at each memory cell lying in the selected row and non-selected column. By setting the bit line BL to 1.5V, the gate and source (assist gate AG and impurity region 14) of an assist gate transistor at the non-selected memory cell become equal in potential, and the channel is not formed below the assist gate AG. Hence, no current flows between the impurity regions 13 and 14. Thus, the writing of data into the memory cell placed in the semi-selected state is prevented.

Figure 7:
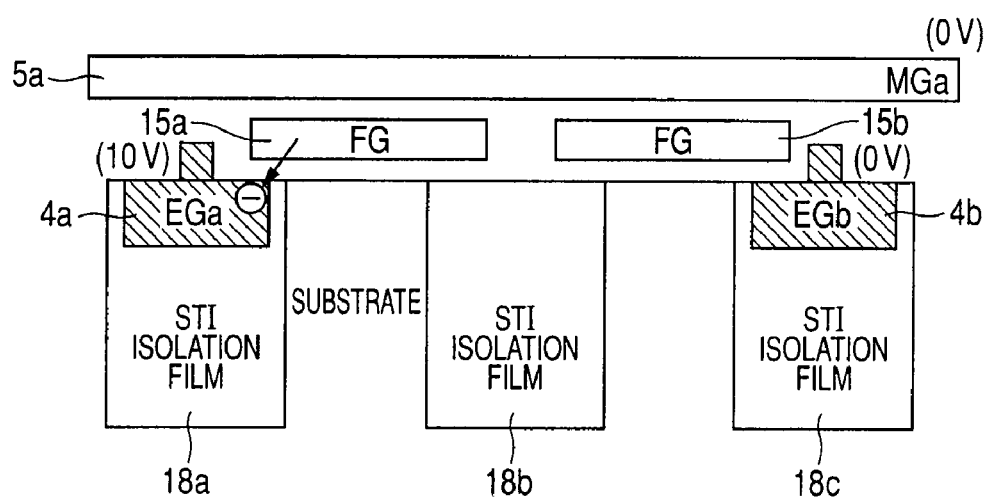
FIG. 7 is a diagram showing the flow of applied voltages and electrons at erasure of the memory cell shown in FIG. 1.

FIG. 7 is a diagram showing voltages applied to the memory cell at erasure along with its sectional structure. As shown in FIGS. 5 and 7, upon erasure, the memory gate MG and source line SL are set to the ground voltage (0V) regardless of the selected memory cell and the non-selected memory cell, and the assist gate AG and the bit line BL are set to the open state. 10V is applied to the embedded erase gate EGa of the selected memory cell, and 0V is applied to the erase gate EGb of the non-selected memory cell. In this case, as shown in FIG. 7, a large electric field is applied between the charge storage layer 15a and the embedded erase gate EGa, so that electrons flow out from the floating gage 15a to the embedded erase gate wiring layer 4a by the Fowler-Nordheim current. Thus, the amount of electrical charges stored in the charge storage layer 15a is reduced and the threshold voltage of the memory transistor is decreased. On the other hand, 0V is applied to the embedded erase gate EGb, and no high electric field is applied between the floating gate FGb (charge storage layer 15b) and the embedded erase gate EGb, thereby causing no transfer of charge.

When, upon the erase operation, a positive erase high voltage is applied to the substrate region to discharge electrons from the floating gate FG to the substrate region, a high voltage from the substrate region is similarly applied by the source and drain impurity regions, so that the capacitance of coupling between the floating gate FG and the substrate region becomes large, thus making it unable to pull out the load (electrons) efficiently. On the other hand, when the embedded erase gate EG is utilized, an electric field is simply generated between the protrusion above the substrate region, of each of the embedded erase gate wiring layers 4a and 4b formed in the surfaces of the STI isolation films 18a and 18c and its corresponding floating gate FG. It is possible to reduce the coupling and perform erasure at a low voltage. Further, the embedded erase gates EG are formed in the surfaces of the STI isolation films 18a and 18c, and the high voltage at the erasure is not applied to the source and bit lines, thereby making it possible to reduce power consumption. As will be explained later, each embedded erase gate is separated from the bit line, source line and memory gate line, and data access can be performed on the corresponding memory cell in a state in which the erase voltage is being applied to the embedded erase gate.

Figure 8:
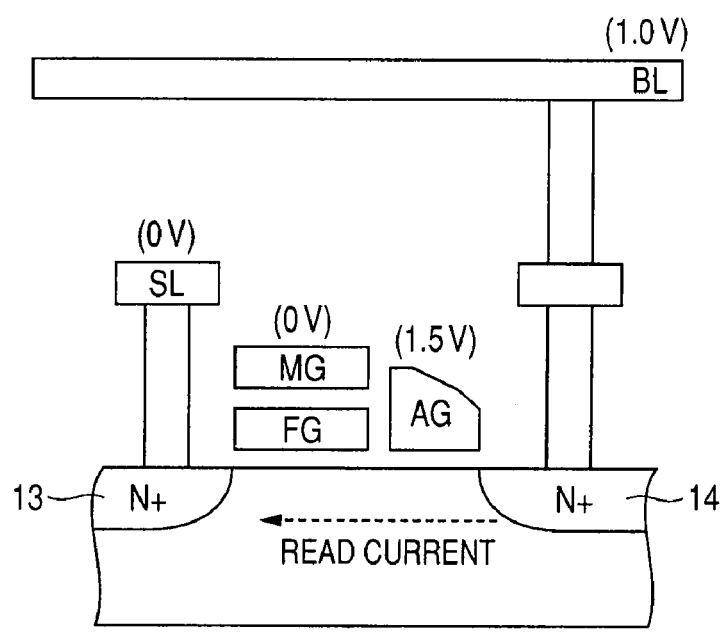
FIG. 8 is a diagram depicting the flow of applied voltages and current at data reading of the memory cell shown in FIG. 1.

FIG. 8 is a diagram schematically showing flowing paths of applied voltages and current at data reading of the memory cell. When the memory cell is of the selected cell as shown in FIG. 5, a read voltage of 1.0V is applied to the bit line BL, and 1.5V is applied to the assist gate AG. 0V is set to the memory gate MG and the source line SL. Upon normal reading, the embedded erase gate EG is set to the open state or ground voltage (0V).

When the floating gate FG of the memory cell is in an erase state, the memory transistor is in a depression state and a channel is formed at its lower portion, so that current flows from the bit line BL to the source line SL (channel is formed below the assist gate AG).

On the other hand, when the floating gate FG is in a write state (programmed state), the threshold voltage of the memory transistor is large and no channel is formed in the substrate region surface of the memory transistor (portion below the memory gate). In this case, little current flows from the bit line BL to the source line SL. When this erase state is associated with the logic "1" and the write state is associated with the logic "0", data stored in the memory cell can be detected by detecting current flowing through the bit line BL by an unillustrated sense amplifier.

At each non-selected memory cell, the assist gate AG thereof and the bit line BL are set to 0V. Even at memory cells in each selected row and non-selected column, their bit lines BL and source lines SL are identical in position and no current flows therethrough. Thus, the reading of data is not performed.

In the case of the configuration of the memory cell in which the electrical charge is transferred between the floating gate and the embedded erase gate to perform erasure using the embedded erase gate, a write current is small (source side injection has been performed and writing can be performed efficiently with low current consumption (about 10 µA)). 5V and 10V are required upon the writing, and 10V is required upon the erasure. A power supply circuit which generates power supply voltages corresponding to two types in total is simply required. Current consumption at the erasure and writing are small and the size of a circuit (charge pump circuit) for generating ease and write high voltages can be reduced. Correspondingly, a layout area can be reduced.

In the present invention, data access is performed within the same memory block in parallel with the erasure, utilizing the memory cell structure having the embedded erase gates.

Figure 9:
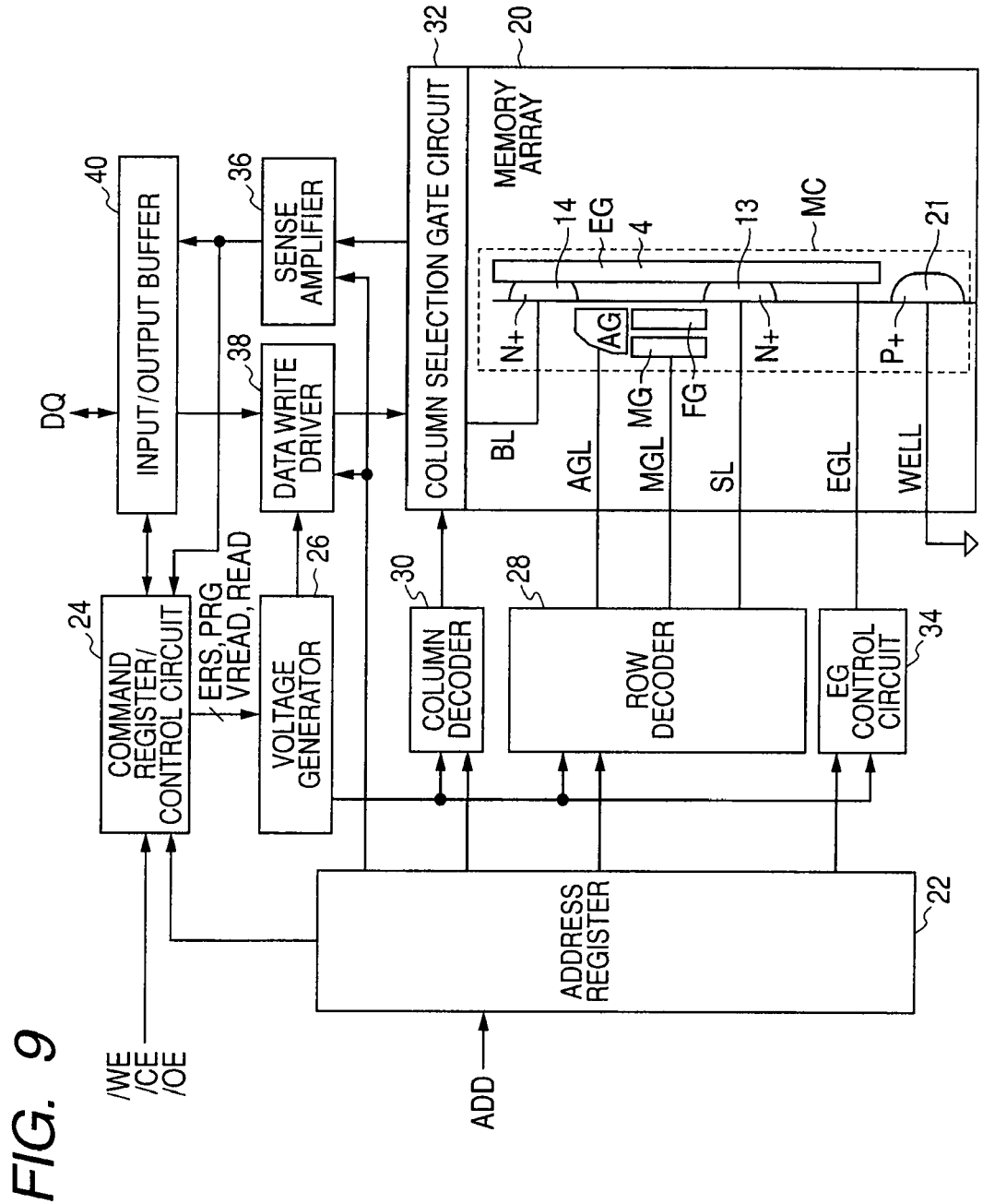
FIG. 9 is a diagram schematically showing an overall configuration of the semiconductor device according to the first embodiment of the present invention.

FIG. 9 is a diagram schematically showing an overall configuration of the semiconductor device according to the first embodiment of the present invention. In FIG. 9, the semiconductor device includes a memory array 20 in which memory cells MC are arranged in matrix form. In FIG. 9, one memory cell MC is typically illustrated within the memory array 20. The memory cell MC includes a source impurity region 13, a drain impurity region 14, an embedded erase gate wiring 4 that configures an embedded erase gate EG, and a P-type impurity region 21 for applying a well voltage WELL to a well region. The well voltage WELL is fixed to a ground voltage level in the configuration shown in FIG. 9.

An assist gate AG, a floating gate FG and a memory gate MG are formed over a substrate region of the memory cell MC. The assist gate AG of each memory cell lying along one row is coupled to its corresponding assist gate line MGL. The memory gate MG of each memory cell lying along one row is coupled to its corresponding memory gate line MGL. Further, a source line SL is coupled to its corresponding impurity region 13. Since a voltage of 5V is applied to the source line SL in a write mode, a voltage level thereof is set by a row decoder 28 to be described later. A bit line BL is provided in common to its corresponding impurity region 14 of each memory cell of one row.

The semiconductor device further includes an address register 22 which receives an address ADD given from outside, a command register/control circuit 24 which identifies a designated operation mode in response to an address issued from the address register 22 and external control signals /WE, /CE and /OE and performs operation control necessary for the designated operation, and a voltage generator 26 which generates a voltage corresponding to the operation mode in accordance with an operation mode instruction issued from the command register/control circuit 24.

The control signal /WE is of a write enable signal, and the control signal /CE is of a chip enable signal, which indicates that the semiconductor device has been selected. The control signal /OE is of output enable, which provides a data read timing. A command for designating an operation mode and timing provided to take in or capture an address for designating each memory cell targeted for access are defined according to changes in these control signals /WE and /CE. This command is given through an address input node and a data input node.

The voltage generator 26 generates a voltage (10V) necessary for an erase operation in an erase mode and generates voltages of 5V, 10V and 1.5V in a write mode. In a read mode, the voltage generator 26 generates a voltage of 1.5V for the assist gate and a voltage of 1.0V to be applied to the bit line BL.

Furthermore, the semiconductor device includes the row decoder 28 which performs a row selection, a column decoder 30 and a column selection gate circuit 32 which perform a column selection, and an EG control circuit 34 which sets an erase gate voltage. The row decoder 28 transfers a voltage supplied from the voltage generator 26 to an assist gate line AGL and a memory gate line MGL corresponding to each selected row of the memory array 20 in accordance with the address signal given from the address register 22. The row decoder 28 includes a source line decoder 28 and transfers the write voltage of 5V to the source line targeted for writing in each selected column at data writing.

The column decoder 30 decodes a column address signal supplied from the address register 22 to thereby generate a column selection signal for selecting a bit line corresponding to each column of the memory array 20 and generate a column selection signal having a voltage level from the voltage generator 26. The column selection gate circuit 32 selects a bit line in the selected column in accordance with the column selection signal from the column decoder 30.

The EG control circuit 34 transfers the erase voltage supplied from the voltage generator 26 to an erase gate line EGL targeted for erasure in accordance with the address signal supplied from the address register 22 upon the erase operation.

The EG control circuit 34 supplies the erase voltage given from the voltage generator 26 onto the write erase gate line EGL to which the erase voltage has been transferred. The row decoder 28 and the column decoder 30 perform a memory cell selection in parallel during the application of an erase high voltage from the EG control circuit 34 and executes the reading of memory cell data for erase verify.

The semiconductor device still further includes a sense amplifier 36 which reads data of each memory cell, a data write driver 38 which performs writing of data into each selected memory cell, and an input/output buffer 40 which transmits and receives data DQ to and from the outside. The data write driver 38 and the sense amplifier 36 are supplied with the address issued from the address register 22 and selects one of a plurality of columns (per 1I/O) and executes data writing and reading. The data write driver 38 is supplied with the write voltage from the voltage generator 26 and transfers a bit line write voltage to the selected column.

When the writing of "0" data is performed by the data write driver 38, the voltage of the bit line BL is set to 0V and data "0" is written. On the other hand, when data "1" is stored, a voltage of 1.5V is applied to the bit line BL and the selected memory cell is maintained in a low threshold voltage state corresponding to an erase state.

Upon data writing, the input/output buffer 40 generates internal write data from the external data DQ and transfers it to the data write driver 38. Upon data reading, the input/output buffer 40 buffer-processes internal read data supplied from the sense amplifier 36 to generate external output data DQ. A data output timing is determined by the control signal /OE.

The command register/control circuit 20 and the voltage generator 26 are used to generate internal voltages corresponding to the respective operation modes and control internal operations. The command register/control circuit 24 is comprised of, for example, a sequence controller and sequentially controls internal operations necessary for erasing, writing and reading in accordance with a sequence set to the sequence controller.

Figure 10:
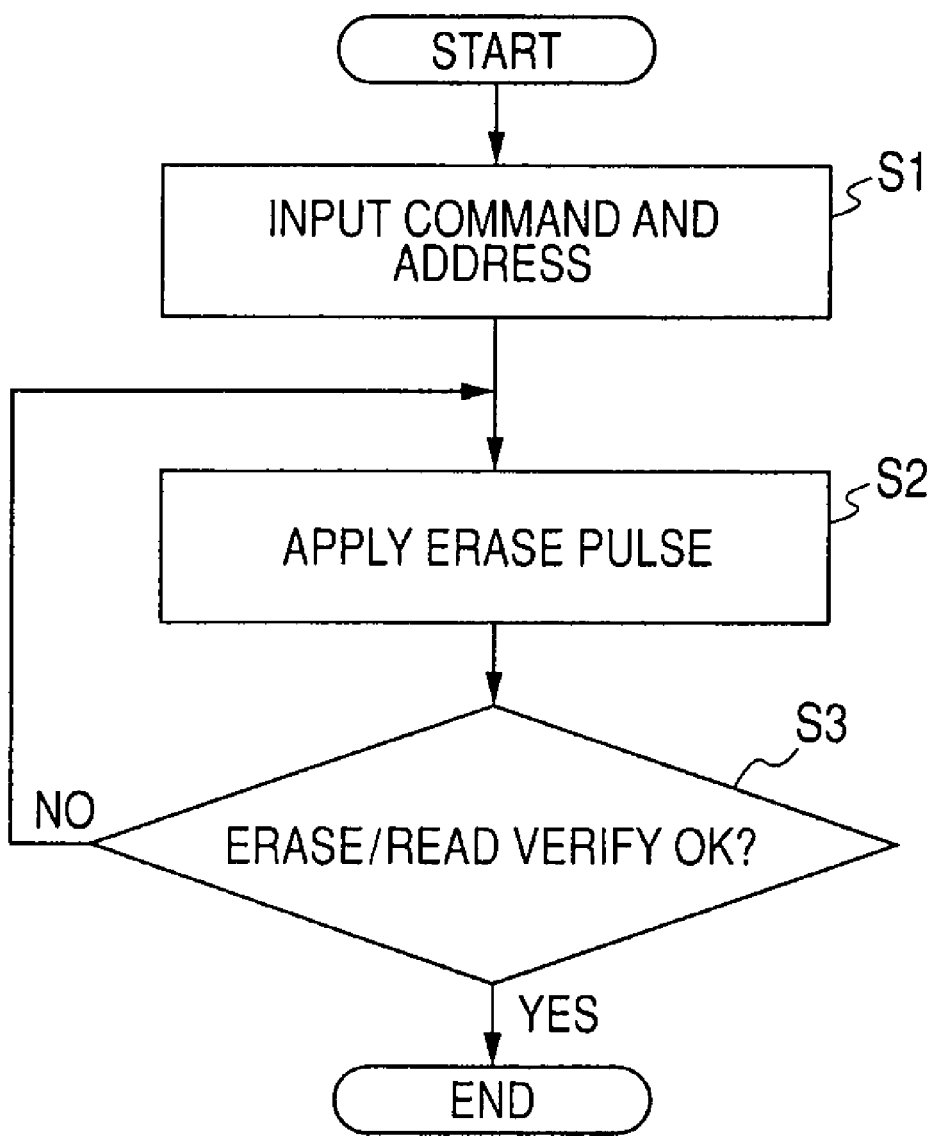
FIG. 10 is a flowchart showing an operation at the erasure of the semiconductor device according to the first embodiment of the present invention.

FIG. 10 is a flowchart showing an operation at erasure, of the semiconductor device shown in FIG. 9. The erase operation of the semiconductor device shown in FIG. 9 will be explained below with reference to FIG. 10.

A command for instructing the erase operation, and an address indicative of a memory cell region targeted for erasure are supplied from outside (Step S1). The command register/control circuit 24 shown in FIG. 9 supplies an erase mode instruction ERS to the voltage generator 26 in accordance with the command and the address to allow the voltage generator 26 to generate a voltage necessary for the erase operation.

In an erase mode, the row decoder 28 sets the assist gate line AGL and the memory gate line MGL to an open state (or 0V) and 0V respectively. Signals outputted from the column decoder 30 are all in a non-selected state. The column selection gate circuit 32 maintains all of the bit lines BL in the open state.

In this state, an erase high voltage (erase pulse) is applied to the erase gate line EGL of the selected memory cell (Step S2). Namely, the EG control circuit 34 shown in FIG. 9 transfers the erase high voltage supplied from the voltage generator 26 to its corresponding embedded erase gate line EGL disposed for the selected memory cell.

In the state in which the erase pulse has been applied, the reading of data of each memory cell targeted for erasure is next performed to identify or verify whether the memory cell is in an erase state, i.e., a low threshold voltage state (Step S3). When a memory cell placed in a non-erase state exists upon this erase verify, the erase pulse application step from Step S2 is executed again. On the other hand, when all the memory cells targeted for erasure are determined to be in the erase state, the erase operation is completed.

The erase high voltage is normally of a voltage level of 10V, for example. The erase voltage is generally generated using the charge pump circuit at the voltage generator 26. Accordingly, a time of a few 100 μs or so is required when the erase high voltage is raised to a predetermined level at the start of erasure and lowered to a predetermined level at the stop of erasure. The reading of memory cell data is performed using this fall time so that the erase verify can be performed, thereby making it possible to shorten the erase time. Particularly even in a state in which the erase gate line EGL is maintained at an H level indicative of its selected state, the erase verify can be executed and the erase time can hence be shortened. Since the selection transistor (assist gate AG) exists in this case, the memory transistor does not cause a problem in particular even in an over-erase state (depression state). Even though the reading of data from the memory cell is performed upon the application of the erase pulse, and a state in which the erase pulse is applied during a period longer than usual occurs, no particular problem arises.

Incidentally, when the memory cell placed in the non-erase state exists even at one bit upon the erase verify at the first erasure, a second erase pulse (erase high voltage) is applied to the memory cell targeted for erasure again.

Figure 11:
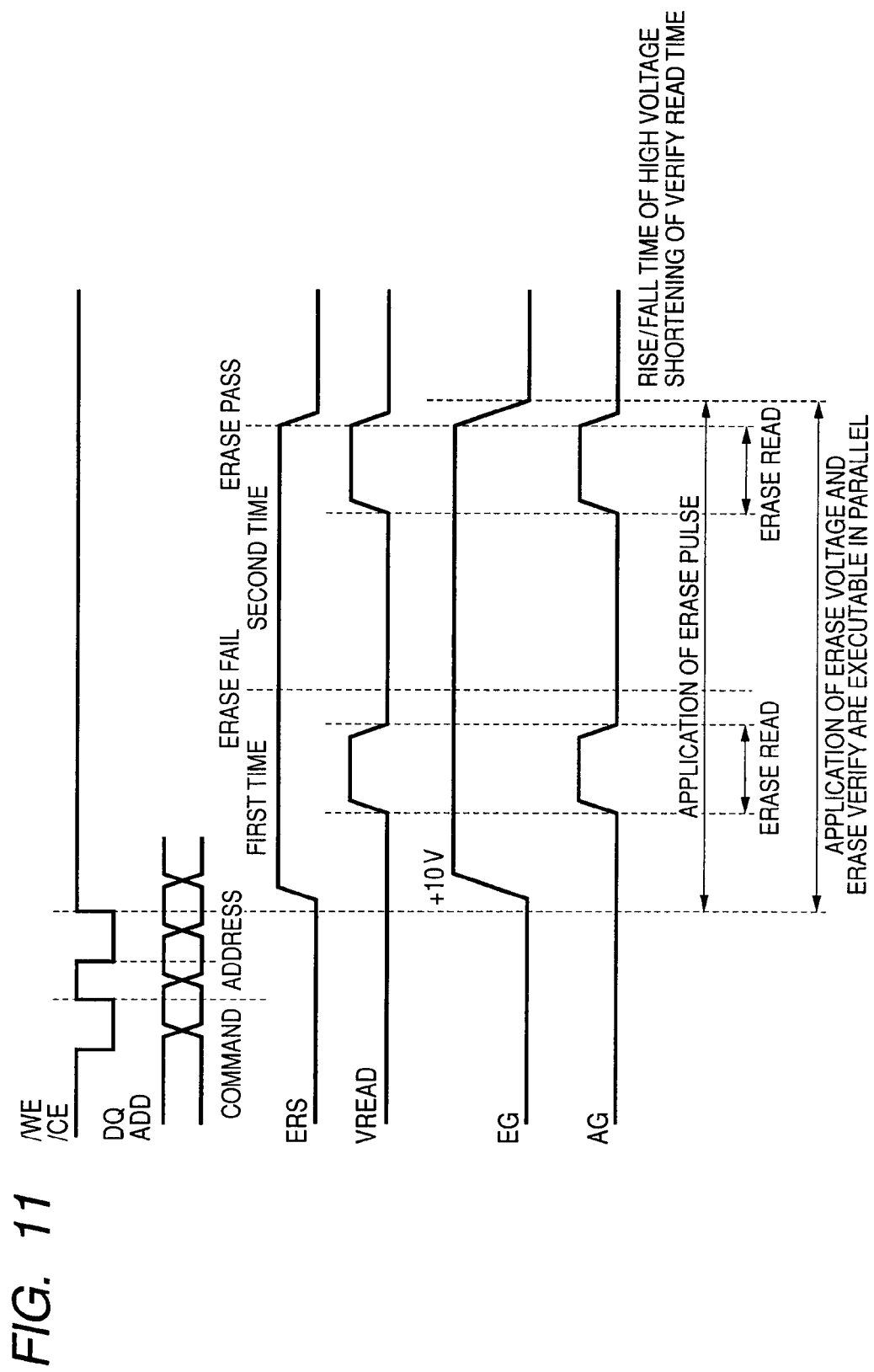
FIG. 11 is a timing chart illustrating the operation at the erasure shown in FIG. 10.

FIG. 11 is a timing chart concretely showing the erase operation shown in FIG. 10. The erase operation of the semiconductor device shown in FIG. 9 will be explained below with reference to FIG. 11.

When external control signals /WE and /CE are both lowered temporarily and raised in FIG. 11, signals supplied from a data terminal DQ and an address terminal ADD are taken in as commands, and the operation mode (erase mode) is identified in accordance with the corresponding command captured by the command register/control circuit 24.

Next, an address ADD is captured into the address register 22 in accordance with the rising edges of the control signals /WE and /CE to the next falling edges thereof, whereby a memory cell targeted for erasure is designated. Thereafter, when the control signals /WE and /CE are respectively raised to an H level, the erase mode is started. Namely, when the control signals /WE and /CE are raised twice, the command register/control circuit 24 enters an operation mode designated by the corresponding command. In this case, the erase mode instruction ERS is enabled and supplied to the voltage generator 26 to allow the voltage generator 26 to generate a voltage (erase high voltage) necessary for erasure. In the erase mode, the EG control circuit 34 applies an erase pulse of an erase high voltage (+10V) to an embedded erase gate line EGL of each memory cell designated targeted for erasure. When the erase pulse is applied thereto and a predetermined period has elapsed, erase verify reading is performed inside. Namely, after the predetermined period has elapsed, an erase verify read instruction VREAD is enabled at predetermined time intervals. Thus, the row decoder 28, the column decoder 30 and the column selection gate circuit 32 are used to supply a read voltage to a memory gate line MGL and a bit line BL in a state in which the erase voltage is being applied to the embedded erase gate line EGL. The sense amplifier 36 reads data of the selected memory cell in accordance with a bit line current. The command register/control circuit 24 identifies whether the read memory cell is in an erase state. This verify operation is successively executed on each individual memory cell.

When it is determined that an erase fail has occurred based on verify (VR) for the first erasure, an erase pulse is subsequently applied during a predetermined period. Thereafter, when all bits are determined to be completed in erasure upon verify relative to the second erasure that the erase verify is executed again (in a state in which the erase high voltage has been applied) (when it is determined that the erase pass has been performed), the erase mode ERS is disabled to stop the application of the erase high voltage from the EG control circuit 34 to the erase gate line EGL. The application of the erase pulse and the erase verify are repeatedly executed until it is determined that the erase is pass upon the erase verify.

During the period of application of the erase pulse, it is possible to perform sequential verify reading of a plurality of memory cells targeted for erasure. Thus, the verify operation can be started without waiting for a period of up to the perfect reduction of the erase pulse to a ground voltage level, and the erase time can hence be shortened. In this case, the period necessary for erasure may be ensured as the period of up to the execution of the first erase verify reading. When a non-erased memory cell of at least one bit exists at the erase verify, an erase pulse is consecutively applied to the corresponding memory cell target for erasure. Thus, even if the erase pulse application period of the memory cell during which the first erase verify is performed during the application of the erase pulse is insufficient, the erase pulse is applied during the erase verify period. Accordingly, after the application of the following erase pulse, even each memory cell identified to be a non-erase state upon the first erase verify can reliably be set to the erase state, and an increase in the erase time can be sufficiently suppressed as a whole.

Figure 12:
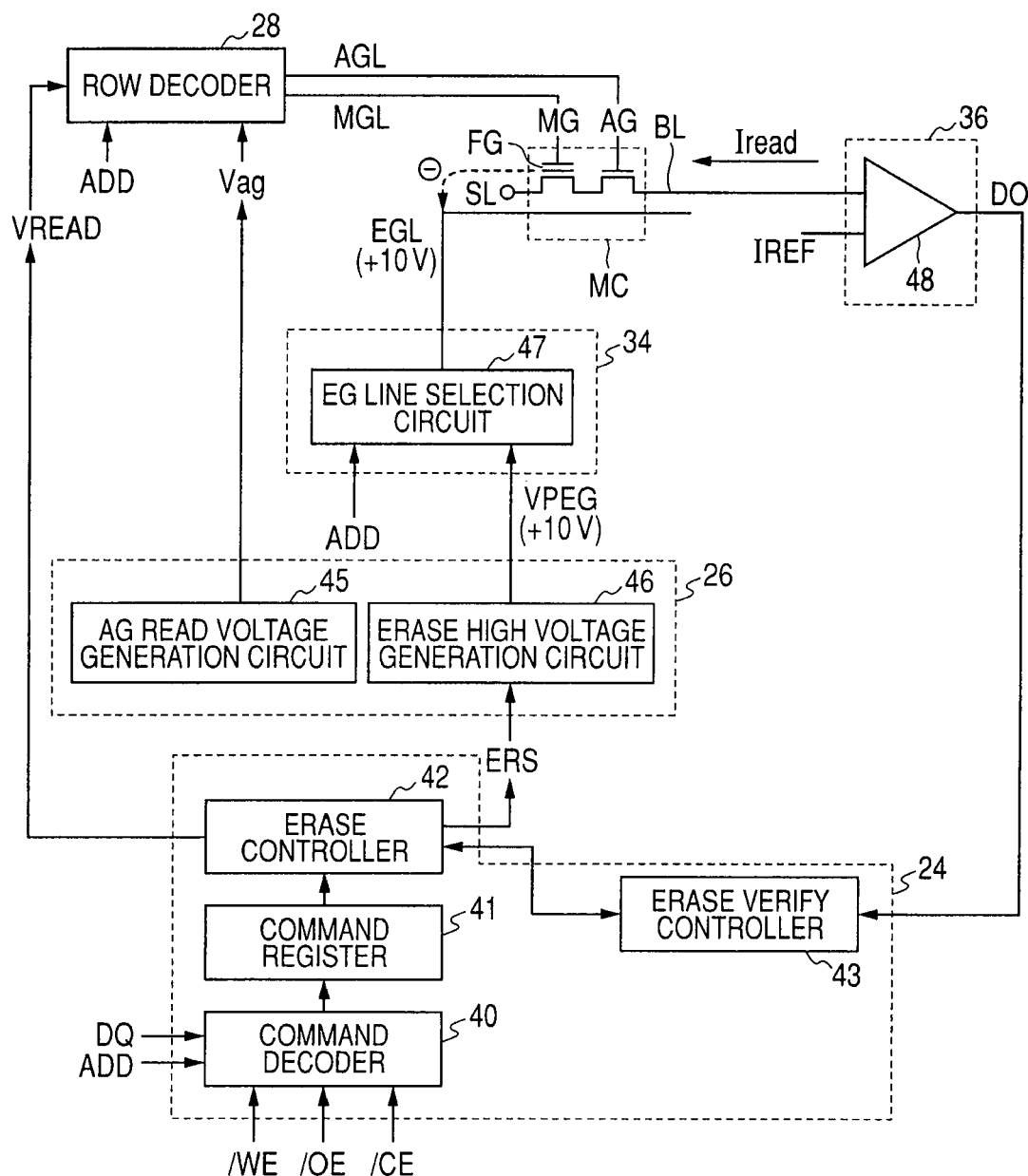
FIG. 12 is a diagram schematically depicting a configuration of parts related to the erase operation of the semiconductor device according to the first embodiment of the present invention.

FIG. 12 is a diagram schematically showing a configuration of parts related to the erasure of the memory cell MC and erase verify reading thereof. The command register/control circuit 24 includes a command decoder 40 which decodes a command, a command register 41 which stores therein the command decoded by the command decoder 40, an erase controller 42 which controls an erase operation in accordance with the erase command stored in the command register 41, and an erase verify controller 43 which performs erase verify.

The command decoder 40 receives an address ADD and data DQ as commands and decodes the same in accordance with external control signals /WE, /CE and /OE.

The erase controller 42 enables an erase instruction ERS in accordance with the erase command stored in the command register 41 to designate an erase operation mode and asserts (activates) an erase read instruction VREAD at predetermined intervals upon erase verify to thereby control the erase operation and the erase verify reading operation and control the verify operation of the erase verify controller 43. The erase controller 42 is comprised of an erase control sequence controller, for example, and enables the erase instruction ERS and erase verify read instruction VREAD at predetermined timings under a predetermined sequence in accordance with the erase command.

The erase verify controller 43 is operation-controlled by the erase controller 42. The erase verify controller 43 receives verify read data DO given from a sense amplifier circuit 48 contained in the sense amplifier 36 and discriminates whether the verify read data DO is of a logic value indicative of an erase state.

The voltage generator 26 includes an erase high voltage generation circuit 46 and an AG read voltage generation circuit 45. The erase high voltage generation circuit 46 generates an erase high voltage VPEG (+10V) upon activation (assertion) of the erase operation instruction ERS supplied from the erase controller 42. On the other hand, a voltage of 1.5V or 0V is simply applied to an assist gate AG upon erase reading, erase verify and writing. The AG read voltage generation circuit 45 always generates an assist gate voltage Vag of, for example, 1.5V.

The EG control circuit 34 includes an EG line selection circuit 47. The EG line selection circuit 47 is enabled by the erase controller 42 upon the erase operation to select the corresponding embedded erase gate line EGL of each memory cell target for erasure in accordance with the address signal ADD and transfers the erase high voltage VPEG outputted from the erased high voltage generation circuit 46 to the selected embedded erase gate line EGL.

When the erase verify read instruction VREAD is asserted upon the erase operation, the row decoder 28 transfers the assist gate voltage Vag to an assist gate line AGL disposed relative to the memory cell target for erasure in accordance with the address signal ADD. At this time, a memory gate line MGL is set to 0V. The column selection gate circuit 32 shown in FIG. 9 couples a bit line BL of a selected memory cell of memory cells of one row selected by the row decoder 28 to the sense amplifier 36 in accordance with the column selection signal outputted from the column decoder 30. The sense amplifier 36 includes the sense amplifier circuit 48, and transfers a read current Iread to the bit line BL of the selected column and performs a magnitude comparison between the read current Iread and a reference current REF to generate verify read data DO, which is followed by being supplied to the erase verify controller 43.

The erase verify controller 43 determines whether the internal read data DO outputted from the sense amplifier 36 is of a logic value "1" indicative of an erase state. When an erase fail bit exists, the erase verify controller 43 transfers the existence of the erase fail bit to the erase controller 42. When all bits are in the erase state, the erase verify controller 43 notifies the completion of erasure to the erase controller 42. The continuation and completion of the erase operation (continuous application of erase pulse and stop of its application) are executed in accordance with the notification of an erase result from the erase verify controller 43.

When the erase high voltage is applied to the embedded erase gate line EGL upon the erase verify operation, electrons are pulled out in the form of the Fowler-Nordheim current between the corresponding floating gate FG and embedded erase gate line EGL in the memory cell MC. The floating gates FG and the embedded erase gate lines EGL are all electrically separated from the source line SL and the memory gate MG, and the assist gate AG and the bit line BL. Thus, even if in this state, the verify read voltage Vag is applied to the assist gate AG to cause current corresponding to the stored data of the memory cell MC to flow between the bit line BL and the source line SL, it exerts no influence on the erase operation. It is possible to allow current corresponding to the threshold voltage of the memory transistor of the memory cell MC to flow accurately.

Figure 13:
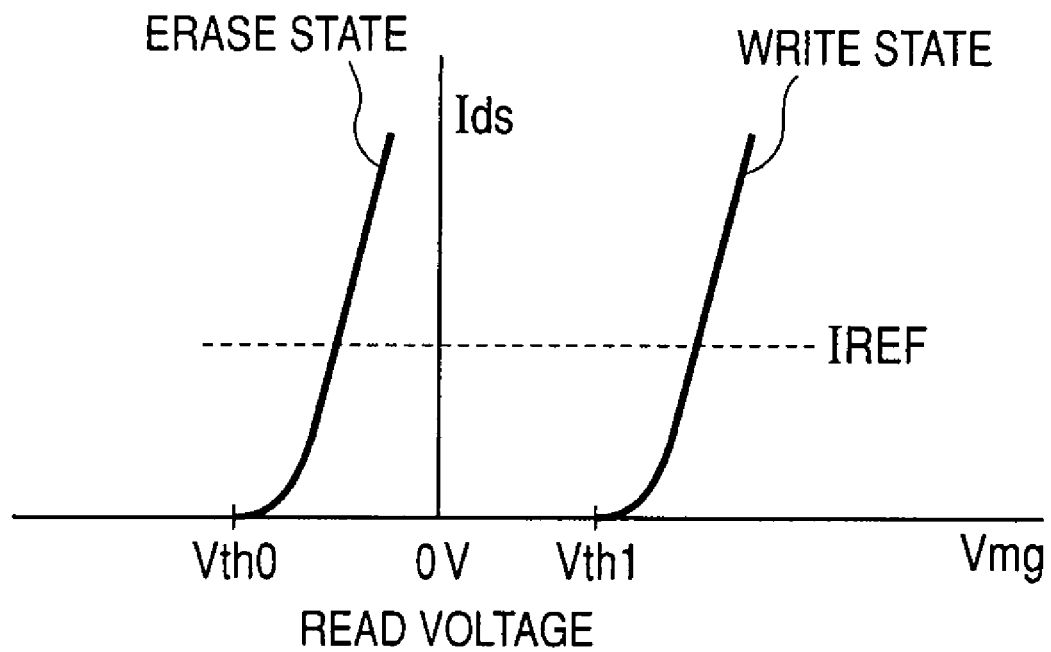
FIG. 13 is a diagram illustrating current characteristics at the erasure and writing-in of the memory cell shown in FIG. 1.

FIG. 13 is a diagram schematically showing correspondence between the threshold voltage of the memory transistor and current flowing through the memory cell. In an erase state, the memory transistor has a threshold voltage Vth0. Even though a voltage Vmg applied to the memory gate MG is 0V, a channel is formed in the memory transistor. On the other hand, when the memory transistor is in a write state, the memory transistor has a threshold voltage Vth1. When the memory gate voltage Vmg is 0V, no current flows. By selecting the assist gate AG coupled in series, a read current corresponding to the state of the threshold voltage of the memory transistor flows between the bit line BL and the source line SL. The sense amplifier 36 is capable of identifying the erase and write states according to the magnitude between a bit line current and a reference current Iref.

In the erase state, the memory transistor is in a depression state. Since, however, the selection/non-selection of each memory cell is performed at data writing/reading by the corresponding assist gate transistor (selection transistor), no problem occurs in particular even if the memory transistor is in the erase state, i.e., the depression state, and control of the erasure becomes easy (because the depression state is allowed).

According to the first embodiment of the present invention as described above, the erasure has been performed using the embedded erase gate line. The erase gate is isolated from the bit line, source line, well and memory gate. The erase verify reading can be performed in parallel with the application of the erase voltage. It is thus possible to shorten the time necessary for erasure.

Second Embodiment

Figure 14:
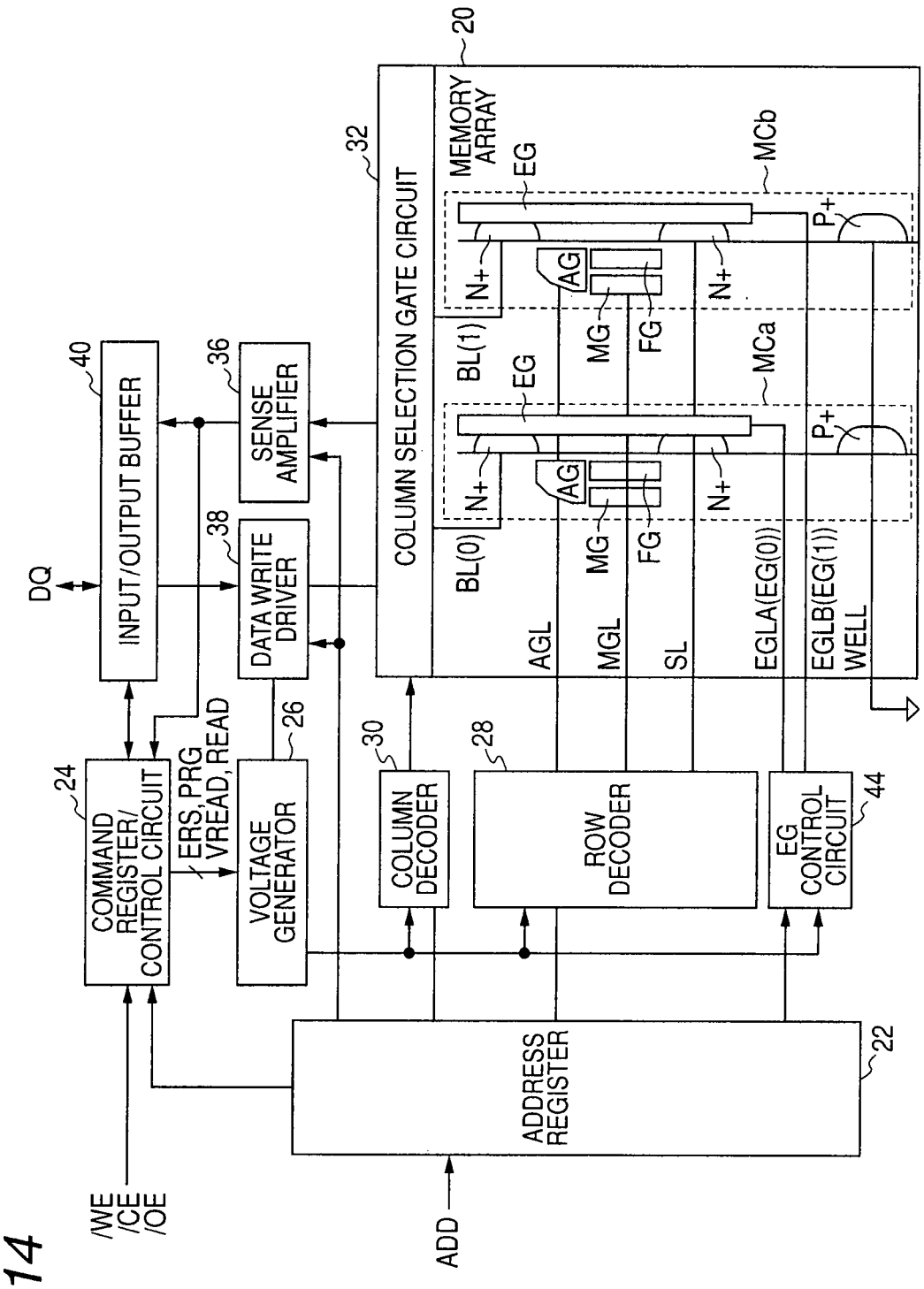
FIG. 14 is a diagram schematically showing an overall configuration of a semiconductor device according to a second embodiment of the present invention.

FIG. 14 is a diagram schematically showing an overall configuration of a semiconductor device according to a second embodiment of the present invention. The semiconductor device shown in FIG. 14 is different in configuration from the semiconductor device shown in FIG. 9 in the following points. Namely, as for a memory array 20, it is divided into a plurality of column blocks by a plurality of embedded erase gate lines EGLA and EGLB. The embedded erase gate line EGLA (EG (0)) is coupled to an embedded erase gate EG of a memory cell MCa, and the embedded erase gate line EGLB (EG (1)) is coupled to an embedded erase gate EG of a memory cell MCb. The memory cells MCa and MCb are respectively coupled to bit lines BL (0) and BL (1).

The memory array 20 has a single bank structure and is not capable of performing data access to each memory cell of another row in parallel upon data access to each memory cell of a given row (reading from or writing to the memory cell).

An EG control circuit 34 executes erasure at the memory array 20 in units of embedded erase gate lines. Here, the memory array 20 is divided into the column blocks because the embedded erase gate lines are arranged in parallel with the bit lines respectively. Thus, when the memory cell MCa target for erasure is in an erase execution state, the embedded erase gate line for the memory cell MCb of the same row as the memory cell MCa target for erasure is in a non-selected state, whereas an assist gate line AGL is in an open state. A memory gate line MGL and a source line SL are at a ground voltage level. The bit line BL (0) is placed in a floating state. At this time, the assist gate line AGL is driven to a selected state to execute the reading of data from the memory cell MCb non-targeted for erasure. Other configurations of the semiconductor device shown in FIG. 14 are the same as that of the semiconductor device shown in FIG. 9. The same reference numerals are attached to their corresponding portions, and their detailed explanations are therefore omitted.

Figure 15:
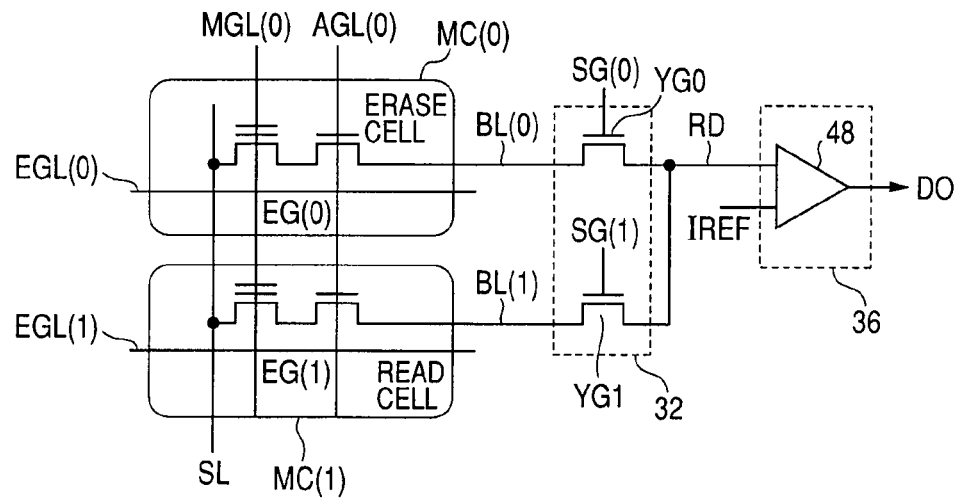
FIG. 15 is a diagram schematically illustrating a configuration of a column selection gate circuit shown in FIG. 14.

FIG. 15 is a diagram showing a configuration of a column selection gate circuit 32 shown in FIG. 14 along with coupling modes or forms of related memory cells MC (0) and MC (1). The memory cell MC (0) has an erase gate EG (0) coupled to its corresponding embedded erase gate line EGL (0). The memory cell MC (1) has an erase gate EG (1) coupled to its corresponding embedded erase gate line EGL (1). A memory gate line MGL (0) and an assist gate line AGL (0) are provided in common to the memory cells MC (0) and MC (1). The memory cell MC (0) is coupled to a Y selection gate YG0 included in the column selection gate circuit 32 via a bit line BL (0). The memory cell MC (1) is coupled to a Y selection gate YG1 via a bit line BL (1). These Y selection gates YG0 and YG1 are respectively made conductive selectively in response to column selection signals SG (0) and SG (1) to couple the corresponding bit lines BL (0) and BL (1) to an internal read data line RD upon their conduction. The internal read data line RD is coupled to a sense amplifier circuit 48 included in a sense amplifier 36. The sense amplifier circuit 48 is the same as the sense amplifier circuit 48 shown in FIG. 12 and performs differential amplification between current flowing through the internal read data line RD and a reference current IREF to generate internal read data DO.

Now assume that in FIG. 15, the memory cell MC (0) is of a memory cell target for erasure and the memory cell MC (1) is of a memory cell target for reading. The memory cell targeted for reading is of a memory cell to which data access is requested from outside.

Figure 16:
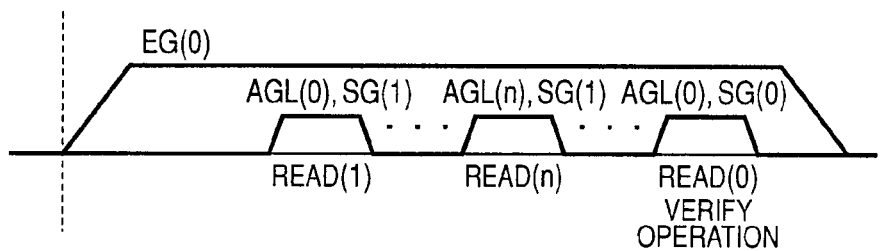
FIG. 16 is a timing chart showing an operation at erasure of the semiconductor device shown in FIG. 14.

FIG. 16 is a diagram showing operation timings taken when the erase and read operations of the semiconductor device shown in FIGS. 14 and 15 are executed in parallel. A data read operation at erasure, of the semiconductor device shown in FIGS. 14 and 15 will be explained below with reference to FIG. 16.

Upon the erasure, the memory gate line MGL (0) and the assist gate line AGL (0) are both in an open state. In this condition, an erase high voltage is applied to the embedded erase gate line EGL (0) so that the voltage level of the embedded erase gate EG (0) of the memory cell MC (0) target for erasure is set to a high voltage level of 10V, whereby the erasure at the memory cell MC (0) is executed. At this time, the embedded erase gate line EGL (1) is at a ground voltage level indicative of a non-selected state or open state. No erasure is performed on the memory cell MC (1). In a state in which the erase voltage is being applied to the embedded erase gate EG (0), the reading of a memory cell such as the memory cell MC (1) coupled to the embedded erase gate line EGL (1) is executed.

Namely, the assist gate line AGL (0) and the Y column selection signal SG (1) are driven to a selected state to execute the reading of data from the memory cell MC (1). Assist gate lines AGL (i) are sequentially selected up to the last assist gate line AGL (n). At this time as well, the Y selection gate YG1 is driven to a selected state in accordance with the Y column selection signal SG (1). Thus, data of each memory cell disposed corresponding to the embedded erase gate line EGL (1) can be read sequentially. After completion of the reading of the date from each memory cell with respect to the embedded erase gate line EGL (1), the assist gate line AGL (0) is then driven to a selected state and the Y column selection signal SG (0) is selected, whereby verify reading of the memory cells MC (0), . . . target for erasure is sequentially started before the erase high voltage is caused to fall.

Accordingly, data access (external reading) can be carried out in the state in which the erase high voltage has been applied. There is no need to temporarily stop the application of the erase high voltage and perform data access from outside after an internal voltage on the corresponding bit line or the like has been stabilized, as in the suspend mode operation of the normal flash memory. It is thus possible to perform high-speed data access. In a manner similar to the first embodiment, the verify and the erasure can be executed in parallel, and the time necessary for erasure can also be shortened.

Figure 17:
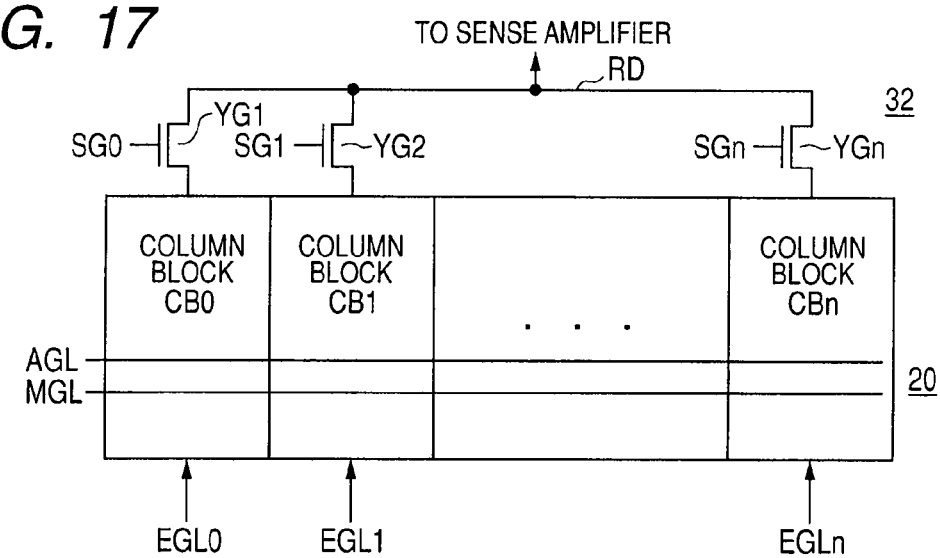
FIG. 17 is a diagram schematically depicting an array configuration of a modification of the semiconductor device according to the second embodiment of the present invention.

FIG. 17 is a diagram schematically showing a general configuration of the memory array 20 of the semiconductor device according to the second embodiment of the present invention. In FIG. 17, the memory array 20 is divided into a plurality of column blocks CB0 through CBn. Embedded erase gate lines EGL0, EGL1, . . . EGLn are respectively provided in association with these column blocks CB0 through CBn. Erasure is executed in column block units. An assist gate line AGL and a memory gate line MGL are arranged in common to the column blocks CB0 through CBn. The column blocks CB0 through CBn are respectively provided with Y selection gates YG1, YG2, . . . YGn. The Y gates YG1 through YGn couple a selected row of their corresponding column blocks to a sense amplifier via an internal read data line RD in accordance with block selection signals SG0, SG1, . . . SGn.

When erasure is in execution at one column block CBi in accordance with the voltage applied to the embedded erase gate line EGLi in the array configuration shown in FIG. 17, it is possible to perform the reading of data at another column block and perform an verify operation in parallel with an erase operation at the corresponding erase block.

Incidentally, bit lines are arranged over plural columns at the column blocks CB0 through CBn. In this case, column selection gates are respectively disposed with respect to the bit lines. The bit lines are respectively selected in accordance with column selection signals, and the bit line of the selected column is selected by its corresponding Y selection gate in accordance with each of the block selection signals SG0 through SGn, followed by being coupled to the internal read data line RD.

Figure 18:
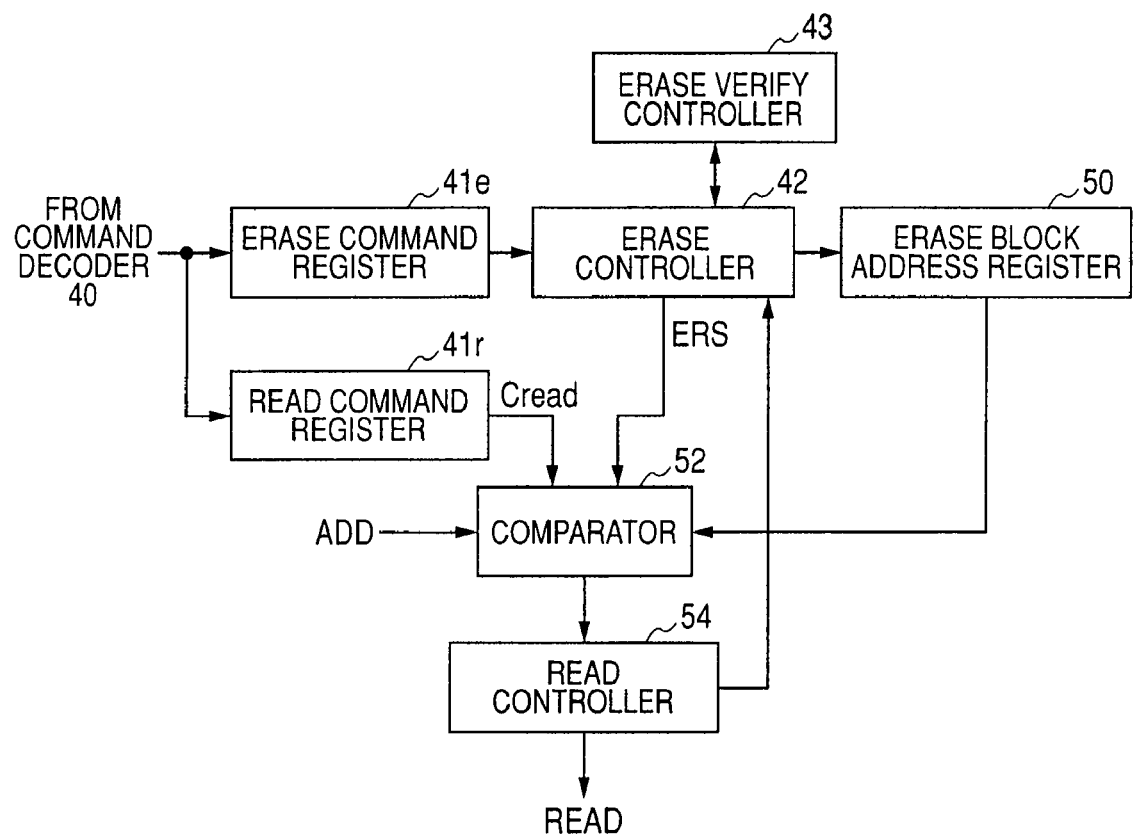
FIG. 18 is a diagram schematically showing a configuration of a command register/control circuit of the semiconductor device according to the second embodiment of the present invention.

FIG. 18 is a diagram schematically showing a configuration of a command register/control circuit 24 shown in FIG. 14. The command register/control circuit 24 shown in FIG. 18 is provided with, as command registers, an erase command register 41e which stores an erase command therein, and a read command register 41r which stores a read command therein. The erase command (erase instruction) outputted from the erase command register 41e is supplied to an erase controller 42. There is also provided an erase block address register 50 which stores an erase block address for designating a column block target for erasure.

When the erase mode is designated, the erase controller 42 stores a column block address for specifying an erase column block in the erase block address register 50.

The erase controller 42 controls the operation of an erase verify controller 43 for controlling an erase verify operation. The command register/control circuit 24 is also provided with a comparator 52 and a read controller 54. When a read command is stored in the read command register 41r, a read instruction Cread is supplied to the comparator 52 as a read command decoded from the read command register 41r, and an erase mode instruction ERS outputted from the erase controller 42 is supplied to the comparator 52, the comparator 52 compares a block address stored in the erase block address register 50 and a block address of an address signal ADD supplied from outside.

When a signal outputted from the comparator 52 is indicative of non-coincidence, the read controller 54 enables a read mode enable signal READ. The read mode enable signal READ outputted from the read controller 54 is supplied to the erase controller 42. When the read mode enable signal READ is asserted (activated), the erase controller 42 sets the verify operation to a prohibition state and consecutively executes the erase operation.

When the comparator 52 detects the coincidence of the addresses, the read operation is executed on the corresponding erase block. Therefore, the external reading of data is stopped and the read mode enable signal READ is maintained in an inactive state. It is thus possible to perform external data read access to the erase block and another block.

Incidentally, upon the data reading, the external address is stored in the address register 22, and internal addresses are sequentially generated with the address stored in the address register 22 as a leading address. Then, the rows (assist gate lines) of the selected blocks may be selected sequentially. At this time, the column selection signal may be fixed so as to select the same column at each selected block.

Figure 19:
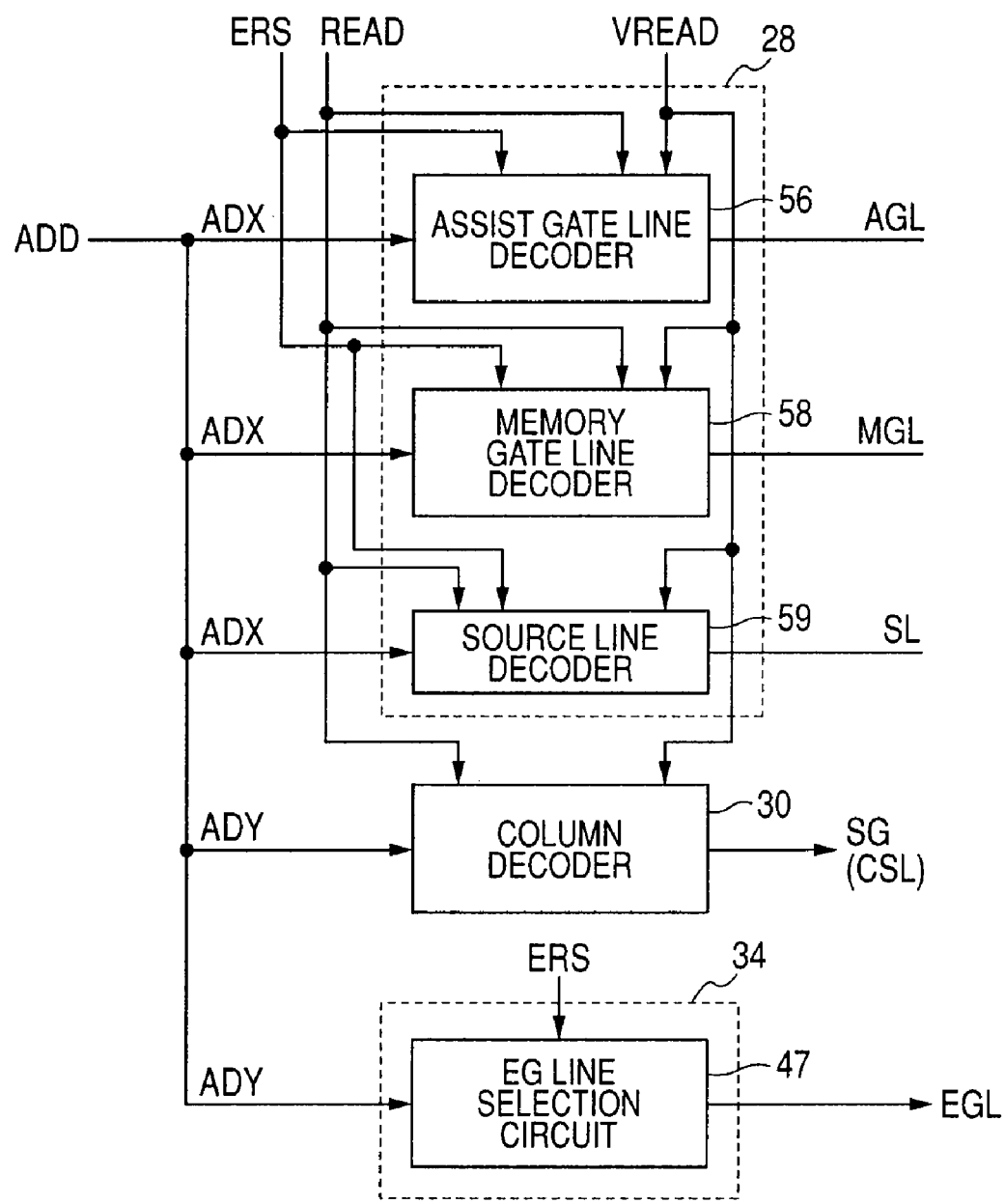
FIG. 19 is a diagram schematically illustrating a configuration of a row decoder, a column decoder and an EG control circuit shown in FIG. 14.

FIG. 19 is a diagram more specifically showing a configuration of the row decoder 28, column decoder 30 and EG control circuit 34 shown in FIG. 14. In FIG. 19, the row decoder 28 includes an assist gate line decoder 56, a memory gate line decoder 58 and a source line decoder 59. The assist gate line decoder 56 decodes an X address signal ADX contained in the address signal ADD in a data read mode in accordance with the read mode enable signal READ, erase mode instruction ERS and verify read mode instruction VREAD and transfers a predetermined voltage (Vag) to the corresponding assist gate line AGL of the selected row.

In the erase mode, the assist gate line decoder 56 is disabled to set the corresponding assist gate line AGL to an open state or a ground voltage (0V) level. When the assist gate line is set to the open state, an assist gate line driver of the assist gate line decoder 56 is comprised of a ternary driver. In the erase mode, a non-selection assist gate line driver thereof is set to an output high impedance state.

The memory gate line decoder 58 also similarly decodes an address signal ADX in accordance with the erase mode instruction ERS, read mode enable signal READ and verify read mode enable signal VREAD and applies a predetermined voltage to the corresponding memory gate line MGL. The memory gate line decoder 58 sets the memory gate line AGL to the open state or ground voltage (0V) in the erase operation mode and maintains the memory gate line MGL at the ground voltage level upon the verify reading and data access reading. The memory gate line decoder 58 applies a write high voltage to the memory gate line MGL of the corresponding selected row upon data writing.

The source line decoder 59 decodes an address signal ADX in accordance with the erase mode instruction ERS, read mode enable signal READ and verify read mode enable signal VREAD. The source line decoder 59 transfers a write high voltage (5V) to the corresponding source line SL of the selected row in a write mode and maintains the source line SL at the ground voltage level in operation modes other than the write mode.

The column decoder 30 is enabled upon assertion of the read mode enable signal READ and the verify read enable signal VREAD to decode a Y address signal ADY contained in the address signal ADD, thereby generating a column selection signal SG. The column selection signal SG may contain both a block selection signal for specifying a column block and a column selection signal CSL for designating a column within the specified column block. The column selection signal may be a combined signal of the column block selection signal and the column selection signal.

An EG line selection circuit 47 contained in the EG control circuit 34 decodes an address signal ADY upon activation of the erase mode instruction ERS to drive the corresponding embedded erase gate line EGL of the selected column to a selected state, thereby applying a predetermined erase high voltage thereto. In the read mode and verify read mode, the EG line selection circuit 47 maintains the embedded erase gate line in the open state or at the ground voltage level.

Utilizing the configuration shown in FIG. 19 makes it possible to carry out external data access and verify reading at another block in parallel with the operation of execution of erasure on each column block target for erasure.

Incidentally, the address signal ADD is of an external address signal ADD where the external data access is performed. When a page operation mode is possible, the address signal ADD sequentially counts up addresses stored in an internal address register to generate internal addresses. Upon the erase verify reading, the address signal ADD is of a verify read address signal generated from an unillustrated verify counter.

According to the second embodiment of the present invention as described above, a memory array having a single bank configuration is divided into a plurality of column blocks, and erasure is performed in column block units. Thus, external data access can be performed on an erase column block and another column block. In addition to an advantageous effect similar to the first embodiment, data access can be carried out efficiently, and a data latency time of an external processing device can be eliminated. Further, an advantageous effect similar to the first embodiment can be obtained.

Third Embodiment

Figure 20:
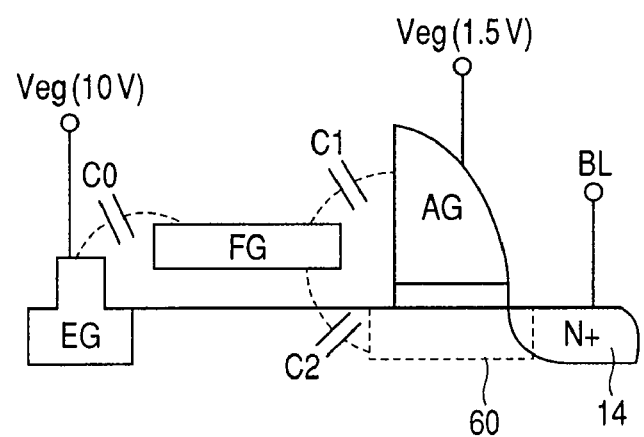
FIG. 20 is a diagram schematically depicting a distribution of parasitic capacitances of a floating gate at erasure and reading.

FIG. 20 is a diagram schematically showing voltages applied to a memory cell where erasure and reading are performed in parallel. In FIG. 20, an erase high voltage Veg (=10V) is applied to an embedded erase gate EG upon the erasure. Upon the reading, a read voltage Vag (=1.5V) is applied to an assist gate AG. Upon the reading, a read voltage (1.0V) is applied to a bit line BL. In this state, a channel 60 is formed in a substrate region surface adjacent to a drain impurity region 14 by the voltage Vag on the assist gate AG upon the reading. In this state, a parasitic capacitance C0 exists between the embedded erase gate EG and a floating agate FG. A parasitic capacitance C1 exists between the floating gate FG and the assist gate AG. A parasitic capacitance C2 exists even between the floating gate FG and the channel 60.

Upon the normal erase operation similar to the conventional one, the assist gate AG and the bit line BL are in an open state or 0V (ground voltage), and the erase high voltage is applied only to the embedded erase gate EG. Thus, when the application of the erase voltage and the read operation are executed in parallel, the effect of coupling by the parasitic capacitance C0 between the embedded erase gate FG and the floating gate FG is reduced due to the parasitic capacitances C1 and C2. It is therefore considered that efficient coupling cannot be made between the embedded erase gate EG and the floating gate FG and a sufficient voltage cannot be applied between the embedded erase gate EG and the floating gate FG, thereby causing a reduction in erase efficiency.

Figure 21:
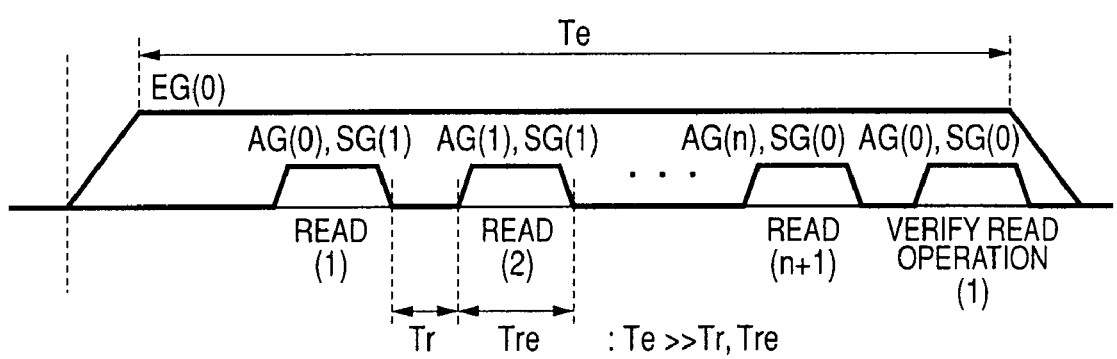
FIG. 21 is a timing chart showing a data reading/erasing sequence according to a third embodiment of the present invention.

FIG. 21 is a timing chart showing an operation sequence where the erasure and reading employed in the third embodiment of the present invention are executed. Configurations of both an array of memory cells and a reading section are identical to those of the semiconductor device according to the previous second embodiment shown in FIGS. 14 and 15. At erasure, an erase high voltage is applied to an embedded erase gate EG (0). Subsequently, assist gates AG non-target for erasure are selected sequentially and a block column selection signal (or block selection signal) SG (1) of the same column is driven to a selected state, thereby performing data reading. In the sequence shown in FIG. 21, AG (0) through AG (n) are sequentially selected and data reading corresponding to (n+1) times is performed. A waiting period Tr and a reading period Tre provided during this reading are set sufficiently smaller than an erase pulse application period Te.

Namely, upon the erase pulse application, the data reading is performed at predetermined intervals Tr discontinuously. The erase high voltage is applied during a period sufficiently longer than the read interval Tr. After external data reading has been performed at last, a verify read operation is executed. In the sequence shown in FIG. 21, the assist gate lines AG (0), . . . are sequentially selected in accordance with the corresponding column selection signal (or block selection signal) SG (0) to execute data reading. During the application of the erase voltage, verify reading is started and data are internally read out in a verify read mode. If the result of erase verify indicates an erase pass, then the erase high voltage is reduced to a predetermined level.

Thus, the period Tre of application of the read pulse applied to the assist gate is set sufficiently shorter than the period Te during which the erase high voltage is applied, and the influence of reducing the coupling between the embedded erase gate EG and the floating gate FG can be reduced, thereby making it possible to perform the erasure accurately.

Figure 22:
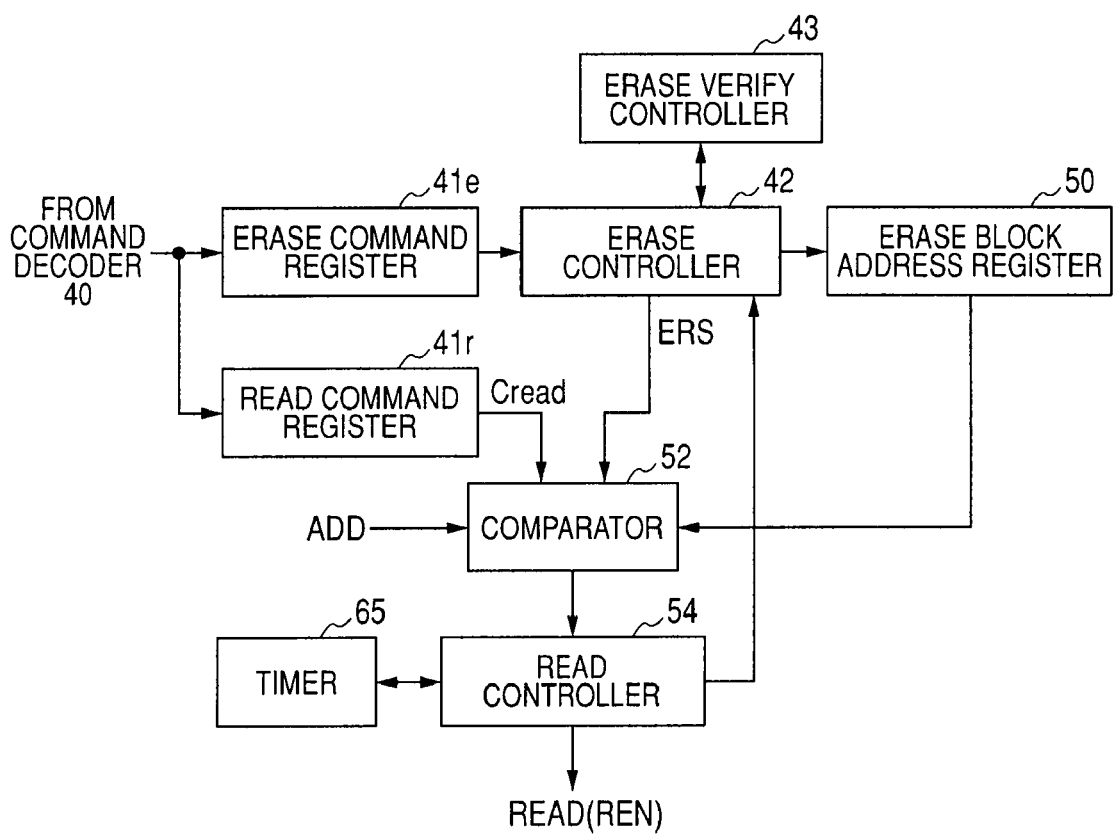
FIG. 22 is a diagram schematically illustrating a configuration of a command register/control circuit of a semiconductor device according to the third embodiment of the present invention.

FIG. 22 is a diagram schematically showing a configuration of a command register/control circuit 24 of the semiconductor device according to the third embodiment of the present invention. The command register/control circuit 24 shown in FIG. 22 is different in configuration from the command register/control circuit 24 shown in FIG. 18 in the following points. Namely, in the command register/control circuit 24 shown in FIG. 22, a read controller 54 is provided with a timer 65. Other configurations of the command register/control circuit 24 shown in FIG. 22 are the same as those shown in FIG. 18. The same reference numerals are attached to their corresponding portions, and their detailed explanations are omitted.

In the configuration of the command register/control circuit 24 shown in FIG. 22, the read controller 54 enables the read mode enable signal READ at predetermined intervals in accordance with a count value outputted from the timer 65 upon data reading. A data read period is designated by the activation period of the read mode enable signal READ. In this case, the read controller 54 may use a configuration wherein when the mode in which the successive reading of data is performed as in the case of a burst mode, is designated as a read mode, the read mode enable signal READ is set to an enable state during this read operation period, and a read activation signal REN for defining each read period is selectively brought to an enable state during a predetermined period at predetermined intervals in accordance with the count value of the timer 65.

An erase controller 42 controls an erase verify controller 43 in accordance with a read operation completion instruction outputted from the read controller 54 and executes verify reading under the control of the erase verify controller 43.

A configuration similar to the previous configuration shown in FIG. 19 is used for a configuration of column and row decoders. During the period of activation of the read mode enable signal READ, the operation of decoding an address signal ADD is executed to carry out the selection of a row and a column.

A voltage generator (26) generates necessary voltages according to respective operation modes, i.e., an erase high voltage, a read voltage and a verify read voltage under the control of the controllers 42, 43 and 54.

Incidentally, when the burst mode is allowed, the address signal ADD may be sequentially generated from an address counter (not shown) in accordance with the count value of the timer 65 with an address stored in an address register as a starting address.

According to the third embodiment of the present invention as described above, upon data reading placed during the application of an erase voltage, the reading is performed during both an interval sufficiently shorter than an erase voltage application period and a read period. The data reading can be performed in parallel without exerting an influence on an erase operation based on the erase voltage application.

Fourth Embodiment

Figure 23:
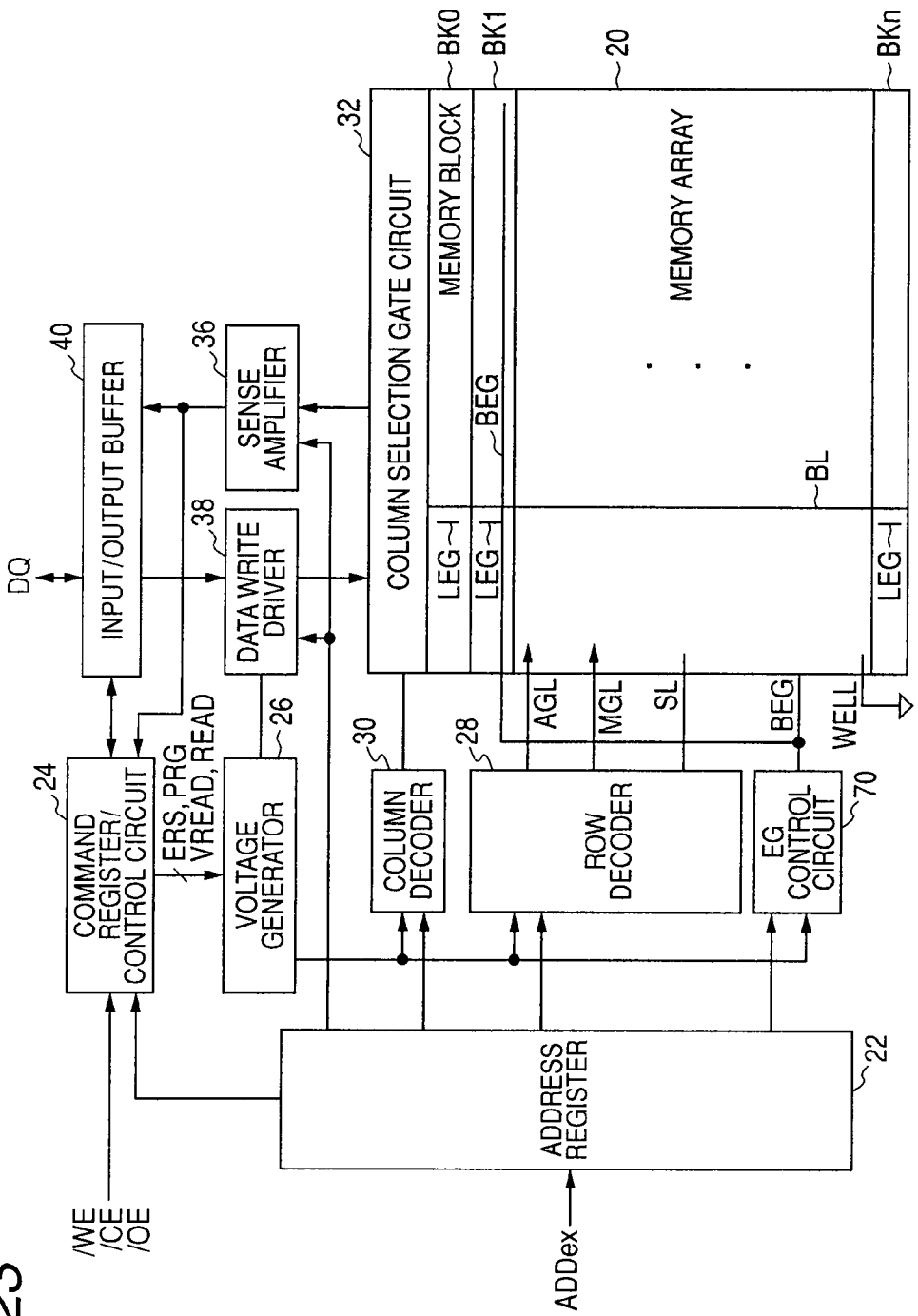
FIG. 23 is a diagram schematically showing an overall configuration of a semiconductor device according to a fourth embodiment of the present invention.

FIG. 23 is a diagram schematically showing an overall configuration of a semiconductor device according to a fourth embodiment of the present invention. The semiconductor device shown in FIG. 23 is different in configuration from the semiconductor device shown in FIG. 14 in the following points. Namely, a memory array 20 is divided into a plurality of memory blocks BK0 through BKn. A bit line BL is provided in common to these memory blocks BK0 through BKn. Memory cells of corresponding columns of the memory blocks are coupled to the bit line BL.

Assist gate lines AGL and memory gate lines MGL extending along a row direction are arranged in the memory blocks BK0 through BKn respectively. Block embedded erase gate lines BEG are arranged in the memory blocks BK0 through BKn respectively. Local embedded erase gate lines LEG are arranged in the memory blocks BK0 through BKn respectively and coupled to their corresponding block erase gate lines BEG. The local embedded erase gate lines LEG are disposed within their corresponding memory blocks so as to extend in a column direction along respective memory cell columns.

An EG control circuit 70 drives the block embedded erase gate lines BEG to a selected state in memory block units in an erase mode.

Other configurations shown in FIG. 23 are identical to those of the semiconductor device shown in FIG. 14. The same reference numerals are attached to their corresponding portions, and their detailed explanations are omitted.

Figure 24:
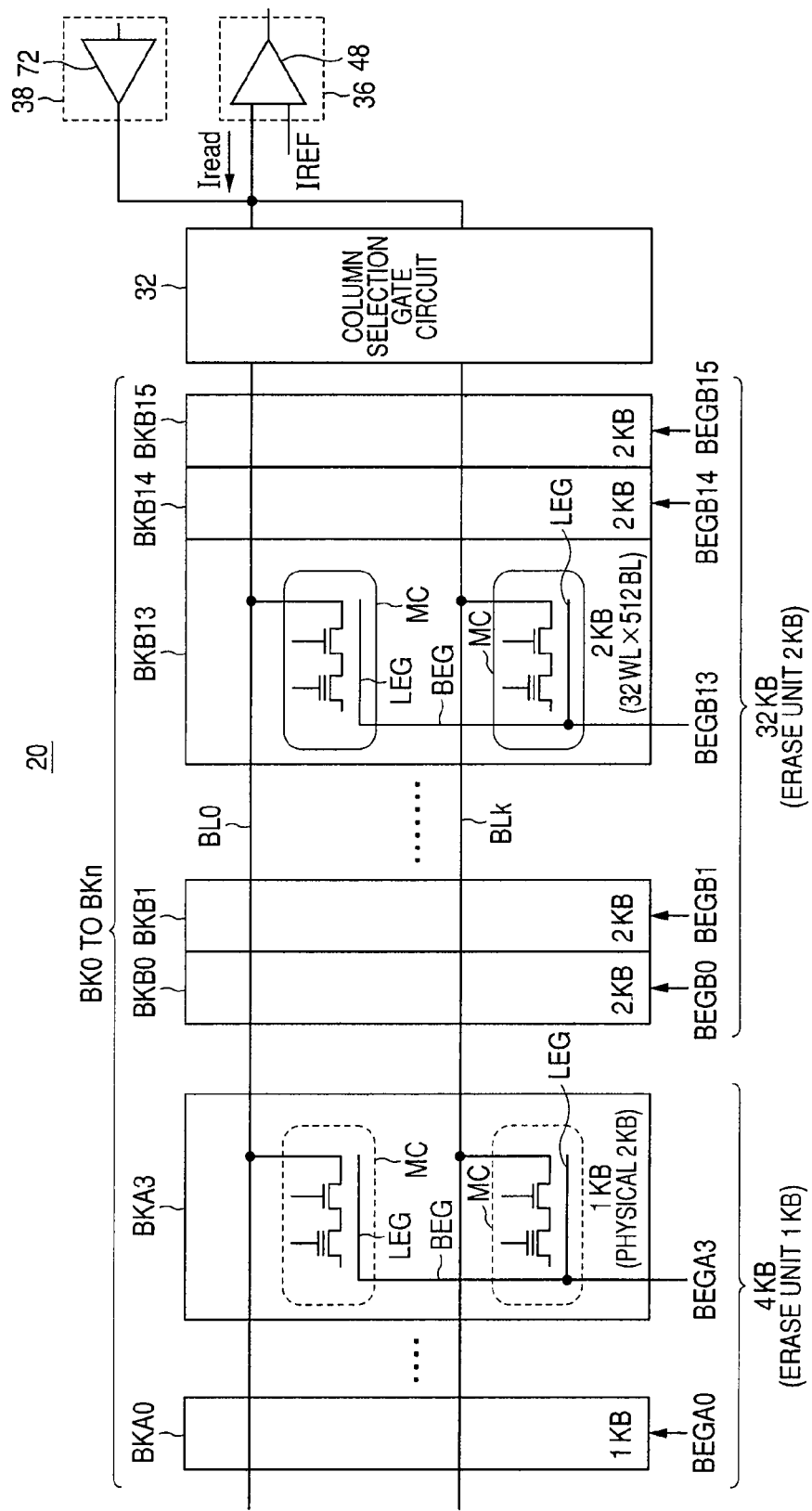
FIG. 24 is a diagram more concretely showing a configuration of a memory array shown in FIG. 23.

FIG. 24 is a diagram more concretely showing a configuration of the memory array 20 shown in FIG. 23. Since the memory blocks different in erase unit from one another are provided in the configuration shown in FIG. 24, symbols BKA and BKB are used instead of the symbols of the memory blocks BK0 through BKn.

In FIG. 24, there are provided memory blocks BKA0 through BKA3 each having a capacity of, for example, 1K byte, and memory blocks BKB0 through BKB15 each having a capacity of, for example, 2K bytes. Erasure is performed on the memory blocks BKA0 through BKA3 and BKB0 through BKB15 in memory block units. Thus, an erasure unit is 1K byte at the memory blocks BKA0 through BKA3 of 4 KB (bytes) in total. On the other hand, an erasure unit is 2K bytes at the memory blocks BKB0 through BKB15 of 32 KB in total. The erasure units are made different from one another to thereby store data into the corresponding memory blocks different in erasure unit according to applications. For example, data to be rewritten frequently are stored in their corresponding memory blocks BKA0 through BKA3 small in capacity, and data large in data amount or low in write frequency are stored in their corresponding memory blocks BKB0 through BKB15 large in capacity.

Bit lines BL are provided in common to the memory blocks BKA0 through BKA3 and BKB0 through BKB15. Bit lines BL0 and BLk are typically illustrated in FIG. 24. Selection transistors (assist gate transistors) of memory cells MC are respectively coupled to the bit lines BL0 through BLk at the respective memory blocks. Since data access is executed on the respective memory blocks in 2-bit units in this case, the storage capacity reaches ½ times as large as a physical address.

A column selection gate circuit 32 is provided in common to the memory blocks BKA0 through BKA3 and BKB0 through BKB15. The bit line selected by the column selection gate circuit 32 is coupled to each of a sense amplifier circuit 48 and a write drive circuit 72 via an internal data bus. The sense amplifier circuit 48 and the write drive circuit 72 are respectively provided within a sense amplifier 36 and a data write driver 38 shown in FIG. 23.

The memory blocks BKA0 through BKA3 are respectively provided with block embedded erase gate lines BEGA0 through BEGA3. The memory blocks BKB0 through BKB15 are respectively provided with block embedded erase gate lines BEGB0 through BEGB15.

Figure 25:
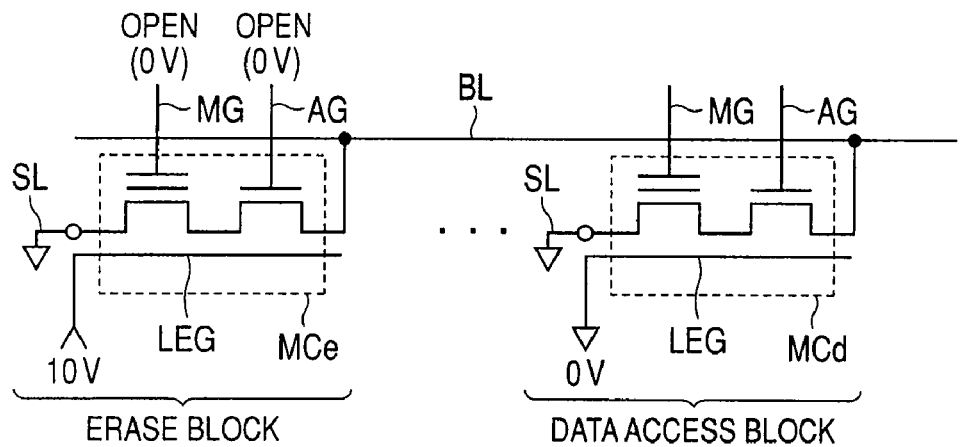
FIG. 25 is a diagram schematically illustrating applied voltages of respective memory blocks employed in the semiconductor device according to the fourth embodiment of the present invention.

FIG. 25 is a diagram schematically showing voltages applied to gate wirings of the respective blocks where erasure is performed on one of the memory blocks shown in FIG. 24. In FIG. 25, an erase high voltage (10V) is applied to a local embedded erase gate line LEG of a memory cell MCe at the block target for erasure. A memory gate MG and an assist gate AG of the memory cell MCe are in an open state or 0V, and a source line SL is coupled to a ground node. Thus, if the assist gate AG is set to 0V upon erasure, then the local embedded erase gate line LEG of the memory cell MCe targeted for erasure is isolated form the bit line BL.

At the memory block different from the memory block target for erasure, a local embedded erase gate line LEG of a memory cell MCd is maintained at 0V or in an open state. Another voltage can be applied to a memory gate MG and an assist gate AG of the memory cell MCd regardless of the voltage applied to the memory gate MG and assist gate AG of the memory cell MCe target for erasure. Thus, a read voltage or a write voltage can be applied to the bit line BL. Further, a write voltage can be applied to the source line SL of the memory block target for erasure. Correspondingly, data access (read/write) can be performed on the memory cell MCd. Namely, it is possible to perform access of data on another memory block (writing or reading of external data in and therefrom) in parallel during an erase voltage application period at each erase block.

Figure 26:
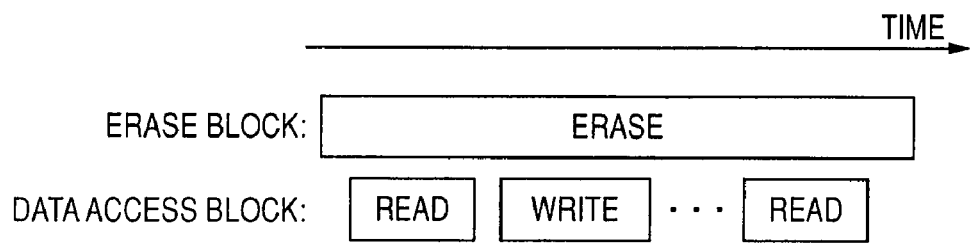
FIG. 26 is a timing chart for describing erase and data access operations of the semiconductor device according to the fourth embodiment of the present invention.

FIG. 26 is a diagram showing one example illustrative of erasure and a data access sequence employed in the fourth embodiment of the present invention. In FIG. 26, an erase voltage is applied at a block targeted for erasure. The reading or writing-in of data at another data access block can be executed in parallel with the application of the erase voltage. Thus, the degrees of freedom of reading and writing are improved and data access efficiency is improved.

Upon a verify operation in an erase mode, erase verify reading may simply be executed upon the completion of data access of each data access block or in therebetween.

Figure 27:
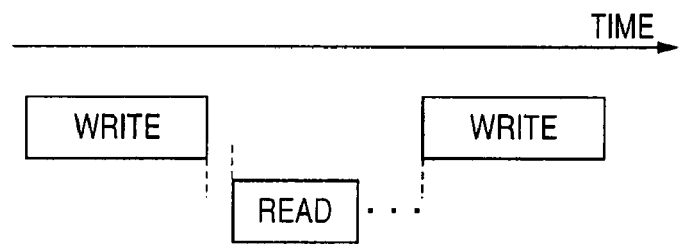
FIG. 27 is a diagram showing a write and read operation sequence of the semiconductor device according to the fourth embodiment of the present invention.

FIG. 27 is a diagram showing a data access sequence of the semiconductor device according to the fourth embodiment of the present invention. In the access sequence shown in FIG. 27, writing and reading are executed on memory blocks different alternately. Since the write voltage is transferred using the corresponding bit line upon writing (program), the writing and reading cannot be executed in parallel.

Figure 28:
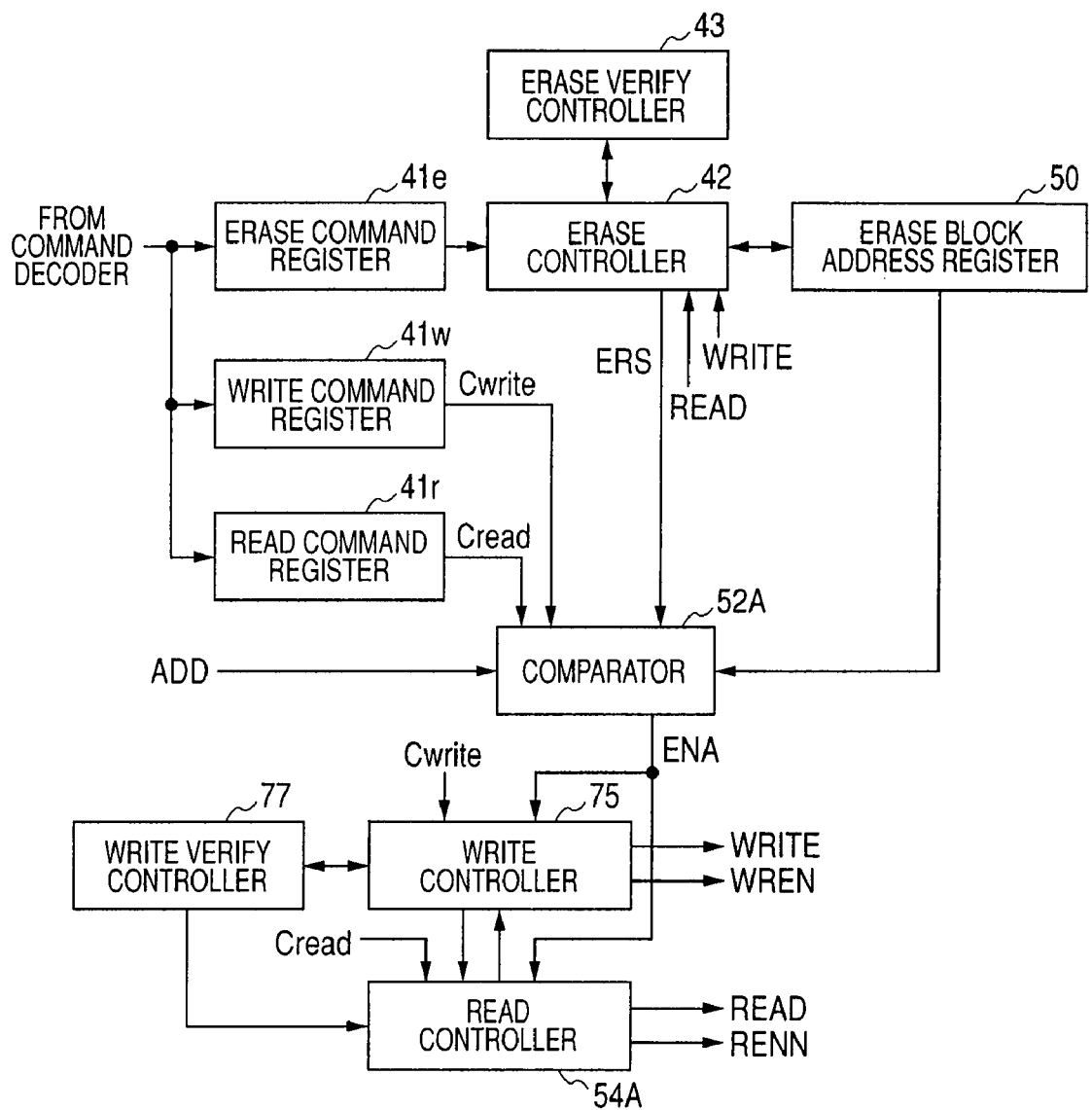
FIG. 28 is a diagram schematically illustrating a configuration of a command register/control circuit shown in FIG. 23.

FIG. 28 is a diagram schematically showing a configuration of a command register/control circuit 24 shown in FIG. 23. In the command register/control circuit 24 shown in FIG. 28, an erase command register 41e, a write command register 41w and a read command register 41r are provided as command registers each of which stores a command for specifying a designated operation mode. Each of these command registers 41e, 41w and 41r stores therein a command subsequent to its decoding from an unillustrated command decoder.

In a manner similar to the previous configuration shown in FIG. 18, the command register/control circuit 24 shown in FIG. 28 includes an erase controller 42, an erase verify controller 43 and an erase block address register 50. The erase controller 42 asserts an erase mode instruction ERS in accordance with an erase command issued from the erase command register 41e to activate the erase verify controller 43 in parallel with an erase operation or after the completion of erasure, thereby executing an erase verify operation. When the erase verify is completed, the erase controller 42 stops the erase operation in accordance with an erase verify completion instruction issued from the erase verify controller 43.

The command register/control circuit 24 is further provided with a comparator 52A, a read controller 54A, a write controller 75 and a write verify controller 77. The comparator 52A compares an erase block address stored in the erase block address register 50 and a block address of an address signal ADD supplied thereto in accordance with assertion of one of a write mode instruction Cwrite outputted from the write command register 40w and a read mode instruction Cread outputted from the read command register 41r, and assertion of the erase mode instruction ERS outputted from the erase controller 42. When the result of comparison therebetween indicates a coincidence, the comparator 52A maintains a data access activation signal ENA in a negate state. When the result of comparison indicates a non-coincidence, the comparator 52A asserts the data access activation signal ENA.

Upon negation (deactivation) of a write mode enable signal WRITE from the write controller 75, the read controller 54A generates a read mode enable signal READ and a read operation activation signal RENN in accordance with the read mode instruction Cread and the data access activation instruction issued from the comparator 52A. The read mode enable signal READ is set to an enable state during a read operation, and the read operation activation signal RENN defines a period in which actual data reading is performed. When the semiconductor device sets activation timing for the read operation in accordance with a change in address signal, the read operation activation signal RENN does not have to be generated in particular. Further, the period of activation of the assist gate AG and the period of activation of the sense amplifier are defined in accordance with the read operation activation signal RENN.

The read controller 54A further activates the read mode enable signal READ and the read operation activation signal RENN in accordance with a write verify instruction issued from the write verify controller 77. The read controller 54A activates the read mode enable signal READ and the read operation activation signal RENN through an unillustrated path in accordance with the erase verify instruction issued from the erase verify controller 43.

When the write mode instruction Cwrite is asserted upon the assertion of the data access activation signal ENA outputted from the comparator 52A, the write controller 75 activates a write mode enable signal WRITE and a write operation activation signal WREN. The write operation mode instruction signal WRITE defines a write operation period, and the write operation activation signal WREN defines the period of application of a write voltage applied to each of the memory gate and the bit line. After the completion of writing, the write controller 75 starts up the write verify controller 77 to execute write verify.

When the read controller 54A is asserting the read mode enable signal READ, the write controller 75 is maintained in an inactive state.

As the configuration of a row decoder employed in the semiconductor device according to the fourth embodiment of the present invention, such a configuration as shown in FIG. 19 may be provided as a local decoder with respect to each memory block.

Figure 29:
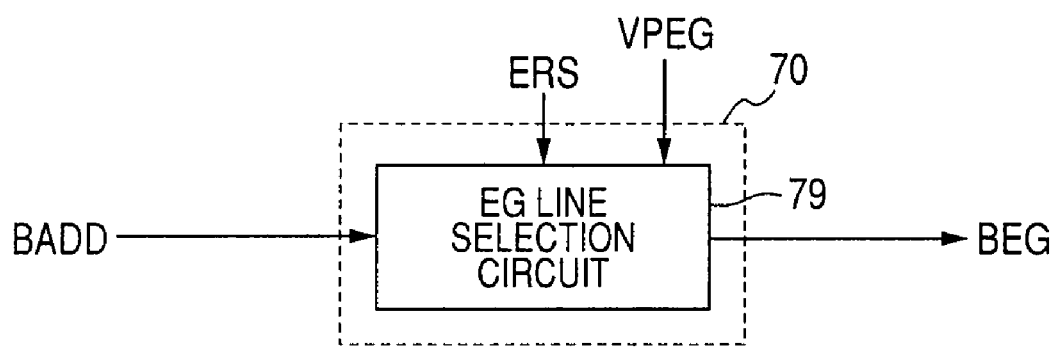
FIG. 29 is a diagram schematically depicting a configuration of an EG control circuit shown in FIG. 23.

FIG. 29 is a diagram schematically showing one example of the configuration of the EG control circuit 70 shown in FIG. 23. An EG line selection circuit 79 is provided in the EG control circuit 70 shown in FIG. 29. The EG line selection circuit 79 decodes a block address BADD contained in the address signal ADD upon assertion of the erase mode instruction ERS and transfers an erase high voltage VPEG to its corresponding block embedded erase gate line BEG for the selected memory block. With regard to each remaining non-selected memory block, the EG line selection circuit 79 maintains a block embedded erase gate line at a ground voltage (or maintained in an open state).

With regard to voltages necessary for the respective operation modes, the voltage generator shown in FIG. 23 generates (or selects) the erase voltage, write voltage, read voltage and erase/write verify read voltage in accordance with the erase mode instruction ERS, write mode enable signal WRITE and read mode enable signal READ outputted from the erase controller 42, write controller 75 and read controller 54A, respectively. They are supplied to the row and column decoders, from which the voltages corresponding to the respective operation modes are supplied to each selected memory cell.

According to the fourth embodiment of the present invention as described above, it is possible to execute reading or writing at another memory block in parallel with the erase operation. Correspondingly, data access efficiency is further improved. Advantageous effects similar to those of the first and second embodiments can be obtained.

Incidentally, even in the case of the fourth embodiment in a manner similar to the third embodiment, the period and interval during which the writing or reading is performed, are set sufficiently shorter than the erase voltage application period and do not adversely affect the erase operation.

Fifth Embodiment

Figure 30:
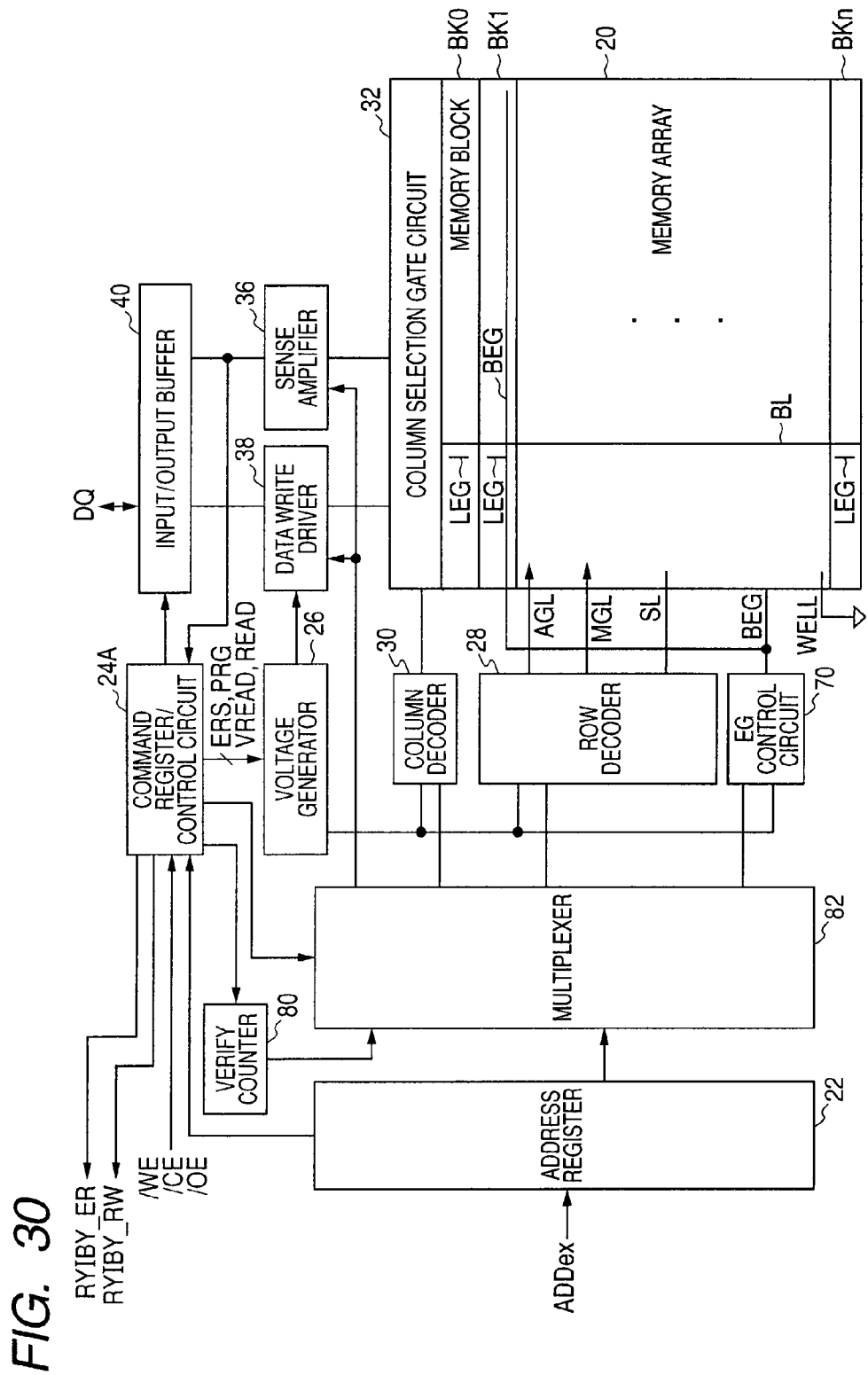
FIG. 30 is a diagram schematically showing an overall configuration of a semiconductor device according to a fifth embodiment of the present invention.

FIG. 30 is a diagram schematically showing an overall configuration of a semiconductor device according to a fifth embodiment of the present invention. The semiconductor device shown in FIG. 30 is different in configuration from the semiconductor device shown in FIG. 23 in the following points. Namely, when the command register/control circuit 24A is in an erase operation, the command register/control circuit 24A outputs an erase status signal RYIBY_ER to the outside and outputs an access inhibition status signal RYIBY_RW to an external device during the execution of data read, write or verify operation internally.

A verify counter 80 and a multiplexer 82 are provided. The verify counter 80 generates an address for specifying a memory cell target for verify in accordance with a count operation upon erase verify and write verify. The multiplexer 82 selects one of an internal address given from an address register 22 and a verify address given from the verify counter 80 to generate an internal address and supplies the same to a column decoder 30, a row decoder 28 and an EG control circuit 70. The internal address given from the multiplexer 80 is supplied even to a data write driver 38 and a sense amplifier 36.

The semiconductor device shown in FIG. 30 is identical in other configuration to the semiconductor device shown in FIG. 23. The same reference numerals are attached to their corresponding portions, and their detailed explanations are omitted.

In the semiconductor device shown in FIG. 30, the command register/control circuit 24A asserts the access inhibition status signal RYIBY_RW when the read, write (actual write operation) or verify operation of data is performed inside. Thus, when the access inhibition status signal RYIBY_RW is in an asserted state, an external device such as a processing device inhibits access to the semiconductor device.

On the other hand, when the erase status signal RYIBY_ER outputted from the command register/control circuit 24A is in an asserted state, the erase operation is performed inside the semiconductor device (no erase verify operation is done). Thus, access (write/read) of data from outside is allowed in this case. Inhibiting the external access when the verify operation is being performed inside makes it possible to reliably prevent a collision between data and realize high-speed data access.

Figure 31:
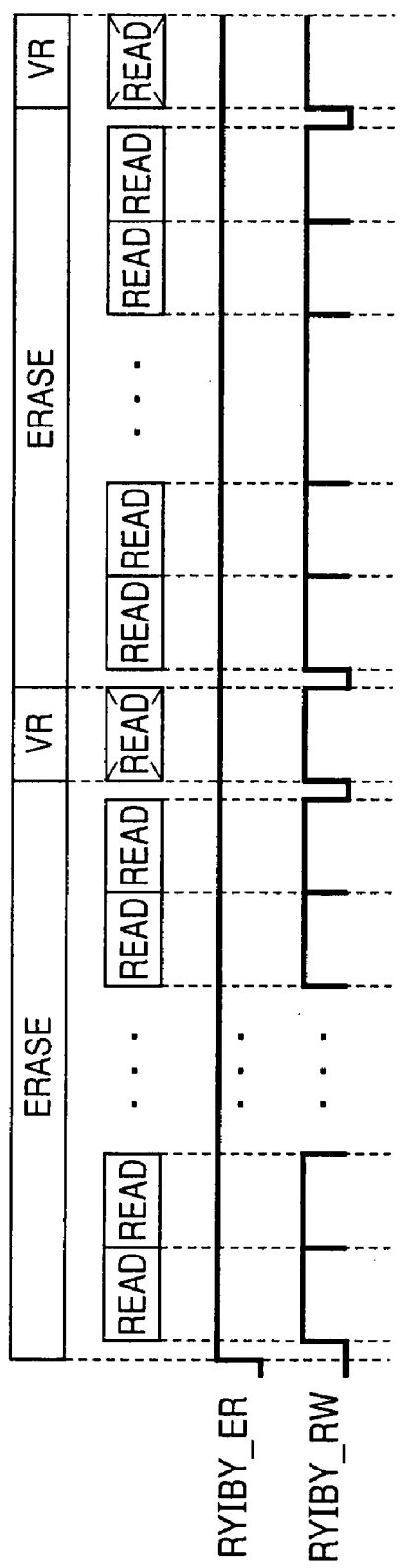
FIG. 31 is a diagram illustrating an operation sequence at the erasure of the semiconductor device shown in FIG. 30.

FIG. 31 is a diagram showing one example of an operation sequence at erasure. As shown in FIG. 31, erasure is executed on one memory block at a memory array 20. When this erasure is performed internally, the command register/control circuit 24A asserts an erase status signal RYIBY_ER. With the assertion of the signal RYIBY_ER, the external device is notified of access inability.

When the external device performs read access in this state, a data access inhibition status signal RYIBY_RW is asserted. When one read operation is completed inside, this signal RYIBY_RW is deasserted (negated). The following read operation is repeatedly executed in accordance with the signal RYIBY_RW.

When the erasure and erase verify relative to each memory block are completed, the erase status signal RYIBY_ER is negated. At this time, the signal RYIBY_ER is in an asserted state when the erase verify operation is in execution (verify operation is expressed in symbol VR). Further, the signal RYIBY_RW is asserted. Correspondingly, external access is inhibited during the period of the erase verify operation. When the verify operation is finished and the application of an erase voltage is performed again, the signal RYIBY_ER is asserted so that access ability is notified to the external device.

The signal RYIBY_RW is negated in accordance with the completion of the erase verify operation. Thus, when the read operation is repeatedly executed during the period of application of the erase voltage, the signal RYIBY_RW is brought to a negated state each time the internal read operation is completed. When the read operation is carried out inside, the signal RYIBY_RW is brought to an asserted state. Thus, external access is inhibited when data reading is performed inside. When the read operation is completed, the signal RYIBY_RW is negated. When the erasure is completed, the signal RYIBY_ER is negated.

Upon the application of the erase voltage (pulse), an ability to access data is notified to the outside using the signal RYIBY-ER, and the execution of the read operation inside is notified to the outside using the signal RYIBY-RW. Consequentially, data read access can reliably be performed from outside in parallel with the time of the erase operation while avoiding a collision between access data and verify data.

Figure 32:
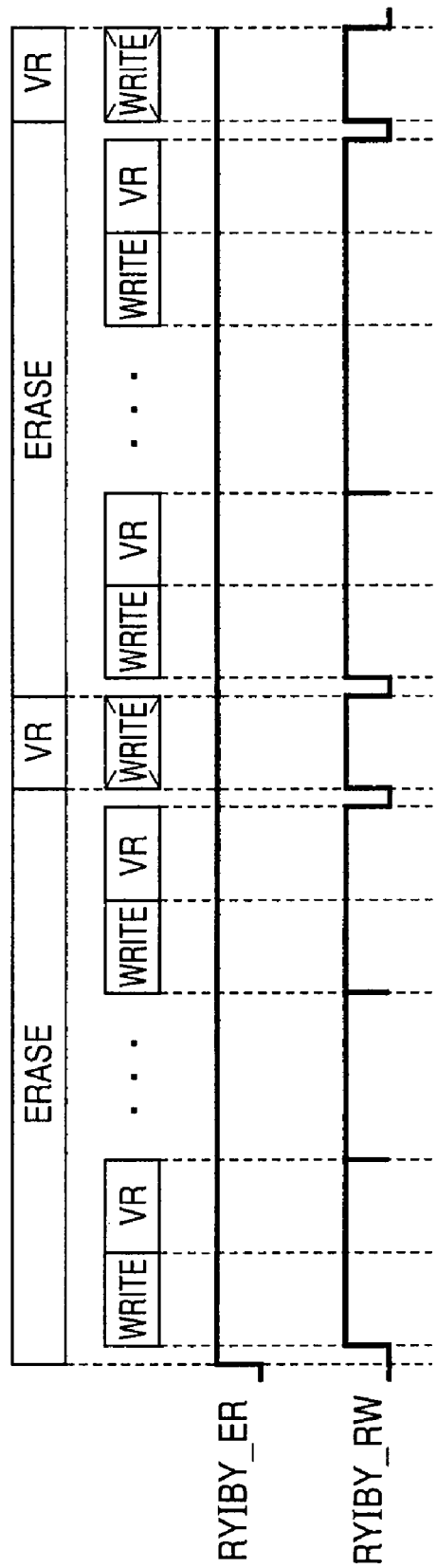
FIG. 32 is a diagram showing erase and write operation modes of the semiconductor device shown in FIG. 30.

FIG. 32 is a diagram showing an example of another operation sequence at the time of application of the erase pulse. In FIG. 32, a write operation is performed in parallel with the application of the erase pulse. Write verify is carried out upon the write operation.

When the erase pulse is applied, the signal RYIBY_ER is asserted so that an ability to access data or accessibility is notified to the outside. Correspondingly, data write access is carried out from outside so that the signal RYIBY_RW is asserted. When the write operation is completed, a write verify operation is executed subsequently. Since the write verify operation (VR operation) is executed, the signal RYIBY_RW is successively maintained in the asserted state. When the write verify operation is completed, one data writing is completed and the signal RYIBY_RW is negated.

Upon the erase operation, the following external write access is carried out in accordance with the negation of the signal RYIBY_RW. When the data writing and the verify operation are completed, the signal RYIBY_RW is negated. In accordance with the negation of the signal RYIBY_RW, the erase operation is completed and the signal RYIBY_ER is negated. After the application of the erase pulse, the erase verify operation is carried out to identify whether each memory cell target for erasure has reliably been erased. Although the signal RYIBY_ER is asserted at this time, the signal RYIBY_RW is in the asserted state and the external write access is inhibited. Using the signals RYIBY_ER and RYIBY_RW makes it possible to avoid competition between the write verify and the erase verify.

When the erase operation is completed by the erase verify operation, the erase status signal RYIBY_ER is negated. On the other hand, when it is determined based on the erase verify operation that an erase fail exists, the erase status signal RYIBY_ER is asserted continuously so that the application of the erase pulse is executed consecutively. At this time, the signal RYIBY_RW is negated in accordance with the completion of the erase verify operation, so that external write access is allowed.

When the write operation is started internally, the signal RYIBY_RW is asserted so that data writing is carried out, followed by execution of the write verify. When the data writing and the write verify are completed, the signal RYIBY_RW is negated. When the erase pulse application period is completed, the signal RYIBY_ER is negated. Since the erase verify operation is carried out, the signal RYIBY_RW is asserted again and external write access is hence inhibited.

As described above, the external access is inhibited where the erase verify or the write verify is carried out internally. It is therefore possible to avoid a collision of the verify operation with the external data access operation and carry out the external data access (write/read) in parallel with the erase operation. In particular, the erase status signal RYIBY_ER is maintained in the asserted state upon the application of the erase pulse at the erasure and during the erase verify operation, whereas the access status signal RYIBY_RW is set to the asserted state upon access to each memory cell, i.e., upon the erase verify operation, external write access and external read access. Consequently, the signals RYIBY_ER and RYIBY_RW can be controlled independently of each other and hence their control becomes easy.

In the configurations shown in FIGS. 31 and 32, the above operations are shown in such a manner that the read command or the write command is supplied for every data reading or writing. A burst access mode may however be designated as each of the read and write commands to carry out the reading or writing of data consecutively. In this case, the signal RYIBY_RW is maintained in the asserted state during this burst access period.

Figure 33:
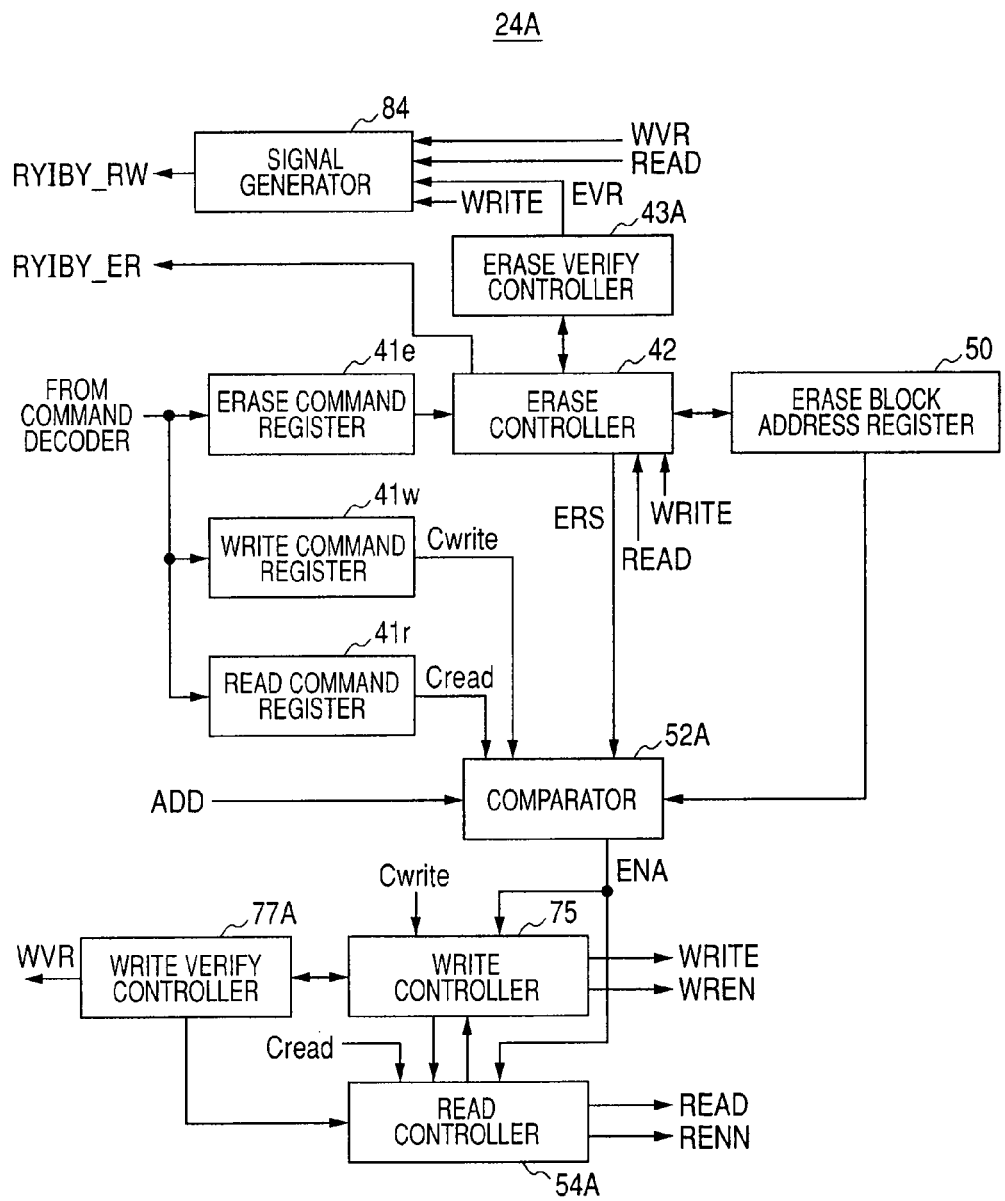
FIG. 33 is a diagram schematically illustrating a configuration of a command register/control circuit shown in FIG. 30.

FIG. 33 is a diagram schematically showing a configuration of the command register/control circuit 24A shown in FIG. 30. The command register/control circuit 24A shown in FIG. 33 is different in configuration from the command register/control circuit 24 shown in FIG. 28 in the following points. Namely, a write verify controller 77A generates a write verify instruction signal WVR, and an erase verify controller 43A generates an erase verify instruction signal EVR. When the signals WVR and EVR are asserted, a verify operation is executed.

An erase controller 42 asserts a signal RYIBY_ER during an erase voltage application period and an erase verify operation period and outputs the same to the outside. A signal generator 84, which receives these signals WVR, EVR, read mode enable signal READ and write mode enable signal WRITE, is provided to generate a signal RYIBY_RW. Upon assertion of any of the supplied signals WVR, READ, EVR and WRITE, the signal generator 84 asserts the signal RYIBY_RW and outputs it to the outside. Thus, when the writing, reading and verify of data are being executed internally, the signal RYIBY_RW can be asserted.

Incidentally, the signal generator 84 may be supplied with activation signals WREN and RENN instead of the signals READ and WRITE.

An erase verify controller 43A is comprised of a sequence controller in a manner similar to the erase controller 42 and executes an erase verify operation in a predetermined sequence after the application of an erase pulse. Thus, the use of the signal RYIBY_RW makes it possible to prevent a collision between the verify operation and external data read access.

According to the fifth embodiment of the present invention as described above, the signal indicative of the internal erase state and the signals indicative of the internal read, write and verify operations are outputted to the external device. It is thus possible to prevent the competition between the external access of data and the verify operation by inhibiting the external write and read access upon the internal verify operation. Correspondingly, data access can be carried out accurately and efficiently even at the application of the erase pulse.

In the fifth embodiment, no erase verify is carried out during the period of application of the erase voltage (pulse). The erase verify lying in the application of the erased pulse may be executed by adjusting the timing between the erase verify and external access, as will be descried in the following embodiment.

Sixth Embodiment

Figure 34:
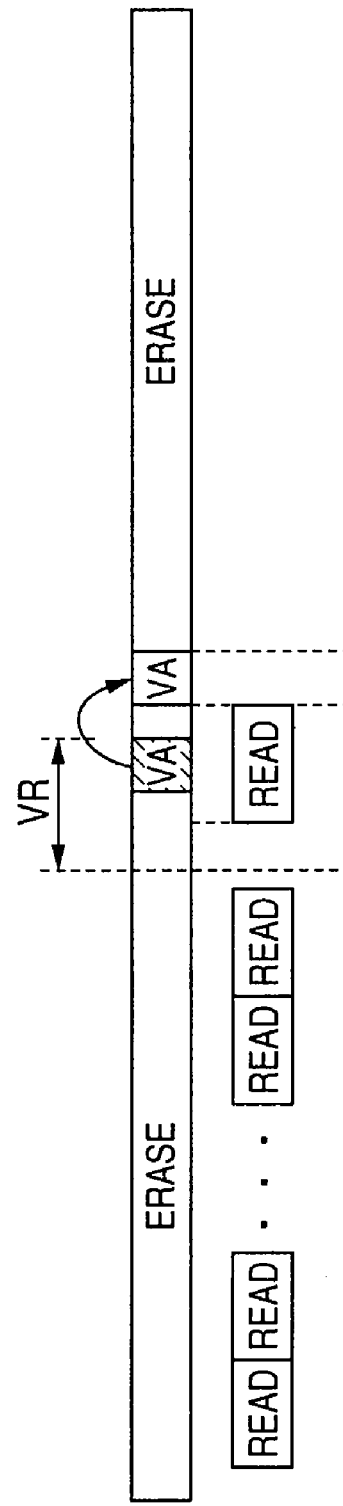
FIG. 34 is a diagram depicting an erase and read operation sequence of a semiconductor device according to a sixth embodiment of the present invention.

FIG. 34 is a diagram showing one example of a data access sequence at erasure, of a semiconductor device according to a sixth embodiment of the present invention. In the operation sequence shown in FIG. 34, an erase verify operation VR is stopped when a read access request is issued during an erase verify operation, and the requested read operation is carried out. After the completion of the data read access, the stopped erase verify operation is executed on the remaining verify address region VA.

Thus, the data read access can be executed without causing a waiting time at the read data access.

Figure 35:
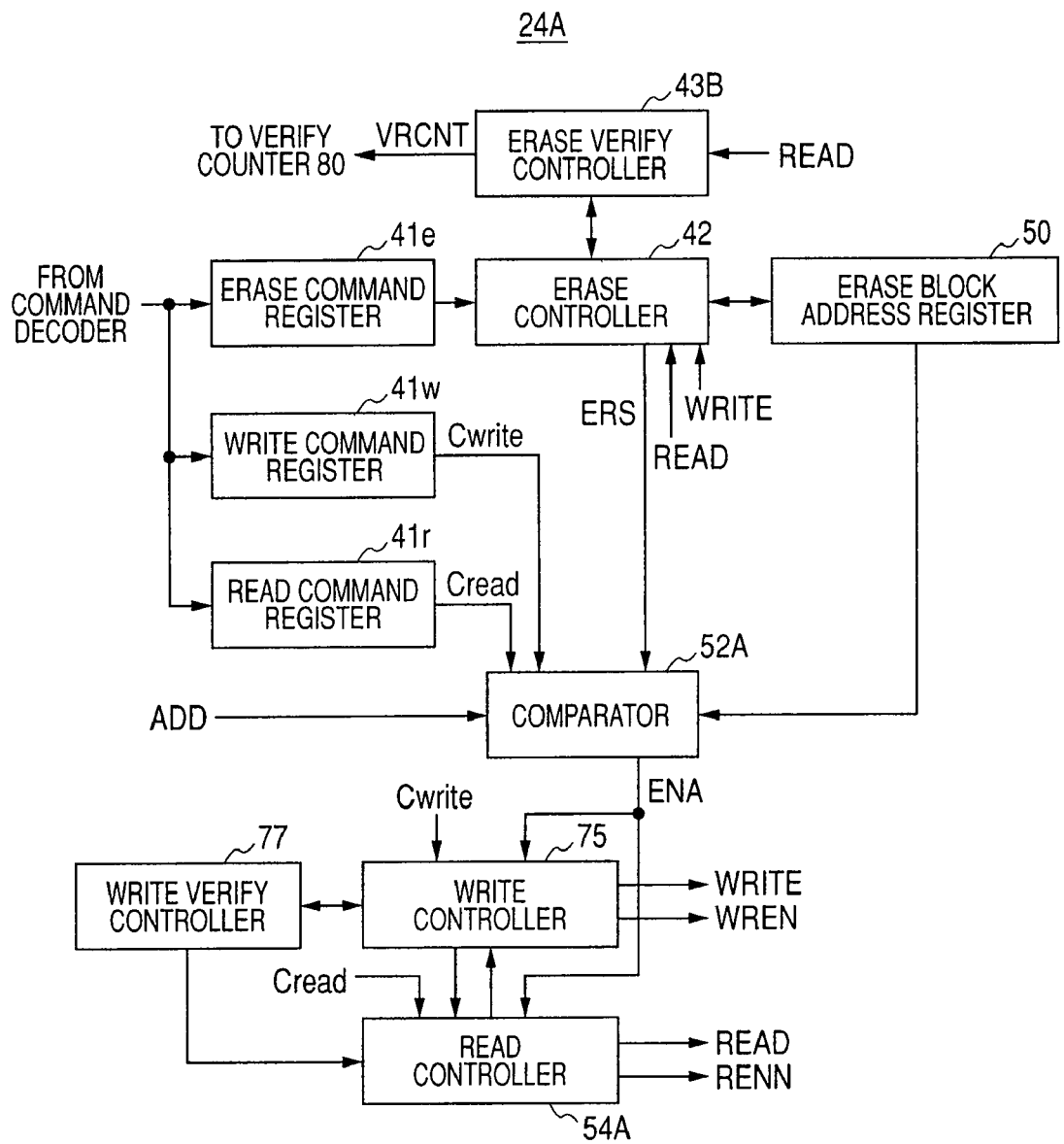
FIG. 35 is a diagram schematically showing a configuration of a command register/control circuit of the semiconductor device according to the sixth embodiment of the present invention.

FIG. 35 is a diagram schematically showing a configuration of a command register/control circuit according to the sixth embodiment of the present invention. The present semiconductor device is identical in overall configuration to the semiconductor device shown in FIG. 23.

The command register/control circuit 24A shown in FIG. 35 is different in configuration from the command register/control circuit 24A shown in FIG. 33 in the following points. Namely, the signal generator 84 is not provided. That is, the signal for notifying the internal status to the outside is not utilized in the sixth embodiment. When a read mode enable signal READ outputted from a read controller 54A is received and asserted by an erase verify controller 43B, the erase verify controller 43B stops a verify operation being in execution and notifies an external read access permission to the read controller 54A. Further, the erase verify controller 43B negates a count update instruction signal VRCNT to stop a count operation of a verify counter 80.

When the read controller 54A receives the read access permission outputted from the erase verify controller 43B upon read access to each memory block different from an erase block, the read controller 54A asserts a read operation activation signal RENN to execute the operation reading data from outside. When the read access is completed, the read controller 54A negates the read mod enable signal READ. The count update instruction signal VRCNT is asserted in accordance with the negation of the read mode enable signal READ to resume erase verify from a stopped verify address.

When an erase verify start instruction is given from an erase controller 42, the erase verify controller 43B asserts the read mode enable signal READ. When the external data read access is being performed, the erase verify controller 43B waits for the completion of the external data read access with respect to this erase verify. When the read mode enable signal READ is negated, the erase verify controller 43B supplies a count update instruction signal VRCNT to the verify counter 80 to cause a multiplexer 82 to select a verify address count given from the verify counter 80, thereby executing the erase verify operation in accordance with the count value given from the verify counter 80.

The command register/control circuit 24A shown in FIG. 35 is similar in other configuration to the command register/control circuit 24A shown in FIG. 33, and their detailed explanations are omitted.

According to the sixth embodiment of the present invention as described above, when the read access request from the outside is given at the erasure when the verify operation is in execution, or when the erase verify instruction is asserted during the external read access in reverse, the stop of the erase verify operation or the waiting therefor and the external read access are executed. The external read access is made higher in priority than the erase verify operation. It is thus possible to shorten the time taken to wait for the external read access and perform high-speed data reading.

Seventh Embodiment

Figure 36:
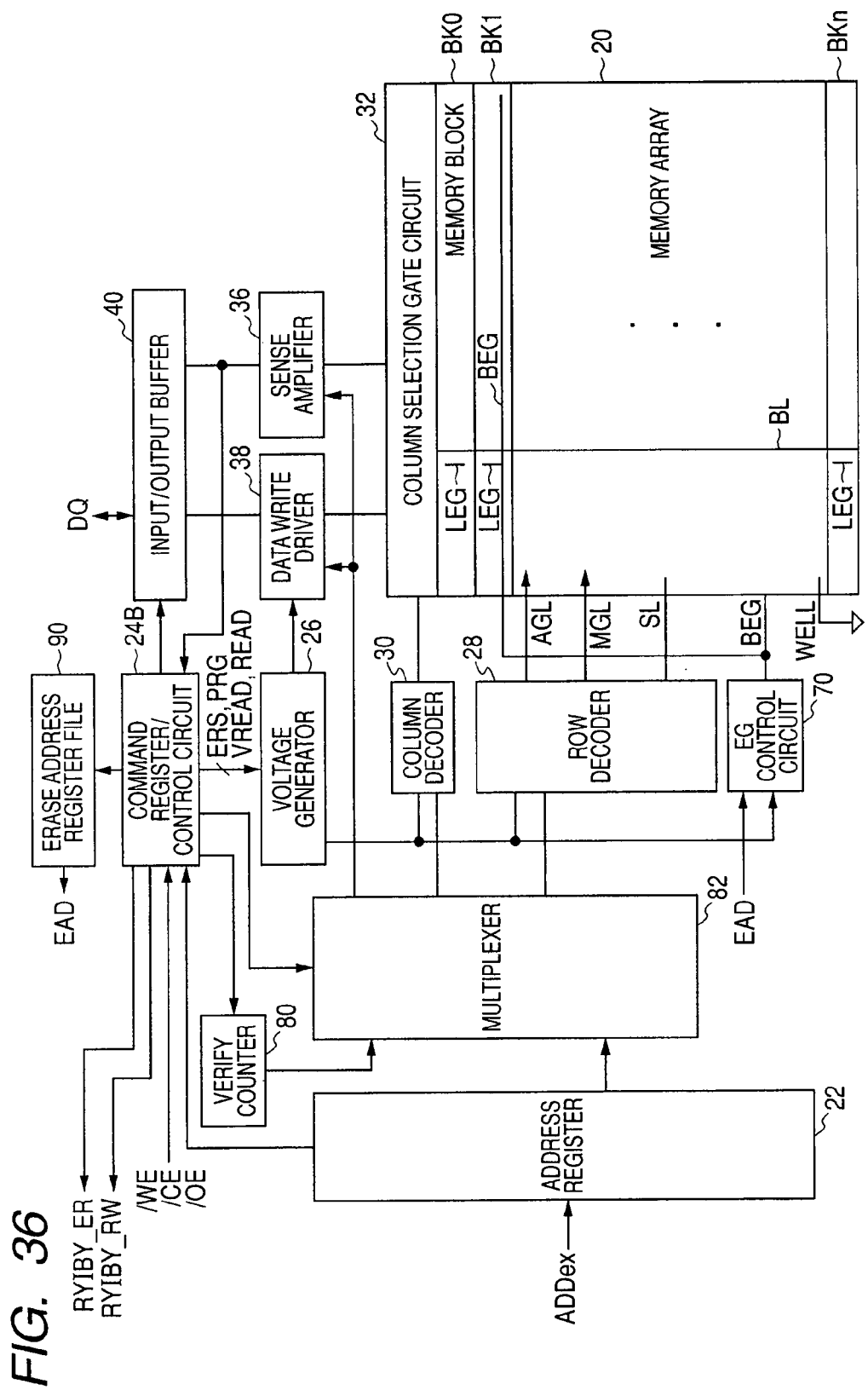
FIG. 36 is a diagram schematically illustrating an overall configuration of a semiconductor device according to a seventh embodiment of the present embodiment.

FIG. 36 is a diagram schematically showing an overall configuration of a semiconductor device according to a seventh embodiment of the present invention. The semiconductor device shown in FIG. 36 is different in configuration from the semiconductor device shown in FIG. 30 in the following points. Namely, there is provided an erase address register file 90 which stores therein a plurality of erase addresses for specifying erase blocks. The erase address register file 90 sequentially reads the stored erase addresses under the control of a command register/control circuit 24B and supplies the corresponding erase block address EAD to an EG control circuit 70. The semiconductor device shown in FIG. 36 is identical in other configuration to the semiconductor device shown in FIG. 30. The same reference numerals are attached to their corresponding portions, and their detailed explanations are omitted.

Figure 37:
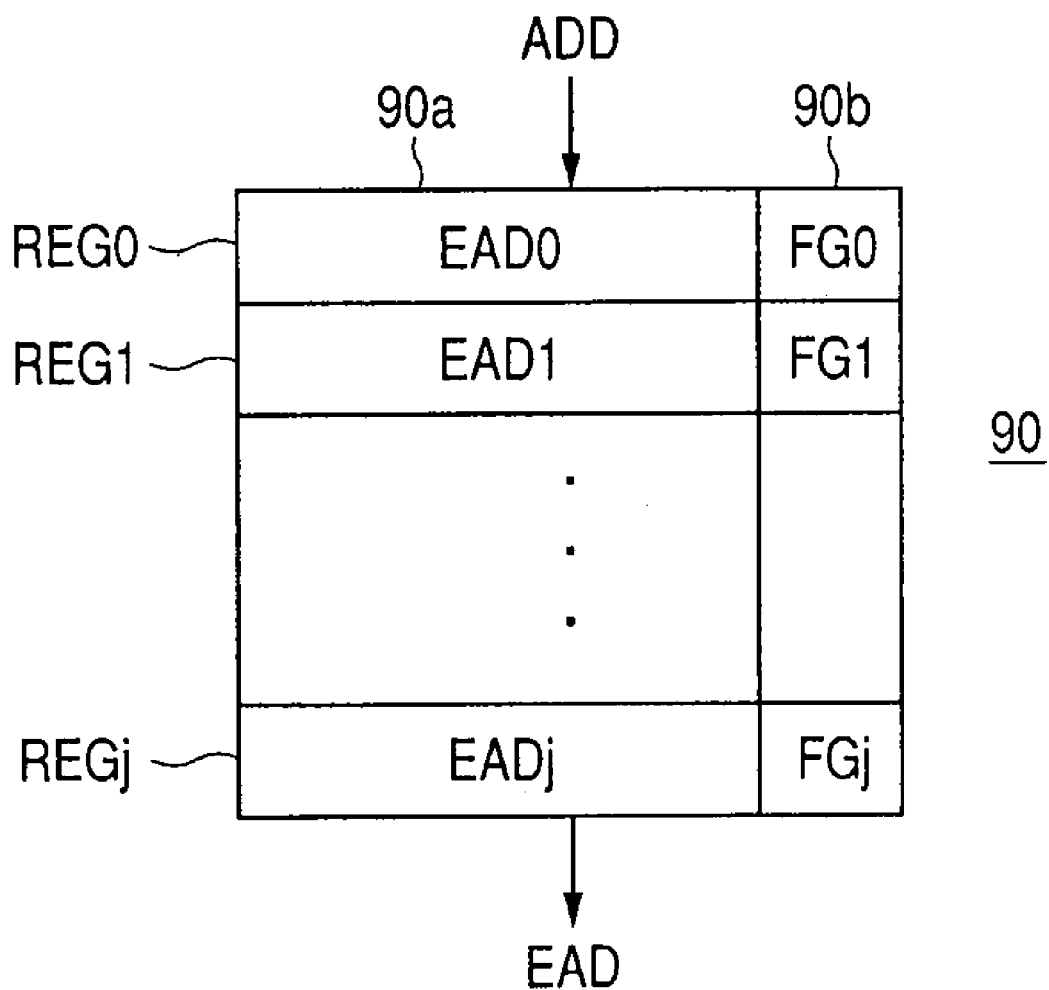
FIG. 37 is a diagram schematically showing a configuration of an erase address register file shown in FIG. 36.

FIG. 37 is a diagram schematically showing one example of a configuration of the erase address register file 90 shown in FIG. 36. The erase address register file 90 includes a plurality of registers. Each of the registers includes an erase address storage region 90a and an effective flag storage region 90b. The registers REG0 through REGa successively read data stored therein according to shift operations in FIFO (First-In First-Out) manner.

When each of flags FG (FG0 through FGj) stored in the effective flag storage region 90b is indicative of an effective state, each of erase addresses EAD (EAD0 through EADj) contained in the corresponding erase address storage region 90a is supplied to the EG control circuit 70 as an address for designating an erase block, whereby erasure on the designated erase block is executed.

Figure 38:
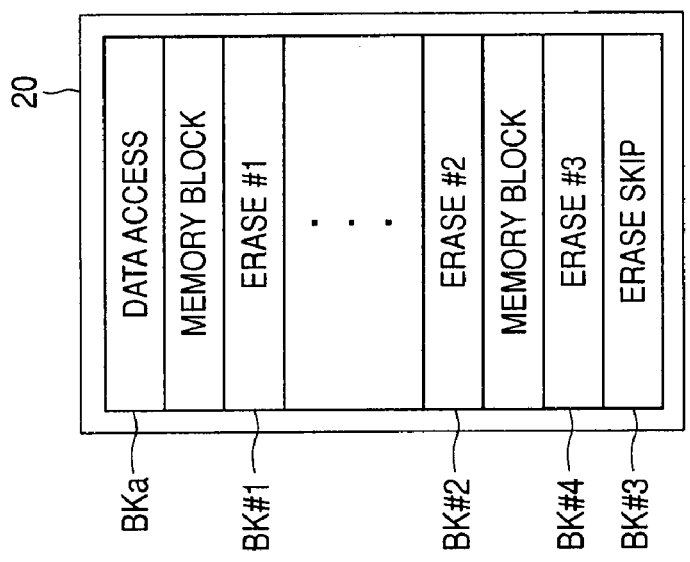
FIG. 38 is a diagram illustrating memory blocks targeted for erasure in the semiconductor device shown in FIG. 36.

FIG. 38 is a diagram schematically showing an erase sequence for memory blocks in a memory array employed in the seventh embodiment of the present invention. A plurality of the memory blocks are provided in the memory array (memory mat) 20. Here, the memory mat is of a portion corresponding to the memory array, which is surrounded by a row decoder and a column selection gate circuit, and indicates a portion which configures a single bank.

When data access is performed on a memory block BKa in FIG. 38, erase addresses for specifying blocks #1, BK#2 and BK#4 are successively stored in the erase address register file 90. A skip flag (effective flag placed in a reset state) indicative of an erase non-execution is stored in a memory block BK#3. In this case, erasure is performed on the memory blocks BK#1 and BK#2 in parallel with data access (read or write) to the memory block BKa. Erasure skips over the memory block BK#3 and is not carried out. After an erase time allocated to the memory block BK#3 has elapsed, erasure on the memory block BK#4 is carried out.

The period during which erasure is performed at the background of data access is stopped by storing the corresponding skip address in the erase address register file. The erase address and the skip address are designated by an external command.

At the time of power shutdown, each non-executed erase address stored in the erase address register file 90 is stored in a specific region of the memory array 20.

Figure 39:
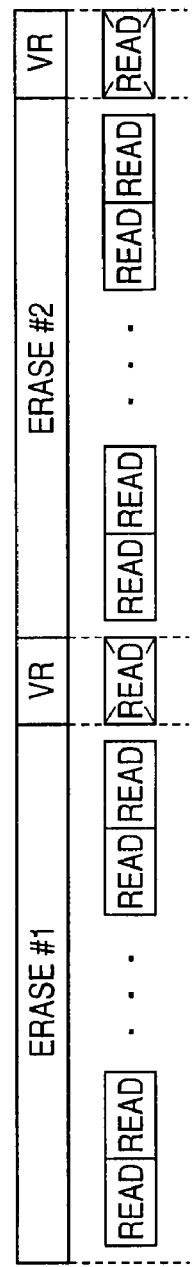
FIG. 39 is a diagram showing an erase and read operation sequence of the semiconductor device shown in FIG. 36.

FIG. 39 is a diagram schematically showing an erase and data access operation sequence employed in the seventh embodiment of the present invention. Namely, when the data access to the memory block BKa shown in FIG. 38 in the memory array is in execution, erasure (#1) on the memory block BK#1 is carried out. External read access is inhibited upon an erase verify operation. When this verify operation is completed and the erasure of the memory block BK#1 is completed, erasure (#2) on the next memory block BK#2 is executed. When the memory block BK#3 is specified, such a memory block is of an erase skip block and hence no erasure is carried out. This interval is defined as an erase stop period. After a predetermined period (period necessary for erasure) has elapsed, erasure (#3) on the next memory block BK#4 is carried out.

Thus, the erase operation is almost made invisible to the outside upon the external data access (at the data reading) and access efficiency can hence be improved.

Figure 40:
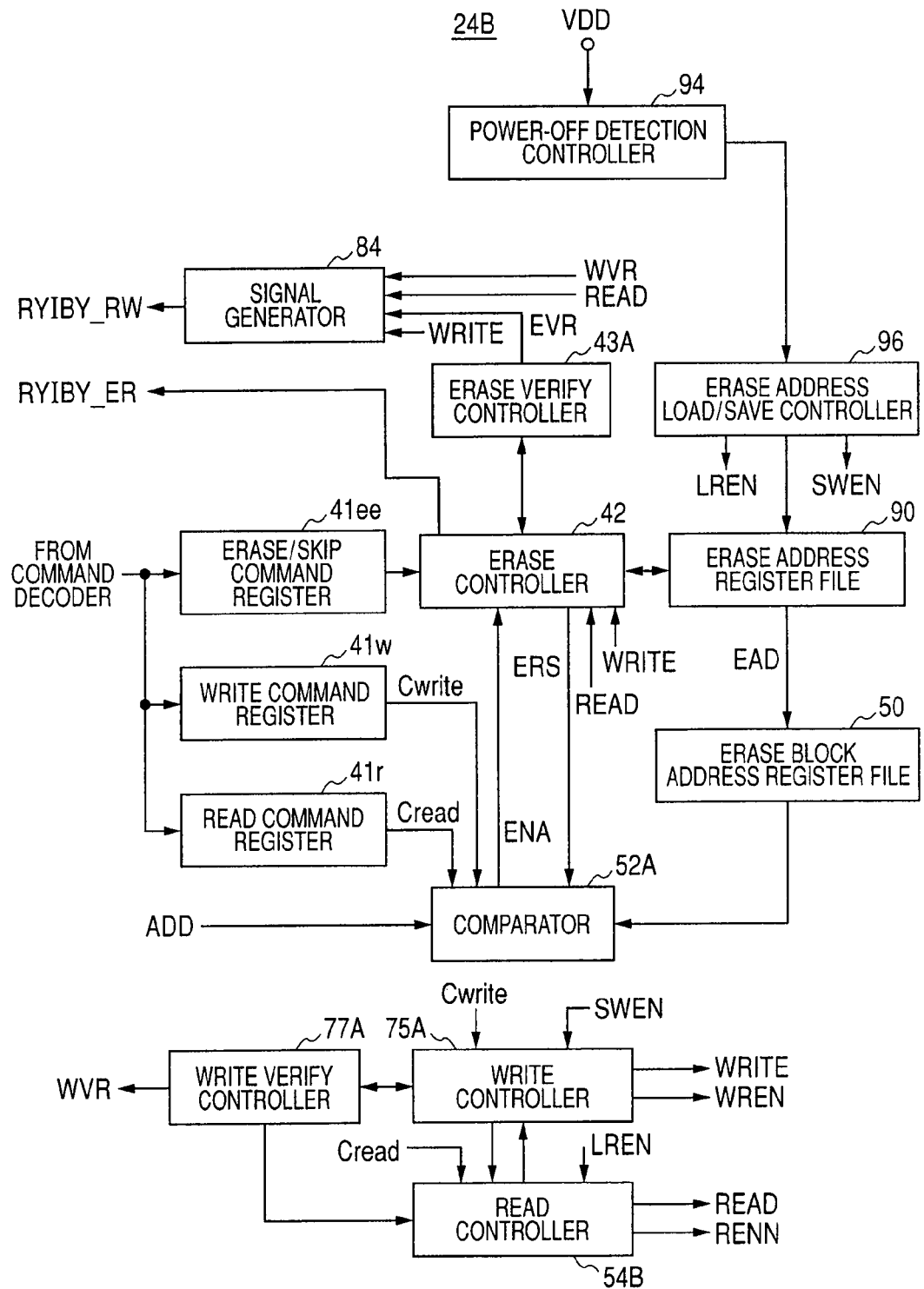
FIG. 40 is a diagram schematically depicting a configuration of a command register/control circuit shown in FIG. 36.

FIG. 40 is a diagram schematically showing a configuration of the command register/control circuit 24B shown in FIG. 36. The command register/control circuit 24B shown in FIG. 40 is different in configuration from the semiconductor device shown in FIG. 33 in the following points. Namely, in FIG. 40, a data access activation signal ENA outputted from a comparator 52A is supplied to an erase controller 42. The writing of an address and a flag to the erase address register file 90 is performed under the control of the erase controller 42. The erase controller 42 controls an operation necessary for erasure in accordance with a command issued from an erase/skip command register 41ee.

A power-off detection controller 94 and an erase address load/save controller 96 are provided for the erase address register file 90. Upon the shut-down of an external power supply VDD, the power-off detection controller 94 supplies a power-off detection signal to the erase address load/save controller 96. When the power-off detection signal is asserted, the erase address load/save controller 96 asserts a save write enable signal SWEN and supplies it to a write controller 75A. At the recovery of the power supply, the erase address load/save controller 96 asserts a load read enable signal LREN and supplies it to a read controller 54B. Namely, the erase address load/save controller 96 controls the writing and reading of data to and from the erase address register file 90 at the shut-down and recovery of the power supply.

In addition to control on the operation at the assertion of a write mode instruction Cwrite, the write controller 75A asserts a write mode enable signal WRITE and a write operation activation signal WREN upon assertion of the save write enable signal SWEN and thereby controls the operation of writing the corresponding erase address and flag stored in the erase address register file 90 into a predetermined memory region of the memory array.

Upon assertion of the load read enable signal LREN, the read controller 54B asserts a read mode enable signal READ and a read activation signal RENN and thereby controls the operation of reading the loaded erase address and flag from a predetermined region of the memory array. The read load erase address and flag are sequentially stored in the erase address register file 90 by the erase address load/save controller 96.

Incidentally, the signal generator 84 does not have to be provided in FIG. 40. Further, the signal RYIBY_ER may not be generated. This is because since the erasure is carried out at the background of the external data access, the notification of the erase pulse application period to the external device is not required in particular. When a normal erase mode and a background erase mode for performing erasure at the background are prepared as erase commands, the signal RYIBY_ER may be utilized.

Figure 42:
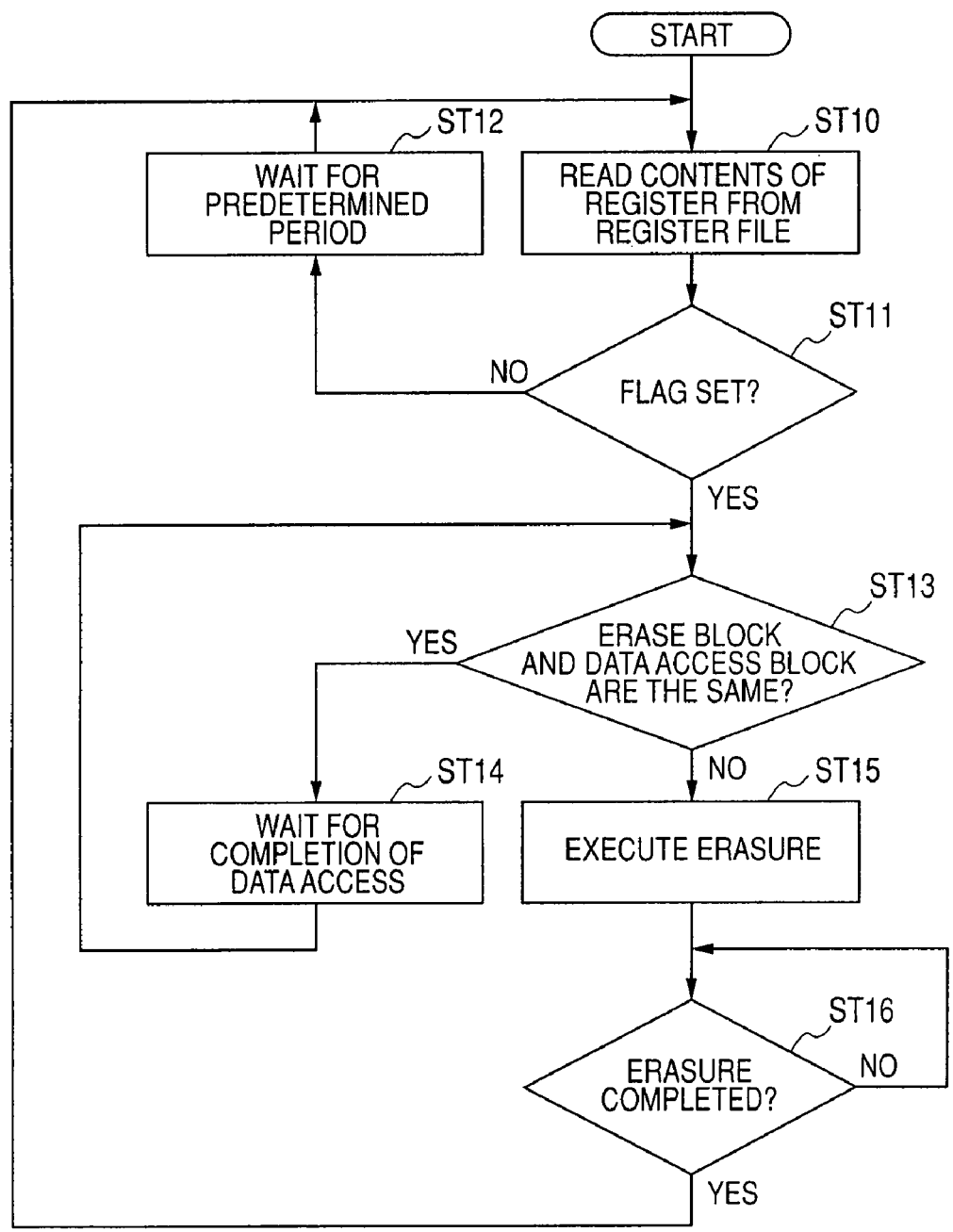
FIG. 42 is a flowchart illustrating an erase operation of the command register/control circuit shown in FIG. 40.

The command register/control circuit 24B shown in FIG. 42 is identical in other configuration to the command register/control circuit 24A shown in FIG. 33. The same reference numerals are attached to their corresponding portions, and their detailed explanations are omitted.

Figure 41:
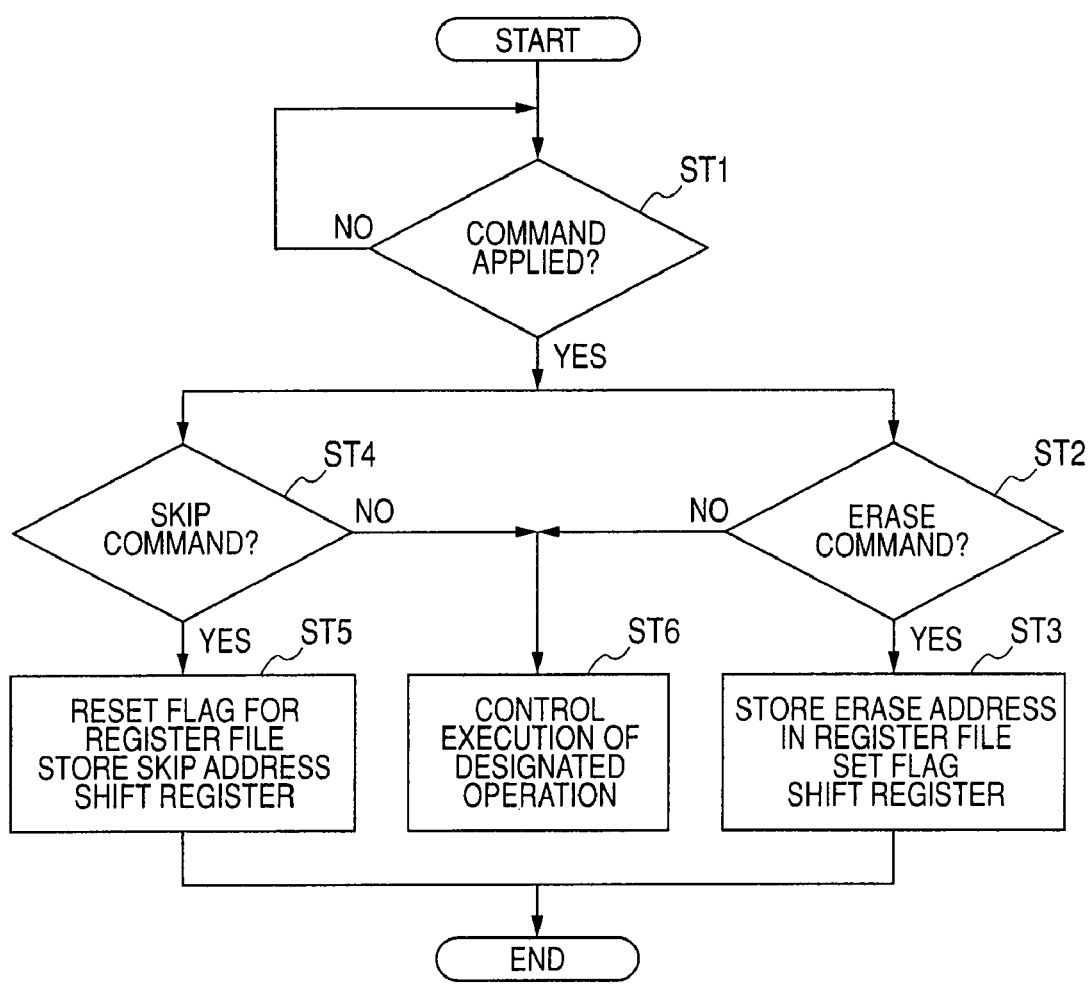
FIG. 41 is a flowchart showing a register file control operation of the command register/control circuit shown in FIG. 40.

FIG. 41 is a flowchart showing the operation of storage into the erase address register file 90 of the command register/control circuit 24B shown in FIG. 40. The erase register file storage operation of the command register/control circuit 24B shown in FIG. 40 will be explained below with reference to FIG. 41.

The command register/control circuit 24B firstly waits for the application of a command from the outside (Step ST1). When the command is applied from the outside, the erase controller 42 discriminates whether the command stored in the erase/skip command register 41ee is of an erase command (Step ST2) or a skip command (ST4).

When the given command is of the erase command (Step ST2), the erase controller 42 stores the erase command into the erase address register file 90 and sets an effective flag FLG for the corresponding register. After the storage of the address into the erase address register and the setting of the flag, a shift operation of the register of the register file 90 is carried out (Step ST3).

On the other hand, when the given command is of the skip command (Step ST4), the erase controller 42 stores the skip address into the erase address register file 90 and maintains the corresponding effective flag in a reset state. Thereafter, the register of the erase address register file 90 is shifted by one stage. Consequently, the storage of the erase address and the skip address is completed. At this time, only the skip flag may simply be stored (effective flag is maintained in the reset state). Next, the register is shifted by one stage.

When the given command is neither erase command (background erase command) nor erase skip command (when the result of determination is NO at Steps ST2 and ST4), the execution of the operation designated by the command is controlled by the write controller 75A or the read controller 54B in accordance with either of the operation mode instructions Cwrite and Cread stored in their corresponding write command register 41w and read command register 41r.

When the erase address register file 90 is comprised of shift registers, there is a need to apply a register number-of-stages command for the erase address register file in order to read a leading erase address from the last-stage register. When, however, the writing-in and reading of data are performed in FIFO manner in accordance with write and read addresses, the erase address register file 90 can carry out erasure in accordance with the corresponding erase address stored once firstly.

Incidentally, a normal erase command for designating a mode in which only erasure is designated from the outside to perform a normal erase operation, and a command for designating a background erase mode in which erasure is carried out in a background mode in parallel with external data access are respectively separately provided as the erase commands. When the background erase command is applied, the operation of storing the erase address into the erase address register file 90 may be executed.

FIG. 42 is a flowchart showing an operation in the background erase mode, of the command register/control circuit 24 shown in FIG. 40. The background erase operation of the command register/control circuit 24B shown in FIG. 40 will be explained below with reference to FIG. 42.

The erase controller 42 reads the contents of the oldest-stored register from the erase address register file 90 in accordance with the shift operation of the corresponding register (Step ST10). It is determined whether an effective flag is in a set or reset state with respect to the contents thereof supplied from the erase address register file 90 (Step ST11).

When the effective flag is in the reset state other than the set state, erasure on a memory block designated by the corresponding erase address is not carried out. After a waiting for a predetermined period (Step ST12), the background erase operation returns to Step ST10 again. On the other hand, when the effective flag is in the set state, it is necessary to perform erasure on the memory block designated by the corresponding erase address. At this time, the comparator 52A first determines whether an erase-targeted block that the erase address indicates, and a memory block at which data access is being performed are the same (Step ST13). When they are found to be identical to each other, it is not possible to perform erasure on the memory block targeted for the erasure (data target for access is changed). Therefore, the completion of data access (reading or writing) is awaited (Step ST14). After the completion of this data access, the background erase operation returns to Step ST13 again.

On the other hand, when the erase memory block and the data access memory block are of different memory blocks, erasure on the memory block designated by the erase address is performed (Step ST15).

When this erase is completed (Step ST16), the background erase operation returns to Step ST10 again, where the operations subsequent to shift-out reading of the contents of the corresponding register from the erase address register file 90 are executed. It is thus possible to perform erasure on the corresponding memory block different from the data access memory block at the background of the data access.

When the effective flag is in the reset state with respect to the corresponding memory block designated by the skip address, it is not necessary to perform erasure on the memory block designated by the skip address by the waiting for the predetermined period during an erase period. Unnecessary erasure is stopped to reduce current consumption.

In the configuration of the command register/control circuit 24B shown in FIG. 40, the external data access is stopped upon the erase verify operation (VR operation). In this case, however, the erase verify operation is interrupted until the external data access is completed, and the erase verify may be executed after the completion of the data access (refer to the sixth embodiment).

Figure 43:
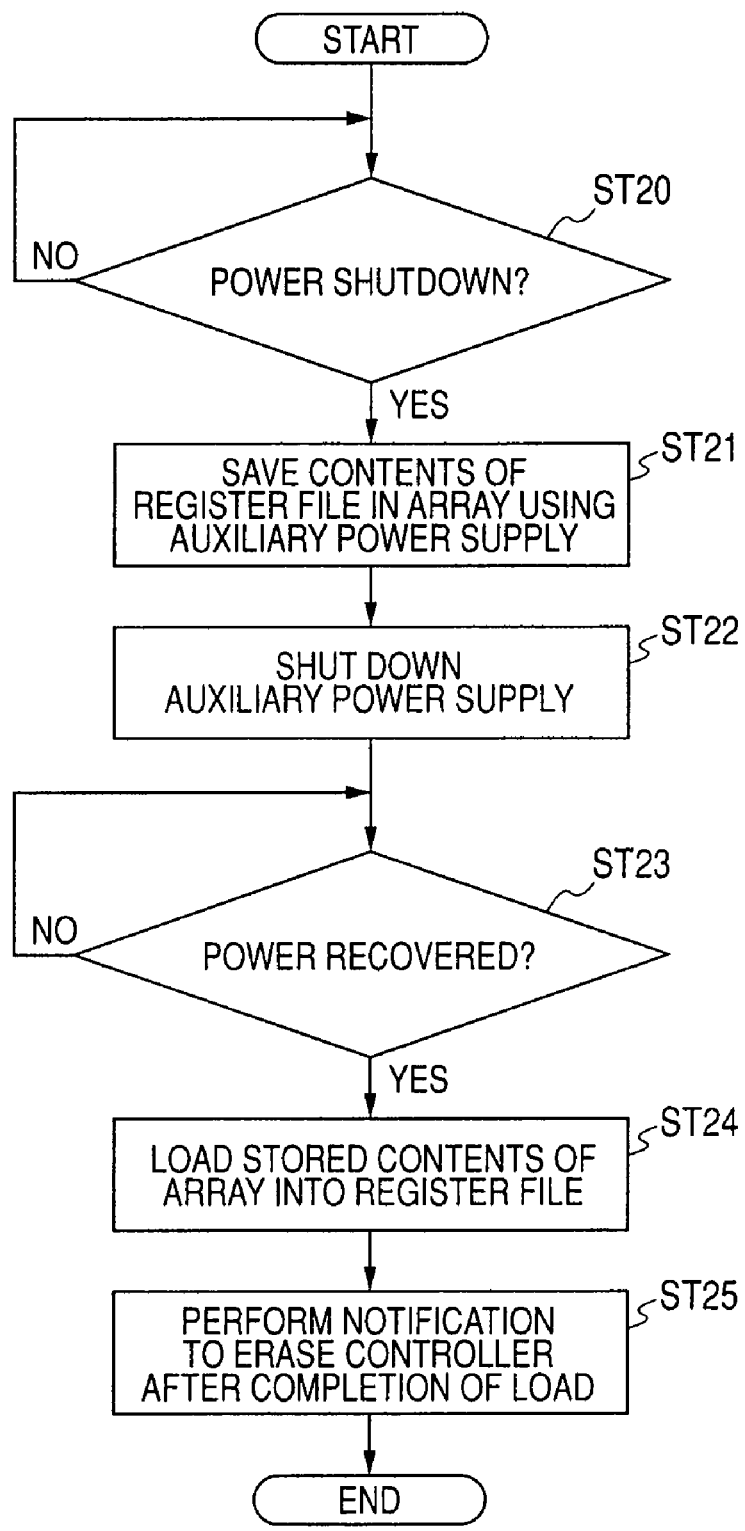
FIG. 43 is a flowchart depicting operation control at power-off of the command register/control circuit shown in FIG. 40.

FIG. 43 is a flowchart showing an operation at power shutdown, of the command register/control circuit 24B shown in FIG. 40. The operation at the power shutdown of the command register/control circuit 24B shown in FIG. 40 will be explained below with reference to FIG. 43.

The power-off detection controller 94 determines whether an external power supply VDD is shut down (Step ST20). Upon the power shutdown, the power is switched over to an auxiliary power supply by, for example, a power switching circuit provided in an external power management unit. Using the auxiliary power supply, the erase address load/save controller 96 asserts a save write enable signal SWEN in accordance with a power-off or shutdown detection signal and reads out the contents stored in each register from the erase address register file 90. The write controller 75A is enabled in accordance with the save write enable signal SWEN so that the register contents successively read from the erase address register file 90 are stored in predetermined regions of the memory array (Step ST21).

When the completion of loading of all register contents is notified from the erase address load/save controller 96, the auxiliary power supply is shut down at the external power management unit (Step ST22). Next, the recovery of power is awaited in this state (Step ST23).

When the power is recovered, the erase address load/save controller 95 asserts a load read enable signal LREN in accordance with a power recovery instruction signal issued from the power-off detection controller 94 and supplies it to the read controller 54B. The read controller 54B reads out the register contents saved into the predetermined region of the memory array in accordance with the load read enable signal. At the save/load of the erase address, an address for designating a specific address region is generated from the erase address load/save controller 96 and supplied to the address register 22 via the multiplexer 82 shown in FIG. 36, whereby a specific save/load region is designated.

The erase address load/save controller 96 sequentially stores the erase address, skip address and flag read under the control of the read controller 54B into the erase address register file 90 (Step ST24). After the completion of loading of the register contents into the erase address register file 90, the erase address load/save controller 96 notifies it to the erase controller 42 (Step ST25). The erase controller 42 performs an erase operation on each of the memory blocks designated by the remaining addresses in the background mode in accordance with a load completion instruction issued from the erase address register file 90.

Incidentally, when the power is shut down while the erasure is in execution in the background mode, there is a possibility that each interrupted erase-targeted memory block will be brought to an incomplete erase state. In this case, the erase block addresses stored in the erase block address register file 50 shown in FIG. 40 may also be loaded/saved together. After the power recovery, erasure is performed on the interrupted memory block again.

According to the seventh embodiment of the present invention as described above, the erasure is performed on the memory block different from the data access memory block in the background mode during the data access. It is thus possible to carry out the erasure inside without interrupting the data access. Accordingly, the erase time can be hidden from the outside and the external device makes it unnecessary to control the erase operation, thereby making it possible to freely carry out the data access.

Eighth Embodiment

Figure 44:
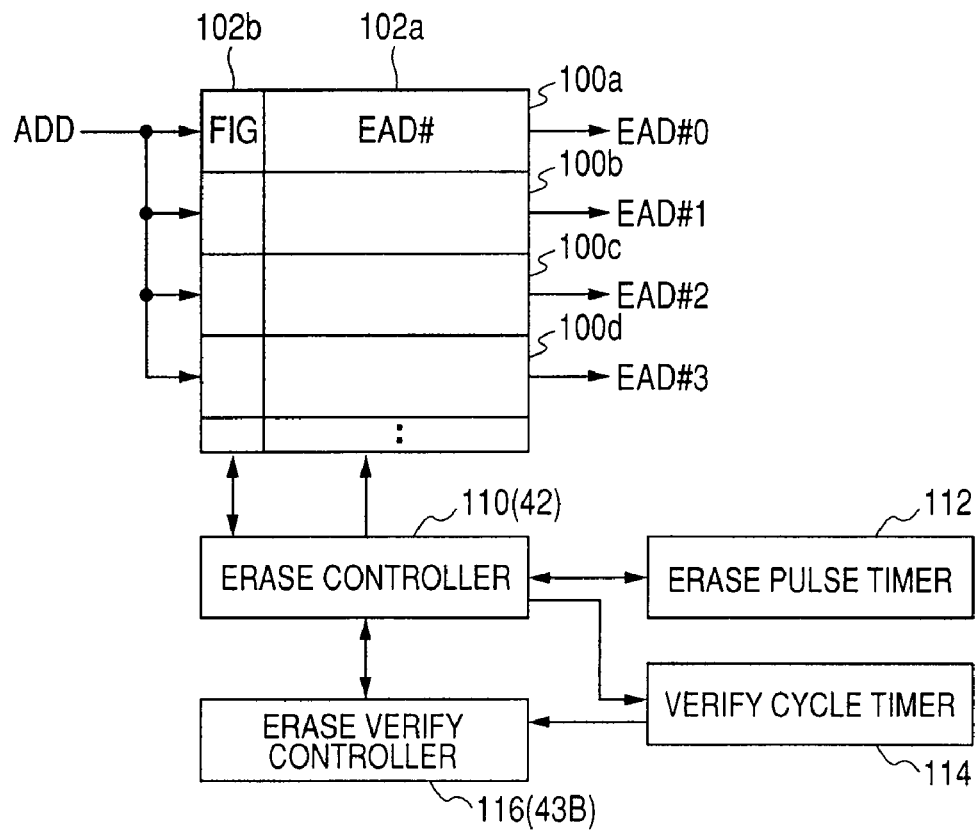
FIG. 44 is a diagram schematically showing a fragmentary configuration of a semiconductor device according to an eighth embodiment of the present invention.

FIG. 44 is a diagram schematically showing a fragmental configuration of a command register/control circuit of a semiconductor device according to an eighth embodiment of the present invention. In FIG. 44, the command register/control circuit includes a plurality of registers 100a through 100d provided in parallel, an erase pulse timer 112 and a verify cycle timer 114. An erase controller 110 corresponds to the erase controller 42 shown in FIG. 35, and an erase verify controller 116 corresponds to the erase verify controller 43B shown in FIG. 35. An entire configuration of the semiconductor device is identical to that of the semiconductor device shown in FIG. 36. Erasure is performed in memory block units, and erasure and data access can be performed on different memory blocks in parallel.

The registers 100a through 100d respectively include address storage fields 102a and flag storage fields 102b.

Erase addresses EAD# are sequentially stored in their corresponding different registers 100a through 100d each time an erase command is applied, and effective flags FLG are set thereto. It is possible to read stored contents in parallel from these registers 100a through 100d.

The erase pulse timer 112 defines a period of application of an erase pulse to each erase memory block. Each time a new erase address is supplied and a flag FLG is set, the erase pulse timer 112 resets its count value to an initial value and performs counting from the initial value again.

The verify cycle timer 114 performs a count operation from the start of a first count of the erase pulse timer 112 and gives instructions for a verify start in a predetermined cycle. Upon the application of an erase pulse voltage from the erase controller 110, the erase verify controller 116 performs erase verify on effective erase addresses stored in the registers 100a through 100d in accordance with the verify start instructions issued from the verify cycle timer 114. The corresponding flag FLG is reset to each erase memory block at which the erase verify has been completed, and the completion of erasure is shown thereat.

This erase completion instruction is supplied to the erase controller 110, where the corresponding flags FLG of the flag storage fields 102b in the registers 100a through 100d are reset. The erase controller 110 controls the set/reset of the flags and manages the storage and reading of the addresses into and from the registers 100a through 100d.

Figure 45:
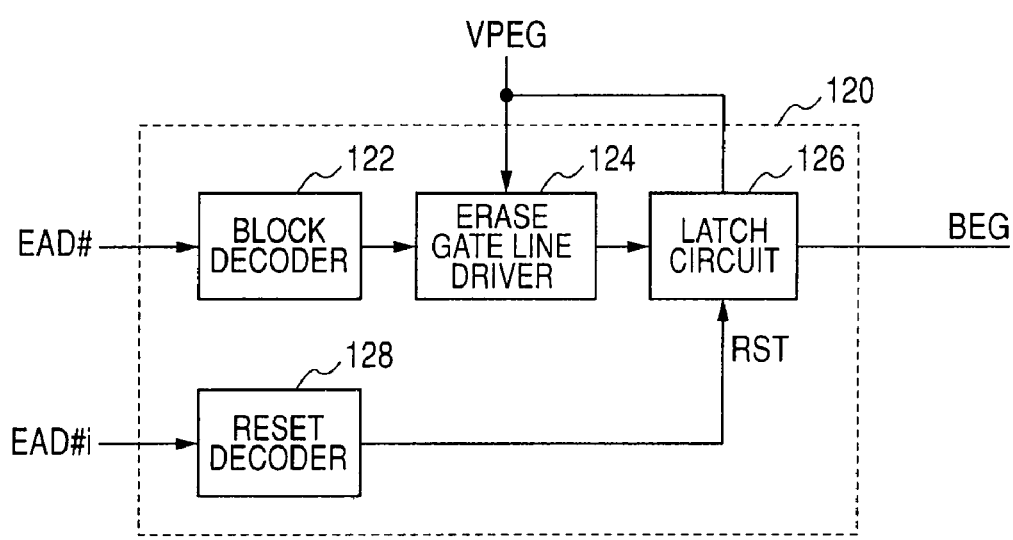
FIG. 45 is a diagram schematically illustrating a configuration of an EG control circuit of the semiconductor device according to the eighth embodiment of the present invention.

FIG. 45 is a diagram schematically showing a configuration of an erase gate line control circuit 120 included in an EG control circuit of the semiconductor device according to the eighth embodiment of the present invention. In FIG. 45, the erase gate line control circuit 120 includes a block decoder 122, an erase gate line driver 124, a latch circuit 126 and a reset decoder 128.

The block decoder 122 decodes each of the erase addresses EAD# stored in the registers 100a through 100d to generate a block selection signal for designating the corresponding memory block. The erase gate line driver 124 receives an erase high voltage VPEG therein and transfers the erase high voltage VPEG to a block embedded erase gate line BEG in accordance with the block selection signal supplied from the block decoder 122. The latch circuit 126 is provided corresponding to each memory block and latches therein the high voltage of the corresponding block embedded erase gate line BEG.

The reset decoder 128 decodes the erase-completed block address (erase address) EAD#i of the erase addresses EAD#0 through EAD#3 stored in the registers 100a through 100d and thereby supplies a reset signal RST to the latch circuit 126 provided for the corresponding memory block. The latch circuit 126 stops a latch operation in accordance with the assertion of the reset signal RST. Thus, at this time, the block embedded erase gate line BEG is maintained in a floating state or at a ground voltage level in accordance with the output signal of the erase gate line driver 124.

Thus, the block embedded erase gate line BEG can be driven to a selected state in memory block units. Erasure can be performed on a plurality of memory blocks in parallel. The reset decoder 128 asserts the reset signal RST only for the erase-completed memory block, thereby making it possible to stop an erase operation.

Figure 46:
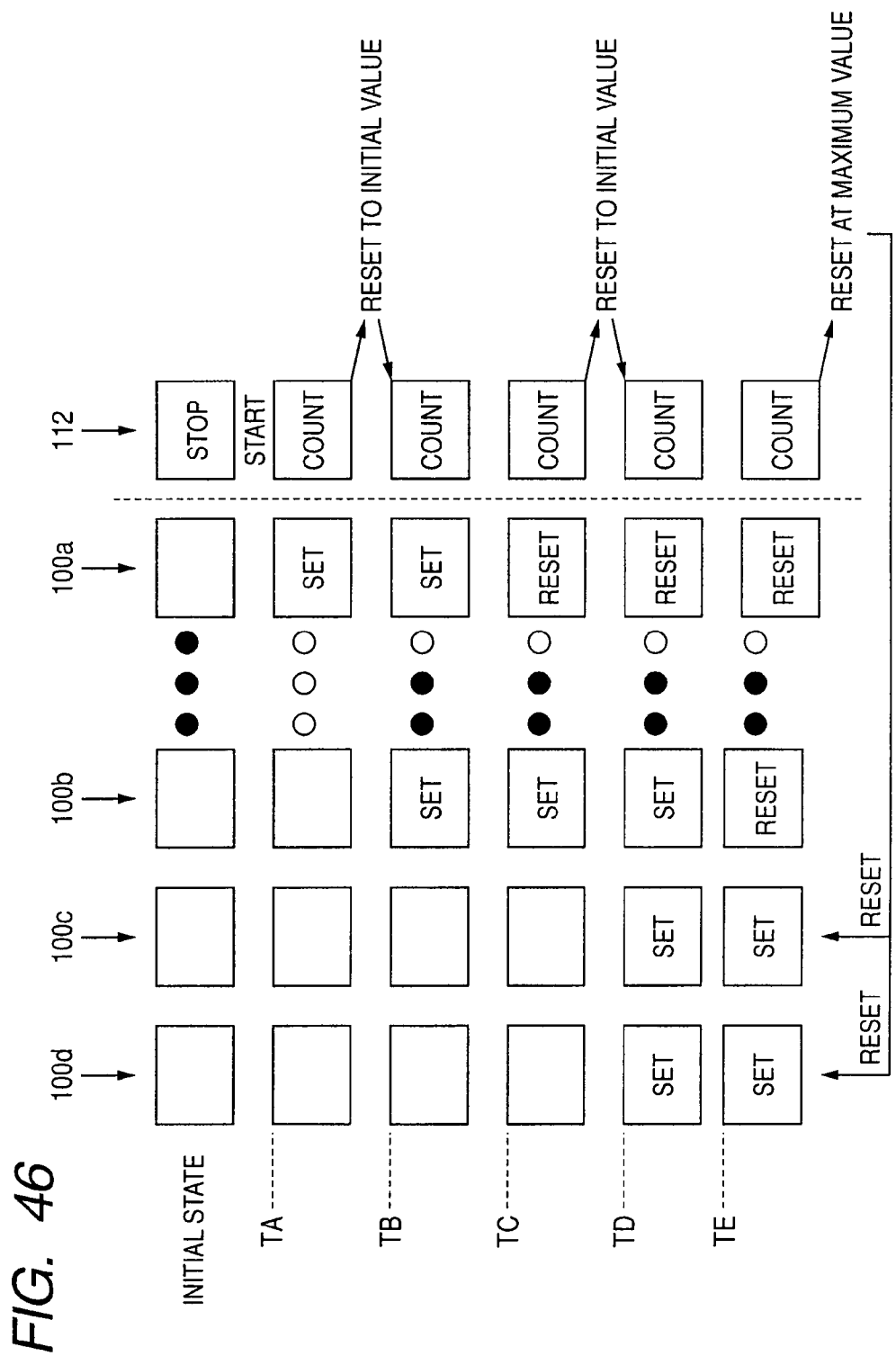
FIG. 46 is a diagram showing register control modes of the semiconductor device according to the eighth embodiment of the present invention.

FIG. 46 is a diagram schematically showing the stored contents of the registers of the semiconductor device according to the eighth embodiment of the present invention and control on the operation of the erase pulse timer 112. The operation of the command register/control circuit shown in FIG. 44 will be explained below with reference to FIG. 46.

In FIG. 46, the registers 100a through 100d are all placed in a reset state in an initial state, and the erase pulse timer 112 is also placed in an operation stop state.

When a background erase command is applied at a time TA, the register 100a is set and the corresponding erase address (EDA#) is stored. When a background erase mode is first instructed at the time TA, the erase pulse timer 112 starts counting. A count cycle erase operation of the erase pulse timer 112 is performed so that an erase pulse (erase high voltage) is applied to its corresponding block embedded erase gate line.

At a time TB, the background erase mode is instructed again, the register 100b is set and the corresponding erase address is stored. The erase pulse counter 112 is reset to an initial value in accordance with the second background erase mode instruction at the time TB and starts counting from the initial value again.

At a time TC, erasure on the corresponding memory block designated by the erase address stored in the register 100a is completed (result of erase verify). Correspondingly, the register 100a is reset (flag FLG is reset). Even at the time TC, the erase pulse timer 112 continues counting and erasure on the corresponding memory block designated by the erase address stored in the register 100b is carried out continuously.

At a time TD, a background erase command is applied, erase addresses are respectively stored in the registers 100c and 100d, and flags for the registers 100c and 100d are set. The erase pulse timer 112 is reset again by the setting of the registers 100c and 100d at the time TD, so that the erase pulse timer 112 starts counting again from its initial value.

At a time TE, the erasure of the memory block designated by the erase address stored in the register 100b is completed (by erase verify), and the register 100b is reset. At this time, erasure on the registers 100c and 100d has been performed, and the erase pulse timer 112 continues counting. When the count value of the erase pulse timer 112 reaches a predetermined maximum value, the erase pulse timer 112 stops the application of the erase pulse and resets the registers 100c and 100d.

As described above, the count value of the erase pulse timer 112 is reset to the initial value each time the new erase address is set. The erase pulse is applied until the count value reaches up to the maximum value. It is possible to perform the erasure on the plural memory blocks in parallel. When the count of the erase pulse timer 112 reaches the maximum value, the application of the erase voltage (pulse) is stopped to thereby make it possible to prevent the application of more high voltage than necessary to each memory cell, reduce current consumption and suppress degradation in insulating film.

Even though the erase high voltage is applied over a long period and the memory cell is brought to an over-erase state (memory transistor is brought to a depression state), the assist gate transistor (selection transistor) exists and hence no problem occurs.

Figure 47:
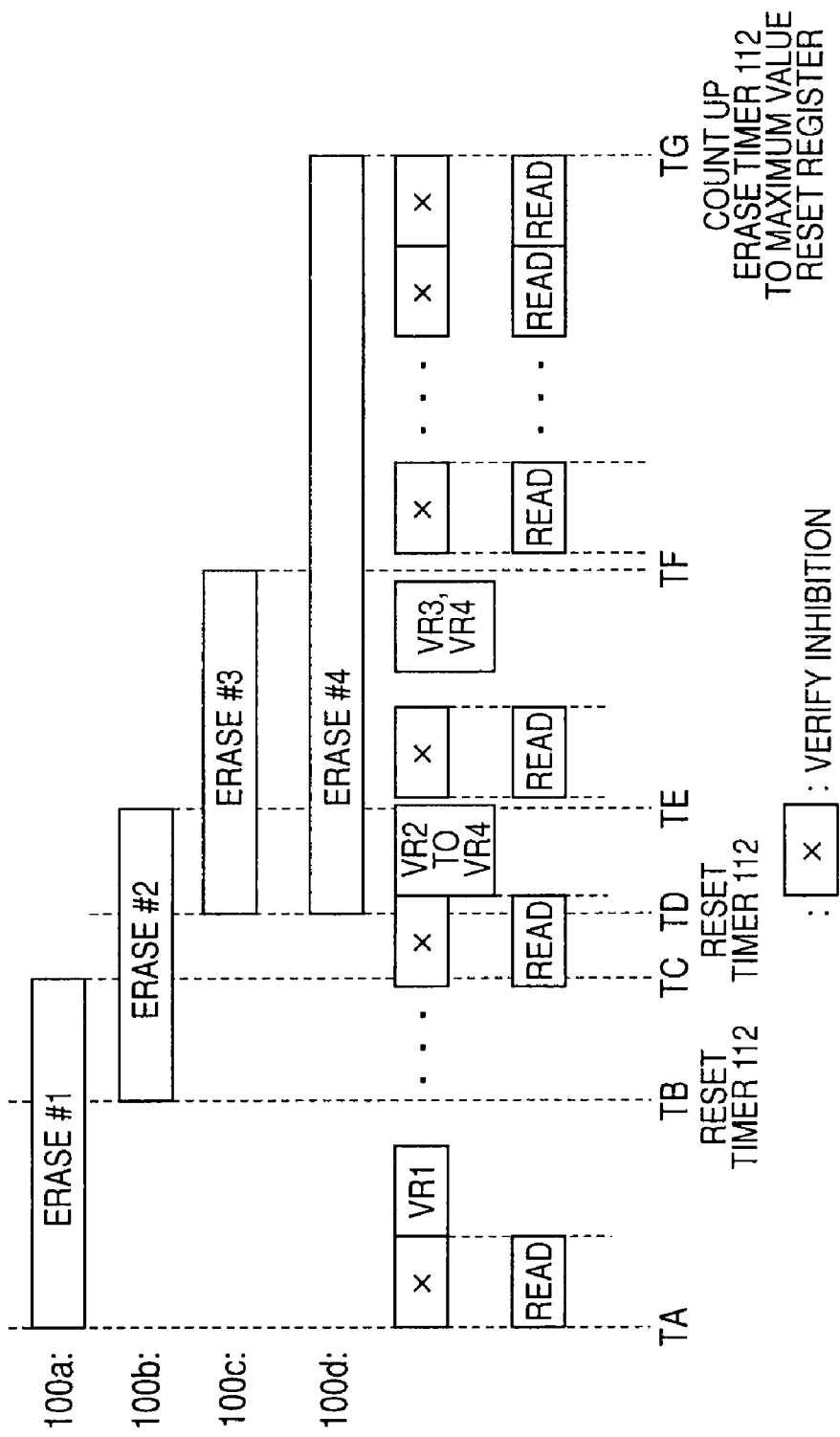
FIG. 47 is a diagram showing an operation sequence of the semiconductor device according to the eighth embodiment of the present invention.

FIG. 47 is a diagram showing one example of an operation sequence of external access performed upon the erase operation shown in FIG. 46. In FIG. 47, a read operation for performing data reading is shown by way of example as external data access. A serial erase operation mode of the semiconductor device according to the eighth embodiment of the present invention will be explained below with reference to FIG. 47.

At a time TA, an erase address is applied along with a background erase command, and the erase address is stored in the register 100a. An erase operation (#1) on a memory block designated by the erase address stored in the register 100a is executed. The timers 112 and 114 shown in FIG. 44 start counting respectively. At this time, data read access has been performed from the outside, and hence an erase verify operation cannot be executed. When the external data access (read access) is completed, the erase verify operation can be performed in accordance with the address stored in the register 100a.

At a time TB, a new background erase command is applied, an erase address is stored in the register 100b, and a flag for the register 100b is set. At the time TB, the erase pulse timer 112 is reset and performs counting from its initial value again. A memory block that the erase address of the register 100a indicates is determined to be erase-uncompleted at erase verify (VR1), and an erase pulse is applied again. Upon this verify, the verify operation may be carried out parallel with the application of the erase voltage.

Subsequently, the erase verify operation is executed in accordance with the count value of the verify cycle timer 114 during a period in which no external data read access is done.

At a time TC, the erasure of the corresponding memory block designated by the erase address stored in the register 100a is completed by the erase verify operation. At this time, read access is performed from outside, and hence the verify operation is inhibited.

At a time TD, erase addresses are stored in the registers 100c and 100d in accordance with an external background erase command, and these registers 100c and 100d are set. At this time TD, the erase pulse timer 112 is reset to continue counting from its initial value.

When the external data read access is completed, erase verify VR2 through VR4 for the erase addresses stored in the registers 100b through 100d are sequentially executed.

At a time TE, an erase operation (#2) on the memory block that the erase address stored in the register 100b indicates, is completed by the erase verify operation VR2. On the other hand, the erase addresses of the registers 100c and 100d are determined to be erase-uncompleted by the erase verify operation, and the erase pulse (erase high voltage) is applied continuously.

After the elapse of the time TE, external read access is carried out after the completion of the erase verify operation VR4. The erase verify is inhibited during the erase access. When no external read access exists, the erase verify operations (VR3 and VR4) for the memory blocks at the erase addresses stored in the registers 100c and 100d are executed.

At a time TF, the erase operation on the corresponding memory block designated by the erase address stored in the register 100c is completed by the erase verify operation VR3. Subsequently, each external data read access (read) is continuously carried out. An erase pulse (erase high voltage) is consecutively applied to the corresponding memory block designated by the erase address stored in the register 100d, and no erase verify operation is performed.

When the count value of the erase pulse timer 112 reaches a maximum value at a time TG, the application of the erase pulse is stopped and the address of the register 100d is reset so that the erase operation is stopped. An interruption of this erasure may be notified to the outside by a signal.

The erase verify operation is executed using the verify erase timer 114 shown in FIG. 44 during the period in which no external data access is done. Thus, the data access is consecutively performed from the outside and the internally-executed erase operation can be hidden from the outside, whereby the data access can be carried out easily.

The previous configuration shown in FIG. 35 is used as the configuration of the control circuit. Further, the power-off detection controller (94) and erase address load/save controller (96) shown in FIG. 40 are used. Thus, at power shut-down, the erased addresses stored in the registers 100a through 100d are saved into their corresponding specific regions of the memory array. Upon power recovery, they can be loaded into the registers 100*a* through 100*d* again.

Figure 48:
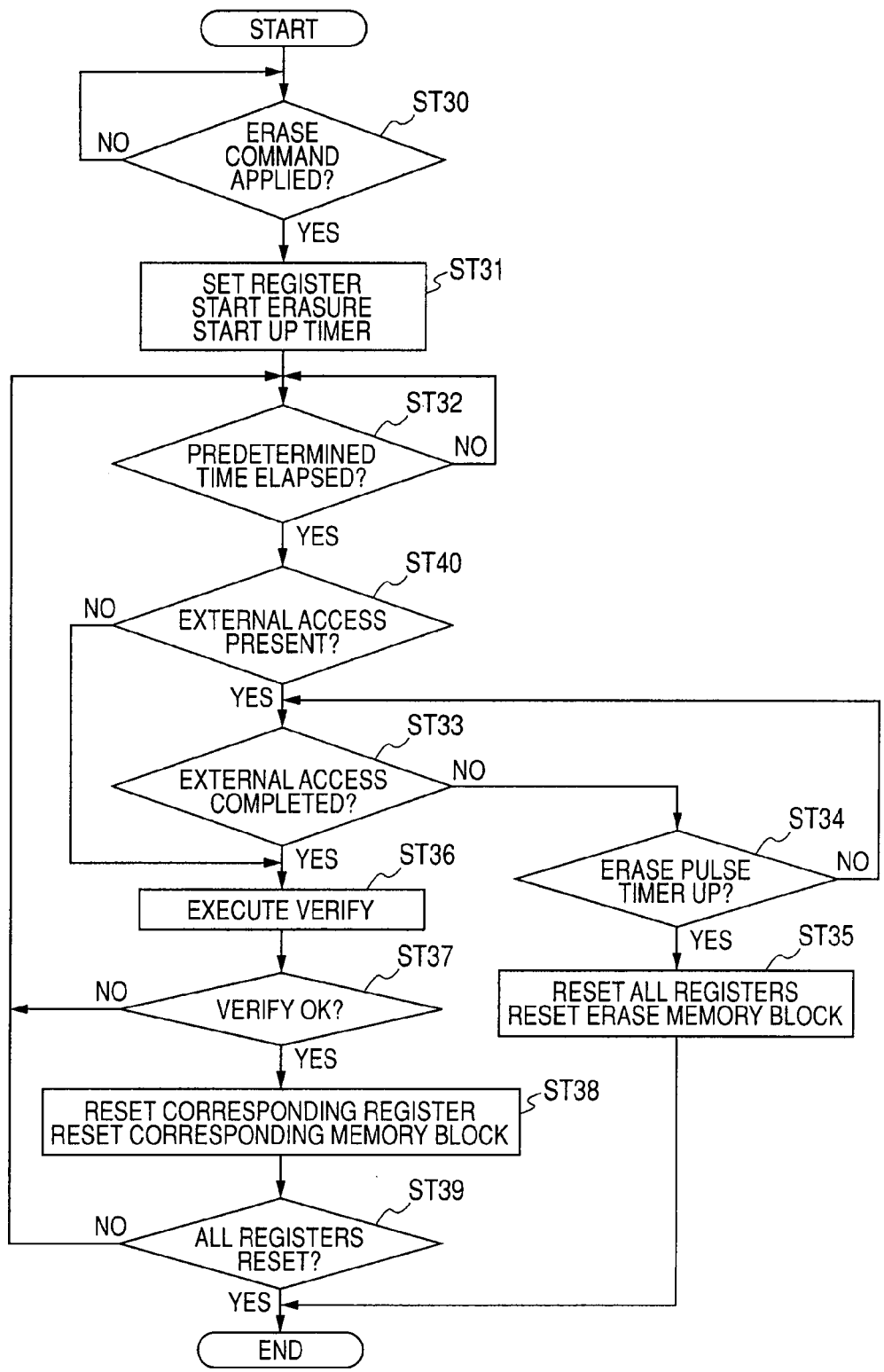
FIG. 48 is a flowchart illustrating an operation at erasure of the semiconductor device according to the eighth embodiment of the present invention.

FIG. 48 is a flowchart showing an operation of the command register/control circuit shown in FIG. 44. The operation of the command register/control circuit shown in FIG. 44 will be explained below with reference to FIG. 48. The command register/control circuit indicates a portion related to control on the erase operation of the command register/control circuit 24B (or 24A).

The command register/control circuit waits for the application of an erase command (Step ST30). When the erase command is applied, the erase controller 110 stores the applied address in an erase register and sets a flag FLG. The erase controller 110 sets the erase pulse timer 112 to an initial value in accordance with the application of the erase command and drives the erase pulse timer 112. When the erase command is first given, the erase controller 110 starts up the verify cycle timer 114. The erase controller 110 supplies an erase address (EAD#) to the block decoder 122 of the EG line control circuit 120 shown in FIG. 45 and performs an erase operation relative to a designated memory block (Step ST31).

After the erase operation is started, the erase verify controller 116 is enabled by the erase controller 110 and waits for the count value of the verify cycle timer 24 to reach a predetermined value (Step ST32).

When the count value of the verify cycle timer 114 shown in FIG. 44 reaches the predetermined value and the verify operation is carried out, the erase controller 110 first identifies whether external access exists (Step ST40). This is discriminated based on whether a write operation mode instruction signal WRITE or a read operation mode instruction signal RAD is asserted, in a manner similar to the operation of the control circuit shown in FIG. 35.

When the external access exists, it is discriminated whether the external access has been completed (Step ST33). If the external access is executed consecutively without being completed, then the erase controller 10 causes the erase verify controller 116 to wait for its verify start and identifies whether the count value of the erase pulse timer 112 has reached a maximum value (Step ST34). When the erase pulse timer 112 is not yet counted up, the erase controller 110 returns to Step ST33, where it waits for the completion of the external access. On the other hand, when the erase pulse timer 112 has completed its count-up at Step ST34, the erase controller 110 resets all the registers 100*a* through 100*d* and resets the flags FLG as well (Step ST35). Consequently, the erase operation is completed.

When the external access does not exist at Step ST40 or the external access has completed at Step ST33, the erase controller 110 enables the erase verify controller 116. The erase addresses to which the effective flags stored in the registers 100*a* through 100*d* are set are sequentially read out. Memory cells in each memory block are sequentially read out in accordance with the verify address from the verify counter (refer to FIG. 35) at the erase memory block to execute the erase verify operation. At this time, the voltage generator selects a verify voltage necessary for erase verify and supplies it to the corresponding row and column decoders (column decoder contained in the column selection gate circuit), thereby executing the reading of memory cell data. As one example, the verify counter holds the read erase address as a block address and sequentially generates each address in the memory block in accordance with its count value. It is thus possible to generate the block address and memory cell address for the erase memory block.

The erase verify controller 116 monitors the logic value of the read data and identifies whether data stored in all memory cells are in an erase state. Further, the erase verify controller 116 identifies in accordance with the result of identification whether the corresponding memory blocks are in an erase state (Step ST37). When the corresponding memory blocks are not all yet placed in the erase state, the erase verify controller 116 notifies erase continuation to the erase controller 110. The erase controller 110 returns to Step ST32 and waits for the completion of a predetermined verify cycle in accordance with the count value of the verify cycle counter 114.

On the other hand, when it is identified that all the memory cells are in the erase state upon the erase verify at Step ST37, the erase controller 110 resets the corresponding register of the registers 100*a* through 100*d*. Further, the erase controller 110 supplies the corresponding erase address EAD#i to the reset decoder 128 shown in FIG. 45 and thereby resets an erase high voltage for each corresponding memory block (Step ST39).

When the registers 100*a* through 100*d* are all in the reset state (Step ST39), the erase controller 110 completes the erase operation. On the other hand, when all the registers are not placed in the reset state, the erase controller 110 returns to Step ST32 again, where the erase controller 110 generates an erase high voltage consecutively while monitoring the count value of the erase pulse timer 112 and supplies it to the EG line control circuit 120.

Using the command register/control circuit shown in FIG. 44, more specifically, the control circuit shown in FIG. 35 and the power-off detection controller and erase address load/save controller shown in FIG. 40 in the above-described manner makes it possible to perform the erase operation on the plural memory blocks in parallel and store the erase addresses stored in the registers thereof in their corresponding specific memory regions at power shutdown.

As the operation of saving and loading the contents of the registers 100*a* through 100*d* at power shutdown, operation control similar to the flowchart shown in FIG. 43 is executed by the erase address load/save controller.

According to the eighth embodiment of the present invention as described above, the erase operation is carried out on the plural memory blocks in parallel, and priority is given to the external access. It is thus possible to perfectly hide the internally-executed erase operation from the outside and make it easy to control the data access.

Ninth Embodiment

Figure 49:
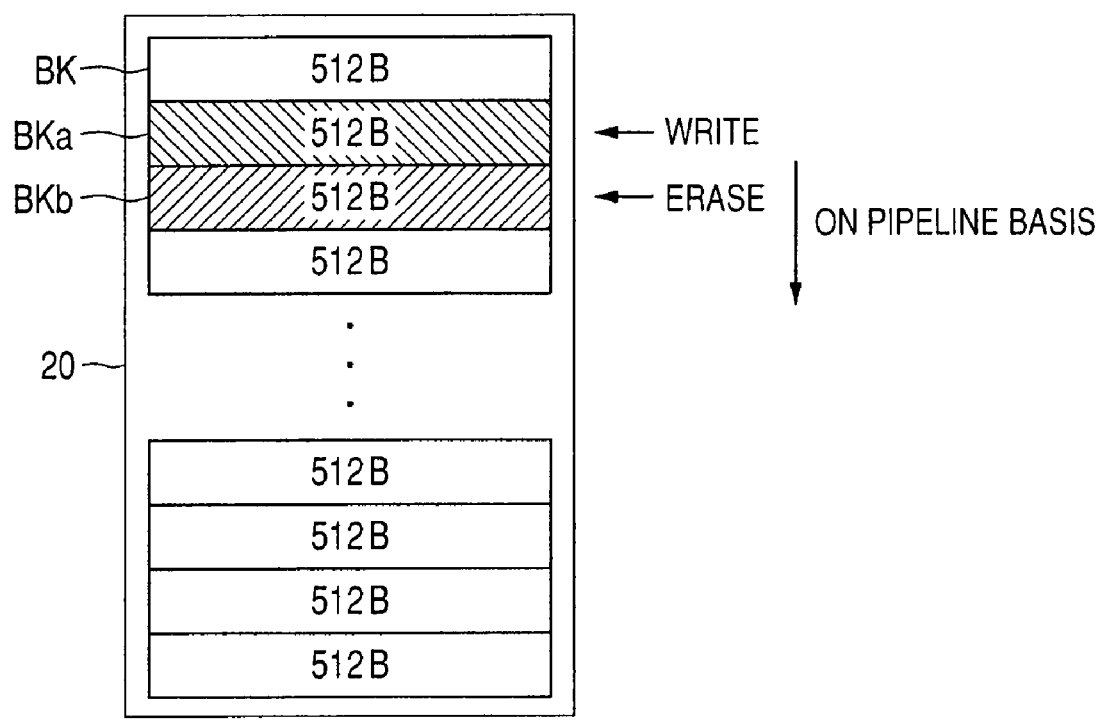
FIG. 49 is a diagram schematically depicting a configuration of a memory array of a semiconductor device according to a ninth embodiment of the present invention.

FIG. 49 is a diagram schematically showing access modes to memory blocks of a semiconductor device according to a ninth embodiment of the present invention. At a memory array 20 in FIG. 49, writing and erasure are performed on a plurality of different memory blocks in parallel on a pipeline basis.

When erasure is now being performed on a memory block BKb, writing is executed on a memory block BKa in parallel with it. When a write instruction is next given after the completion of the erasure on the memory block BKb, writing is performed on the memory block BKb in parallel with the erase operation for the next memory block BKAa. Namely, the writing is executed on the memory block on which erasure is always performed.

Figure 50:
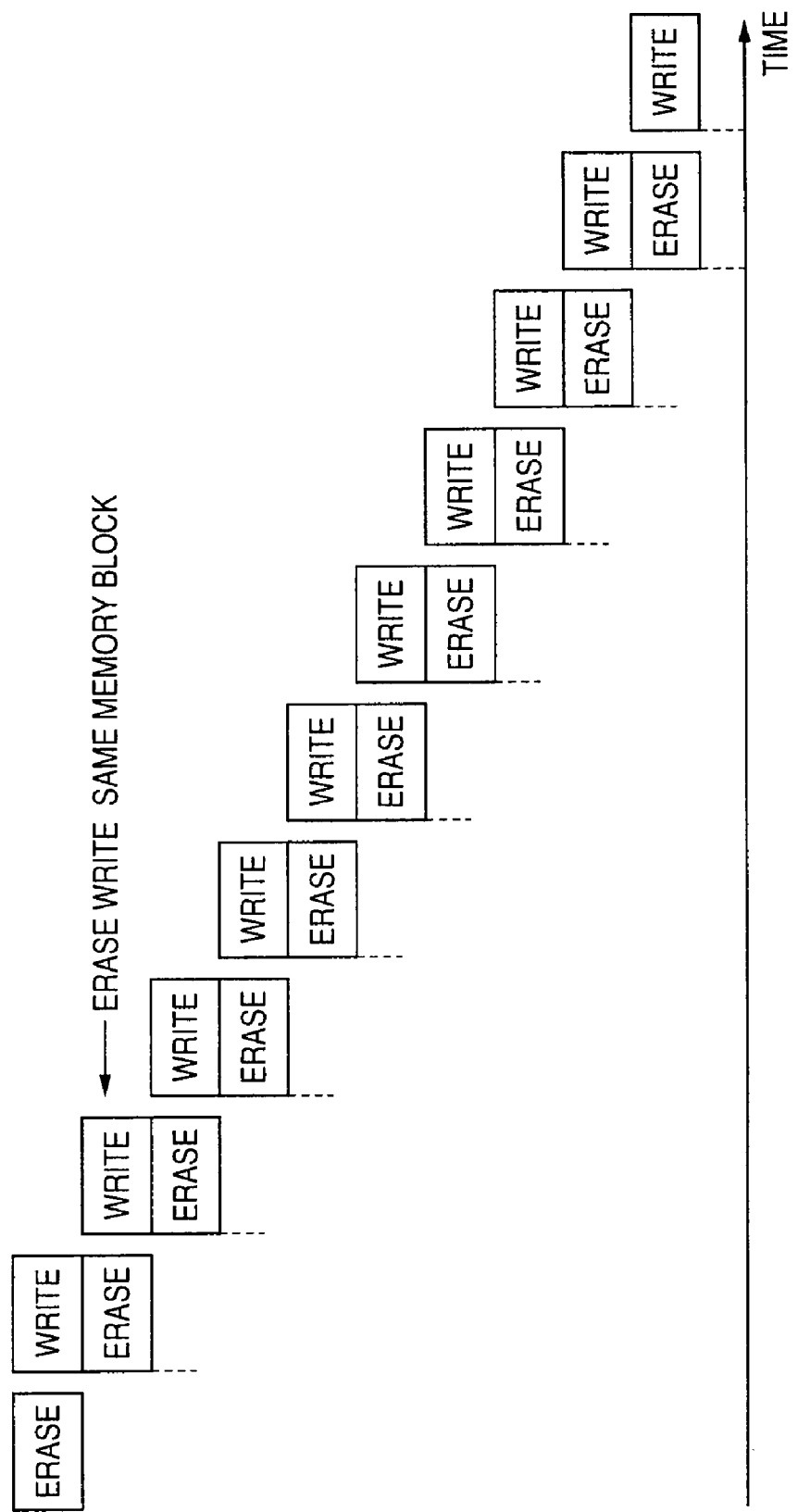
FIG. 50 is a diagram showing a write and erase operation sequence of the semiconductor device according to the ninth embodiment of the present invention.

FIG. 50 is a diagram showing one example of an access sequence of the semiconductor device according to the ninth embodiment of the present invention. In FIG. 50, memory blocks arranged in line in the horizontal direction indicate the same memory blocks.

In FIG. 50, erasure is first performed on one memory block. Then, a command (or mere write command) for performing writing and erasure simultaneously is applied. Erasure and writing are executed on different memory blocks in parallel. Subsequently, writing is performed on the post-erasure memory blocks in the plural memory blocks.

The writing and erasure are executed on a pipeline basis. Since the writing is performed on the corresponding erase memory blocks, data can be written at high speed. Particularly when large volumes of data such as firmware are rewritten at one time, their rewriting can be performed at high speed. It is also possible to perform the saving of data from an SRAM (Static Random Access Memory) at high speed.

Incidentally, the verify operation is executed upon writing and erasure in the operation sequence shown in FIG. 50. This verify needs to cause write verify and erase verify to be executed at different timings, i.e., in different times.

Figure 51:
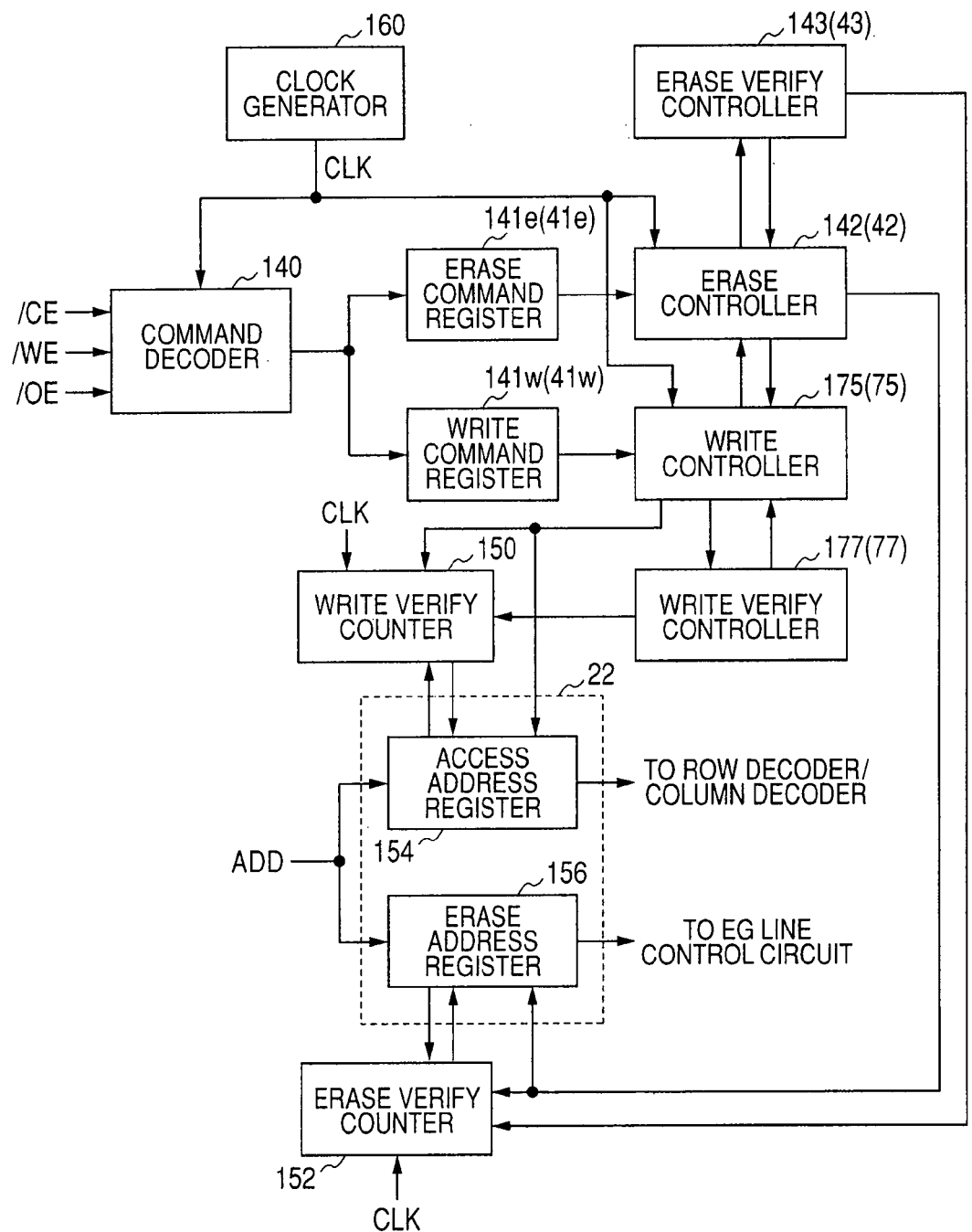
FIG. 51 is a diagram schematically illustrating a configuration of a command register/control circuit of the semiconductor device according to the ninth embodiment of the present invention.

FIG. 51 is a diagram schematically showing a configuration of a command register/control circuit 24 of the semiconductor device according to the ninth embodiment of the present invention. An overall configuration of the semiconductor device according to the ninth embodiment of the present invention is the same as the configuration of the semiconductor device shown in FIG. 23.

In FIG. 51, the command register/control circuit 24 is provided with a command decoder 140, an erase command register 141*e* and a write command register 141*w*, an erase controller 142, a write controller 175, an erase verify controller 143 and a write verify controller 177.

When external control signals /CE, /WE and /OE designate a given operation mode in sync with an internal clock signal CLK outputted from a clock generator 160, the command decoder 140 decodes each of commands given from an address ADD and data DQ and supplies the result of decoding to either of the erase command register 141*e* and the write command register 141*w* according to the result of decoding.

The erase command register 141*e* corresponds to the erase command register 41*e* shown in FIG. 28 and stores therein the post-decoding erase command issued from the command decoder 140. The write command register 141*w* corresponds to the write command register 41*w* shown in FIG. 28 and stores therein the post-decoding write command issued from the command decoder 140.

The erase controller 142 corresponds to the erase controller 42 shown in FIG. 28 and controls an operation necessary for erasure in accordance with the erase command stored in the erase command register 141*e*. The erase verify controller 143 corresponds to the erase verify controller 43 shown in FIG. 28. Upon the application of an erase voltage from the erase controller 142 is applied, the erase verify controller 143 controls an erase verify operation in a predetermined sequence. Upon the completion of erase verify, the erase verify controller 143 causes the erase controller 142 to stop the operation of application of the erase voltage.

The write controller 175 corresponds to the write controller 75 shown in FIG. 28 and controls a write operation in accordance with the write command stored in the write command register 141*w*.

The write verify controller 177 corresponds to the write verify controller 77 shown in FIG. 28. The write verify controller 177 is enabled in accordance with a write completion instruction issued from the write controller 176 to control a write verify operation. The write verify controller 177 includes a write data register which holds write data therein. When the write verify controller 177 accurately detects by write verify that the writing of data into each memory cell is performed, the write verify controller 177 allows the write controller 175 to stop the write operation.

The command register/control circuit 24 shown in FIG. 51 is further provided with a write verify counter 150 and an erase verify counter 152. An access address register 154 and an erase address register 156 are provided within an address register 22.

The access address register 154 stores therein an external address signal ADD as an access address under the control of the write controller 175. In order to perform verify with the write address stored in the access address register 154 as a leading address upon data writing, the write controller 175 stores therein it as an initial value of the write verify counter 150. Here, the writing is assumed to be an access sequence executed on continuous addresses.

The write verify counter 150 sequentially updates write verify counts in sync with the clock signal CLK under the control of the write verify controller 177 and thereby generates write verify addresses, followed by being supplied to the access address register 154. Thus, each verify address stored in the access address register 154 is supplied to unillustrated row and column decoders, where the selection of each memory cell and data reading are carried out.

The erase address register 156 stores the address signal ADD as an erase address in accordance with an instruction issued from the erase controller 142 and stores the stored erase address in the erase verify counter 152 as a count initial value. The erase address designates a memory block and is stored as a verify block address at a high-order bit position of the erase verify counter. Memory cells in the memory block are sequentially designated by a count operation.

The erase verify counter 152 stores the corresponding address stored in the erase address register 156 as a leading value under the control of the erase controller 142. Further, the erase verify counter 152 updates a count value thereof in sync with the internal clock signal CLK upon erase verify under the control of the erase verify controller 143. The erase address stored in the erase address register 156 is supplied to an EG line control circuit from which an erase high voltage is applied to a block embedded erase gate line (BEG) for each memory block with the erase high voltage being applied thereto.

Incidentally, the command register/control circuit 24 shown in FIG. 51 is provided with a read controller 54(A) in a manner similar to the configuration shown in FIG. 28. The count values of the verify counters are supplied to their corresponding decoders via a multiplexer under the control of the erase verify controller 143 and the write verify controller 177, so that verify reading is carried out.

In the configuration of the command register/control circuit 24 shown in FIG. 51, the write controller 175 and the erase controller 142 respectively stop the next write and ease operations until the erase verify and the write verify are completed. When the erase verify and the write verify are completed, the erase controller 142 and the write controller 175 respectively store externally-supplied addresses into the access address register 154 and the erase address register 156 and execute erasure and writing in parallel in sync with the clock signal CLK.

Incidentally, predetermined erase and write times are defined in the data access in this pipeline mode. An external device applies erase and write commands at predetermined intervals and applies erase and write addresses.

The access address register 150 and the erase address register 156 may comprise a plurality of registers and read the stored addresses thereof in FIFO manner. In this case, after the erase verify and the write verify are both completed internally, the stored value of the address register (FIFO) is updated and erasure and writing on the next memory block are executed.

Further, after the completion of the writing and erasure, the corresponding address stored in the erase address register 156 is transferred to the write address register 154. When the write address is given from the outside, it is stored in the erase address register 156. The erasure and writing may be executed in this condition. In this case, data writing also needs to be executed in memory block units from the leading address in each block.

According to the ninth embodiment of the present invention as described above, the writing and erasure are carried out in parallel in the pipeline manner. Data such as large volumes of firmware can be rewritten at high speed.

At the time of writing, the writing into each memory block in which the erasure has been completed has been carried out. There is no need to perform erasure on the corresponding memory block before writing. High-speed data writing is implemented.

[First Modification]

Figure 52:
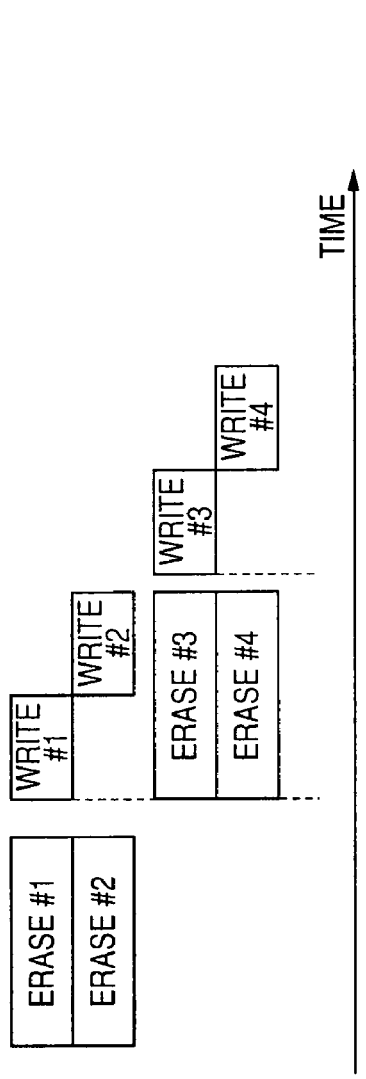
FIG. 52 is a diagram showing an operation sequence at the control of the semiconductor device according to the ninth embodiment of the present invention.

FIG. 52 is a diagram showing a modification of an access sequence employed in the semiconductor device according to the ninth embodiment of the present invention. In the access sequence shown in FIG. 52, erasure is performed on two memory blocks in parallel. In parallel with this erasure, writing is performed on the post-erasure memory blocks for every memory block. Namely, erasure is performed on memory blocks #1 and #2 in parallel in FIG. 52. In the next cycle, erasure is performed on memory blocks #3 and #4. In parallel with this erasure, writing is sequentially performed on the memory blocks #1 and #2. In the next cycle, writing is sequentially performed on the memory blocks #3 and #4 subjected to the erasure. The erasure and writing are executed on a pipeline basis.

With the execution of the erasure in plural block units, the erase time can be shortened and writing can be performed at high speed. When the amount of data to be written is small, writing is completed in times shorter than the erase time at which the entire memory blocks are erased. Thus, when the amount of data to be written is small, data writing can sequentially be performed on a plurality of memory blocks within one erase cycle.

Figure 53:
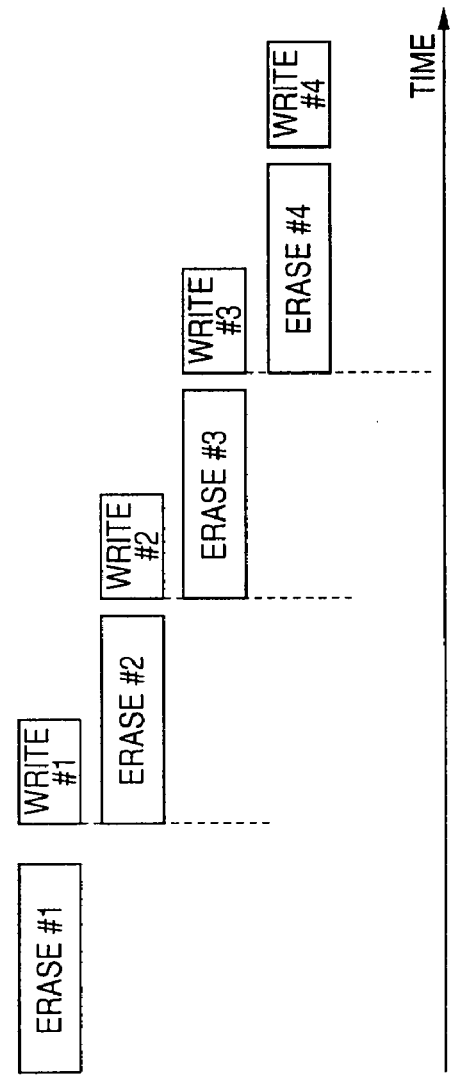
FIG. 53 is a diagram showing a modification of the operation sequence at the erasure of the semiconductor device according to the ninth embodiment of the present invention.

FIG. 53 is a diagram showing another access sequence of the first modification. In the access sequence shown in FIG. 53, erasure is performed every memory block and writing is performed parallel with the respective erasure. Namely, when erasure is performed on memory blocks #1 to #4, . . . , the writing of data to the memory blocks #1 to #4 is sequentially executed on a pipeline basis in parallel with the erasure from the next cycle subsequent to the elapse of a first erase cycle.

In the case of the access sequence shown in FIG. 53, the time necessary for writing is shorter than the time necessary for erasure. When, however, the amount of data to be written is large, it is possible to write data with sufficient time within an erase cycle.

As shown in FIGS. 52 and 53, the time necessary for writing can be changed according to the amount of data to be written, by changing the erase memory block units. The erase and write times can be optimized according to the amount of data to be written in parallel with the erase memory block.

As the configuration of the command register/control circuit according to the above modification, the configuration shown in FIG. 51 can be utilized. A command for setting each erase unit block is supplied from the command decoder 140 to the erase controller 142. The erase controller 142 sets degeneracy/validity of the least significant bit of a block address for specifying each memory block, stored in the erase address register 156 according to a given erase unit block specifying instruction (instruction for specifying the number of memory blocks for erase units). Erasure can be performed on two memory blocks in parallel by degenerating the least significant bit of the address. One memory block is specified by making the least significant bit effective, and erasure is executed on the so-specified one memory block.

Depending on the number of memory blocks corresponding to the erase units of the memory blocks, the erase controller 142 adjusts the time of the erase pulse timer which defines an internally-contained erase pulse application time. The external device executes write access in a write cycle (clock cycle) set according to the set number of erase block units. Here, the term "clock cycle" indicates the number of cycles of a clock signal which defines a pipeline access cycle.

The write controller 175 is not also particularly required to make a change in write cycle according to the set number of erase memory blocks (erase units) and a change/setting of a write verify period. Write verify is executed in accordance with an external data write completion instruction. When write data are held in all registers for a write data register for verify, writing is executed and the write verify is then carried out. As described in the fifth embodiment at this time, the signals RYIBY_ER and RYIBY_RW each indicative of the internal status may be outputted to the outside to make an access adjustment.

The access address register 154 shown in FIG. 51 may be configured by FIFO instead of the above. Two write memory block addresses may be successively stored so that writing is sequentially executed under the control of the write controller 175. The write verify controller 177 shown in FIG. 51 is provided with a register which stores write data for performing the write verify. This register is provided in plural form, and write data may sequentially be stored into the respective write memory blocks such that data writing and verify are performed.

According to the ninth embodiment of the present invention as described above, the erasure and writing are executed in pipeline form and hence high-speed data writing can be realized. The optimum erase cycle time can be set according to the amount of write data by making it possible to change the number of memory blocks corresponding to the erase units.

Tenth Embodiment

Figure 54:
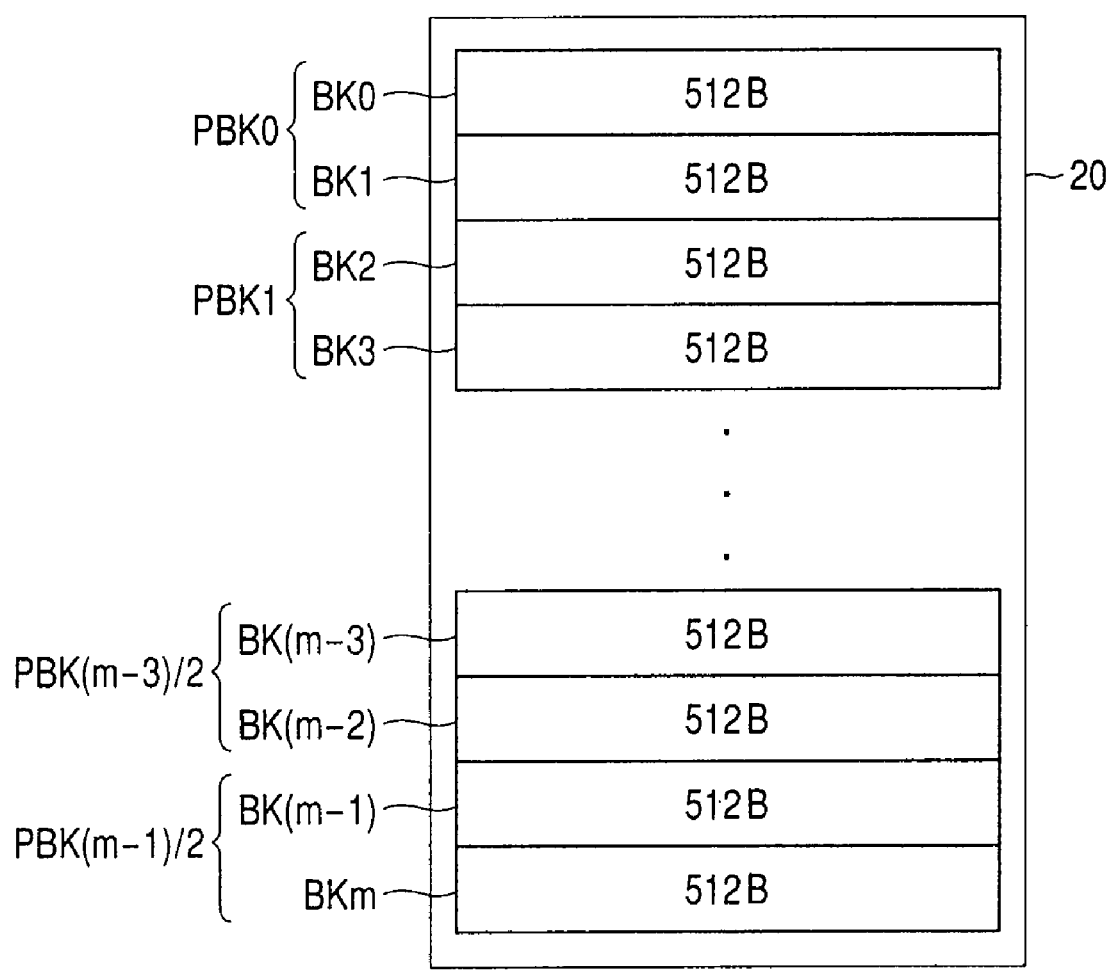
FIG. 54 is a diagram schematically showing a block configuration of a memory array of a semiconductor device according to a tenth embodiment of the present invention.

FIG. 54 is a diagram schematically showing a configuration of a memory mat (array) of a semiconductor device according to a tenth embodiment of the present invention. In FIG. 54, the memory array (memory mat) 20 is divided into a plurality of memory blocks BK0 through BKm having a storage capacity of 52 B (Bytes) as one example. At these memory blocks BK0 through BKm, one memory block pair PBK is configured by the two memory blocks. Namely, memory blocks BKi and BK (i+1) configure a memory block pair PBK (i/2). Here, i is any of 0 to m. Although each memory block pair is illustrated so as be configured by the adjacent memory blocks in FIG. 54, the paired memory blocks may be memory blocks placed away from each other. They are divided into, for example, an upper-half memory block area and a lower-half memory block area. Each memory block area PBK may be formed by memory blocks placed in the same position at each of the upper-half memory block area and the lower-half memory block area.

Figure 55:
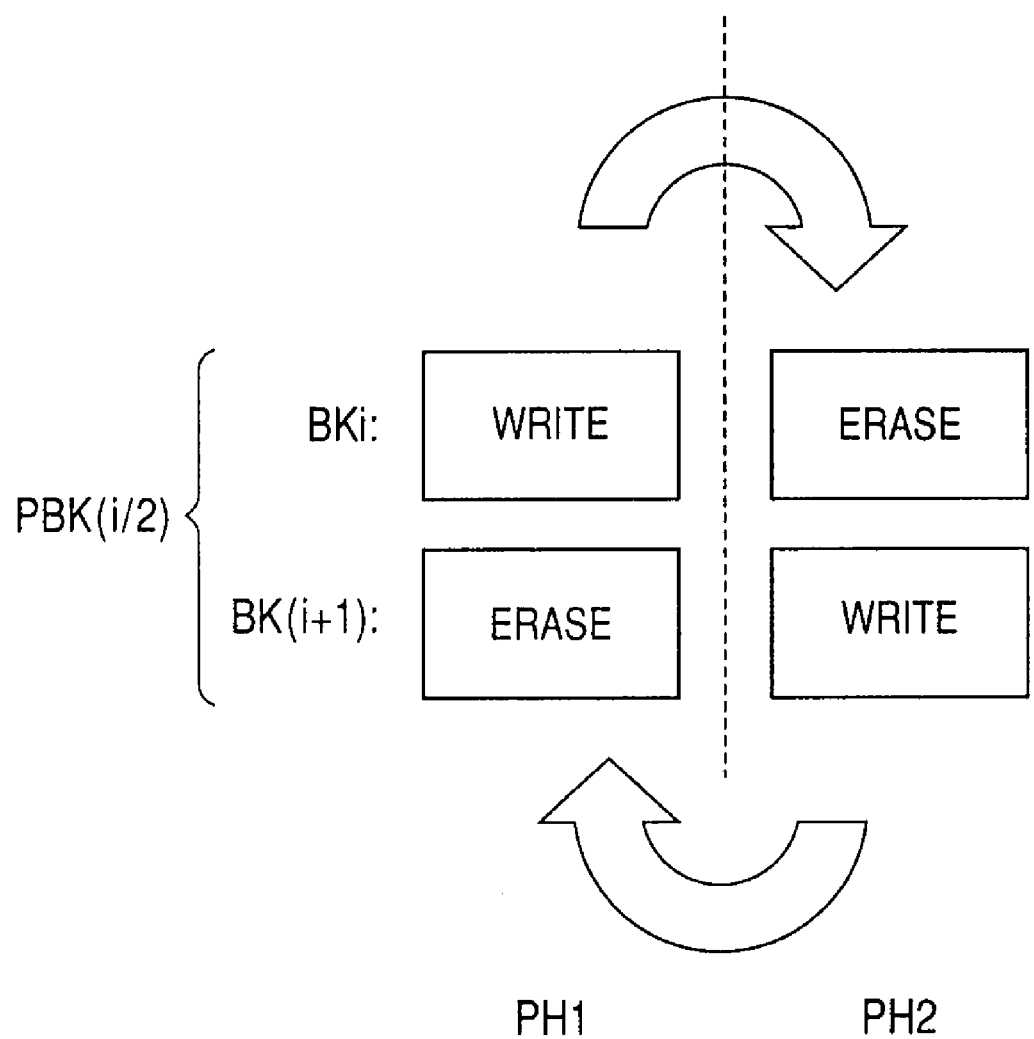
FIG. 55 is a diagram illustrating an access sequence to memory blocks shown in FIG. 54.

FIG. 55 is a diagram schematically showing a write operation at data access in the semiconductor device according to the tenth embodiment of the present invention. A write sequence for the memory blocks BKi and BK (i+1) in the memory block pair PBK (i/2) is shown in FIG. 55 by way of example.

When a write command for designating data writing is applied from outside, the writing of data to the memory block BKi is performed at a phase PH1, and erasure is performed on the memory block BK (i+1) in parallel. On the other hand, when data write access to the memory block pair PBK (i/2) is required at the next phase PH2 subsequent to the phase PH1, data is written into the memory block BK (i+1) placed in an erase state, and erasure on the previously data-written memory block BKi is executed in parallel with it. Data reading is performed on the corresponding memory block subjected to writing.

As shown in FIG. 55, the writing and erasure are alternately performed on the memory blocks BKi and BK (i+1) at the memory block pair PBK (i/2), thereby making it possible to execute high-speed data writing with no erase operation on each write memory block within a write cycle. Thus, for example, data at power shutdown can be saved into the semiconductor device at high speed, and applications or instructions stored in a volatile memory such as an SRAM (Static Random Access Memory) can be saved into the semiconductor device at high speed (this is because the writing is always performed on each memory block placed in the erase state in the present embodiment).

Figure 56:
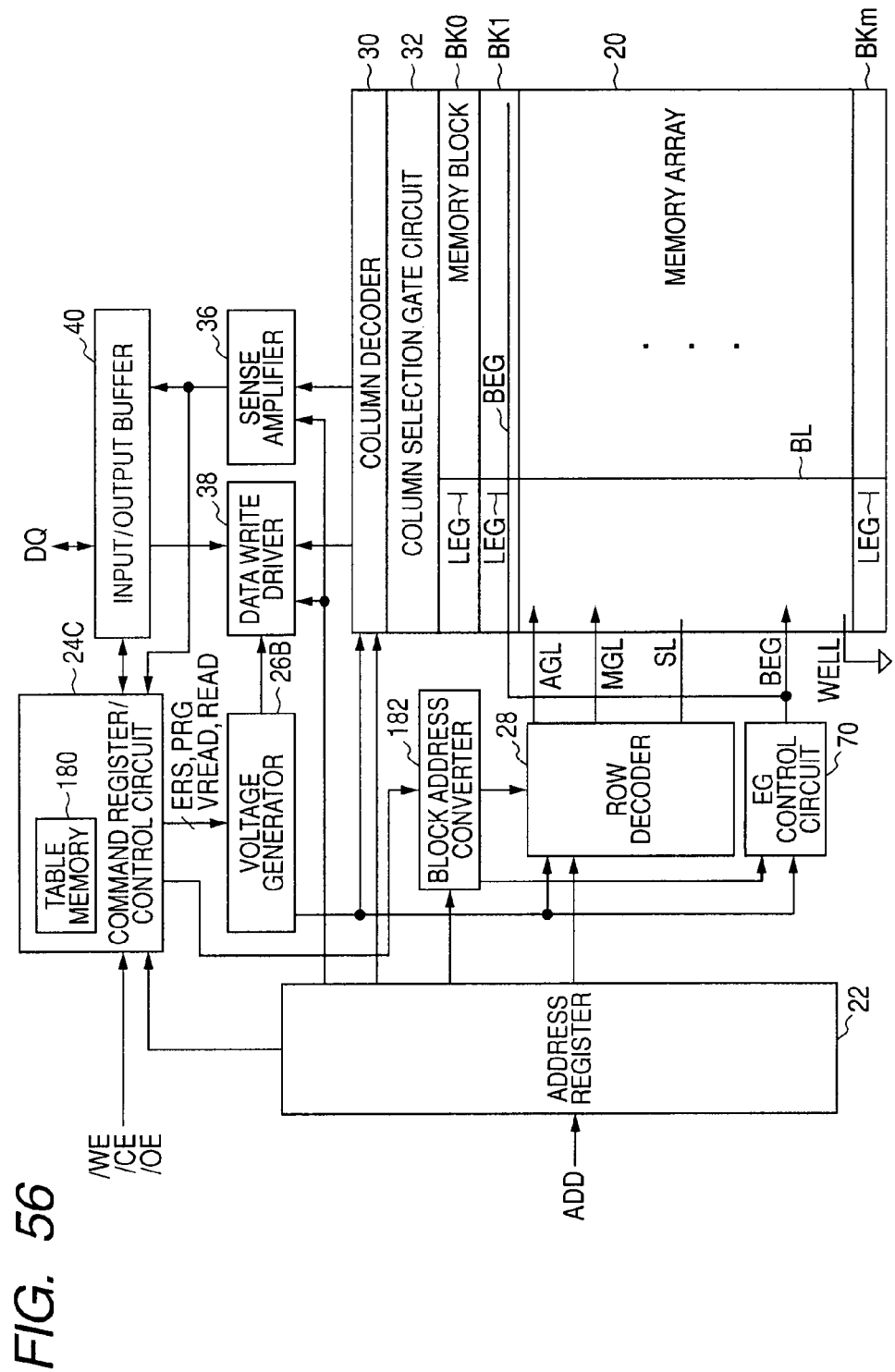
FIG. 56 is a diagram schematically depicting an overall configuration of the semiconductor device according to the tenth embodiment of the present invention.

FIG. 56 is a diagram schematically showing an overall configuration of the semiconductor device according to the tenth embodiment of the present invention. The semiconductor device shown in FIG. 56 is different in configuration from the semiconductor device shown in FIG. 23 in the following points. Namely, a command register/control circuit 24C is provided with a table memory 180 which stores therein flags each indicative of a phase of each memory block pair. There is also provided a block address converter 182 which sets a transfer path of each block address in accordance with the result of reference to the table memory 180. The block address issued from the block address converter 182 is supplied to each of a row decoder 28 and an EG control circuit 70.

The semiconductor device shown in FIG. 56 is identical in other configuration to the semiconductor device shown in FIG. 23. The same reference numerals are attached to their corresponding portions, and their detailed explanations are omitted.

Incidentally, a column decoder 30 is shown in FIG. 56 so as to be disposed adjacent to a column selection gate circuit 32. The column decoder 30 and the column section gate circuit 32 are identical in layout configuration to the column decoder 30 and column selection gate circuit 32 shown in FIG. 23. The memory array 20 is surrounded by the row decoder 28 and the column decoder 30 and is referred to as "memory mat".

Figure 57:
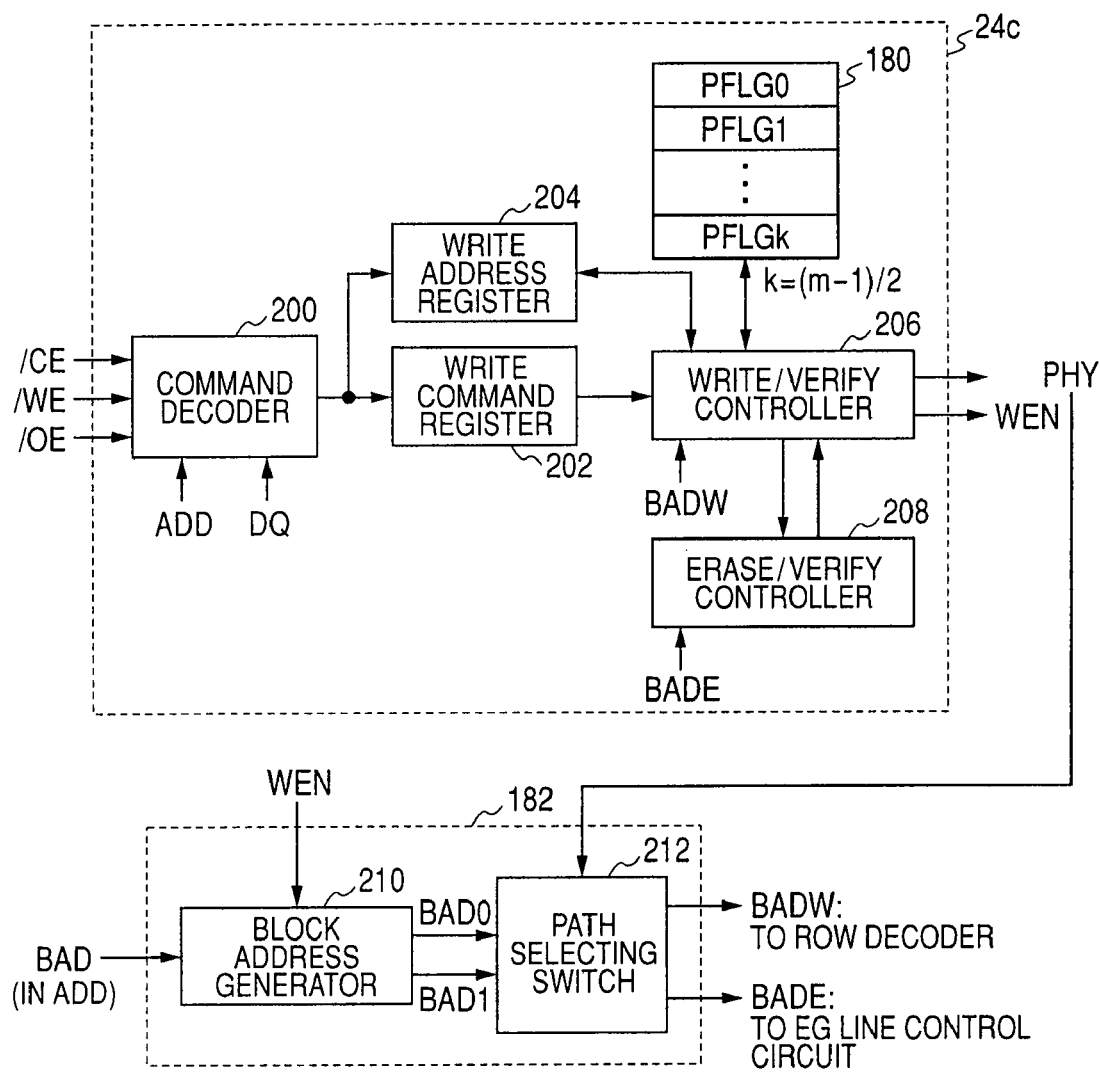
FIG. 57 is a diagram schematically showing a configuration of a command register/control circuit and a clock address converter of the semiconductor device shown in FIG. 56.

FIG. 57 is a diagram schematically showing one example of a configuration of the command register/control circuit 24C and the block address converter 182 shown in FIG. 56. In FIG. 57, the command register/control circuit 24C includes a command decoder 200 which decodes a command given from each row, a write command register 202 which stores therein a write command issued from the command decoder 200, a write address register 204 which stores therein a write address given via the command decoder 200, a write/verify controller 206 and an erase/verify controller 208, and the table memory 180.

In a manner similar to the command decoder (40) described up to now, the command decoder 200 takes in or captures an external address ADD and data DQ as commands in accordance with control signals /CE, /WE and /OE and decodes the same, thereby generating internal commands each indicative of a designated operation mode.

When the command issued from the command decoder 200 is of a write command indicative of data writing, the write command register 202 stores the write command therein. When the given command corresponds to the write command, the write address register 204 stores therein an address given via the command decoder 200 as a write address under the control of the write/verify controller 206. The write address is of an address which contains a block address for specifying each memory block pair PBK.

When the write command is stored in the write command register 202, the write/verify controller 206 refers to the table memory 180 in accordance with the write address stored in the write address register 204 and refers to a corresponding phase flag PFLG, thereby generating a phase instruction signal PHY indicative of a phase, and asserts a write enable signal WEN for designating a write operation. The write/verify controller 206 stores therein a write block address BADW sent from the block address converter 182 to be described later and generates an address at write verify. Further, the write/verify controller 206 controls operations necessary for the writing and write verify.

The erase/verify controller 208 executes an erase/verify operation in accordance with the write enable signal WEN outputted from the write/verify controller 206. The erase/verify controller 208 stores therein an erase block address BADE supplied from the block address converter 182 and sequentially generates verify addresses at erase verify using an unillustrated erase verify counter. As the write, erase and verify operations of the write/verify controller 206 and the erase/verify controller 208, any of the operations employed in the first through ninth embodiments up to now may be used.

Phase flags PFLG0 through PFLGk are stored in the table memory 180 in association with the respective memory block pairs. Here, k indicates (i−1)/2.

The block address converter 182 includes a block address generator 210 which generates two types of block addresses from a block address BAD given from an address register 22 when the write enable signal WEN is asserted, and a path selecting switch 212 which sets a transfer path of each block address given from the block address generator 210 in accordance with the phase instruction signal PHY.

The block address generator 210 adds the least significant bits of two types ("0" and "1") to the block address BAD for designating each memory block pair to thereby generate block addresses BAD0 and BAD1 for designating the memory blocks of the memory block pairs respectively. The path selecting switch 212 sets transfer paths of the generated block addresses BAD0 and BAD1 in accordance with the phase instruction signal PHY and generates a write block address signal BADW supplied to the row decoder and an erase block address BADE supplied to the EG line control circuit 70.

Incidentally, upon erasure and write verify, a verify address outputted from an unillustrated verify counter is supplied to the row decoder instead of the block addresses BADE and BADW (using an unillustrated multiplexer). Upon this verify, the write block address BADW and erase block address BADE are initially set at the counter as block addresses for specifying memory blocks at verify addresses. Hence, in-block addresses are generated by updating the counter.

Figure 58:
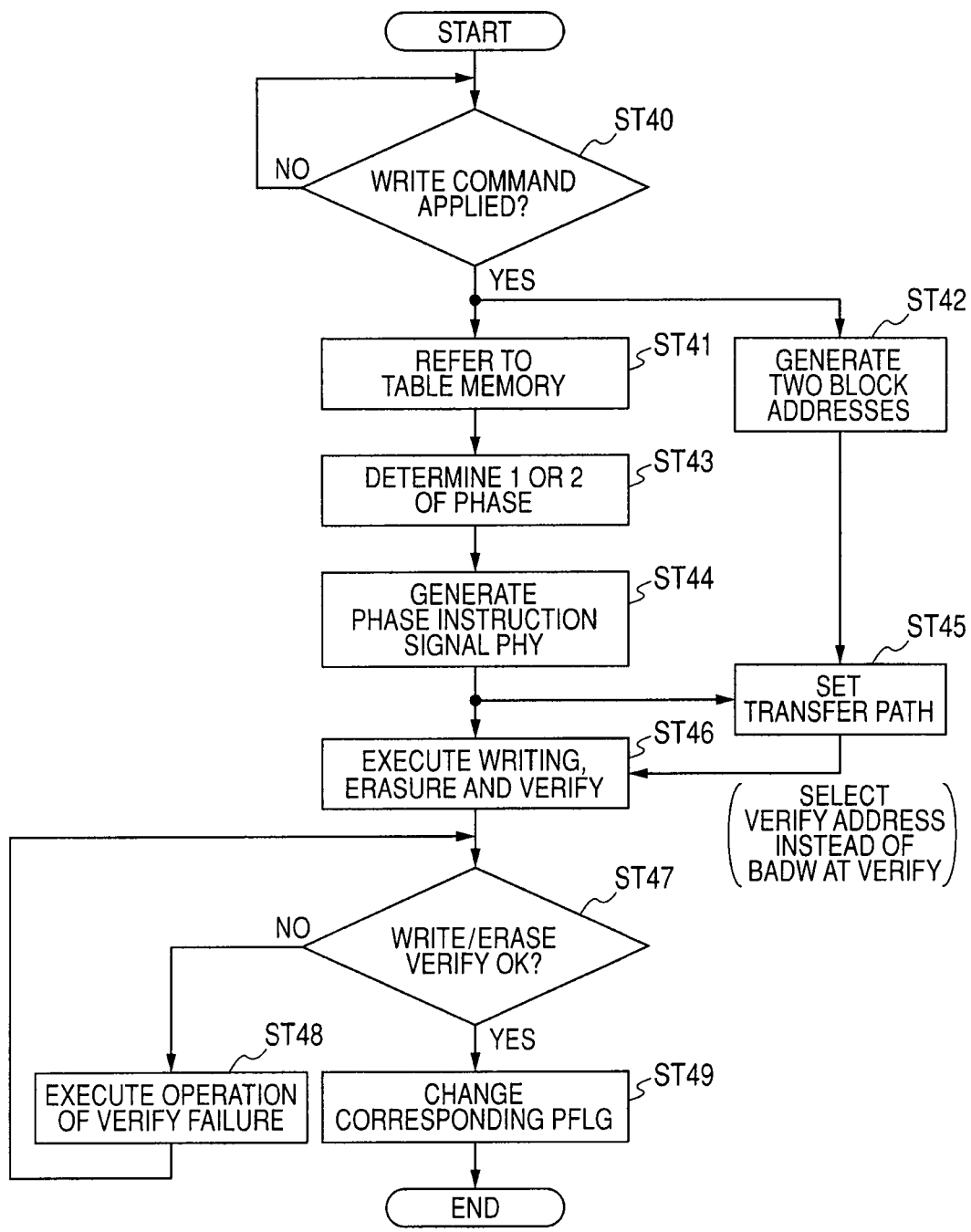
FIG. 58 is a flowchart illustrating the operation of the semiconductor device shown in FIG. 56.

FIG. 58 is a flowchart showing operations of the command register/control circuit and block address converter shown in FIG. 57. The operations of the command register/control circuit 24C and block address converter 182 shown in FIG. 57 will be explained below with reference to FIG. 58.

The write/verify controller 206 first waits for an external write command to be applied (Step ST40).

When the write command is given from the outside and a signal for instructing the write command register 202 to perform writing is stored therein, the write/verify controller 206 stores a write address in the write address register 204 and refers to the table memory 180, based on the write address stored in the write address register 204. It is determined by reference to the table memory 180 whether a corresponding phase flag PFLGi is set to either of phases PH1 and PH2 (Step ST43). The determination as to the phases PH1 and PH2 is performed depending on whether the phase flag PFLGi is in either a set state or a rest state.

The block address converter 182 adds the least significant bit to a block address BAD contained in an external address signal ADD in accordance with the assertion of a write enable signal WEN outputted from the write/verify controller 206 to thereby generate two block addresses BAD0 and BAD1. The addition of the least significant bit means that bits "0" and "1" are merely added to the least significant bit positions in block addresses upon assertion of the write enable signal WEN. With regard to the block address signals BAD0 and BAD1 by way of example, the least significant address bits are respectively set to "0" and "1" at data writing.

In parallel with the generation of the block addresses by the block address generator 210, the write/verify controller 206 generates a phase instruction signal PHY in accordance with each phase identified based on the result of reference of the phase flag PFLGi of the table memory 180 (Step ST44).

The path selecting switch 212 in the block address converter 182 sets transfer paths for the internal block address signals BAD0 and BAD1 in accordance with the phase instruction signal PHY and generates a write block address signal BADW and an erase block address signal BADE, followed by being supplied to their corresponding row decoder and EG line control circuit (Step ST45).

After the generation of the phase instruction signal PHY, the write/verify controller 206 enables the erase/verify controller 208 to execute writing, erasure and verify relative to each designated memory block (Step ST46). Upon this verify, the write block address signal BADW and the erase block address signal BADE are respectively supplied and stored to and in the write/verify controller 206 and the erase/verify controller 208, whereby the corresponding verify operation is carried out based on these stored addresses.

Upon this verify, a verify block address signal is supplied to each of the row and column decoders along with a verify address signal in accordance with the write block address signal BADW. At this time, the corresponding erase block address signal BADE is supplied to the EG line control circuit continuously, and the application of an erase voltage and both writing and write verify may be executed in parallel. After the completion of both the erase voltage application and the write operation, the write verify may be executed, followed by execution of the erase verify.

When a write or erase failure is shown at the write/erase verify, the writing or erasure is executed again (Step ST48). When the write and erase verify both indicate the completion of writing and erasure, the write/verify controller 206 changes the state of the corresponding phase flag PFLGi of the table memory 180 (Step ST49).

Next, the write and erase operations can be performed on the different memory blocks of the corresponding memory block pair in parallel respectively.

Incidentally, when the writing and erasure are carried out, any of the control of the write and erase operations descried in the previous first through eighth embodiments may be used.

At the data reading, its detailed configuration is not shown, but the execution of read access to each write memory block is required. Upon data read access, the following operations are carried out. When a read command is applied, the read controller (refer to, for example, FIG. 33) asserts a read activation signal REN and stores a read address in the corresponding read address register. Further, the read controller refers to a corresponding phase flag PFLG of the table memory in accordance with the stored read address. The phase of the corresponding memory block pair is determined in accordance with the result of flag reference. At the block address converter 182, the block address generator 210 generates a memory block address in a mode or form similar to that at writing.

The path selecting switch 212 sets a transfer path for each memory block in a mode or form opposite to that at writing in a read mode. At the phase PH1, for example, writing is performed on the corresponding memory block BKi and erasure is performed on the corresponding memory block BK (i+1). After the completion of the writing, the phase is changed to PH2. Thus, when read access is carried out after writing, it is necessary to perform the read access to the corresponding memory block BKi in the same mode or form as the phase PH1.

Thus, the read access can be performed on the write-executed memory block by setting the path at the path selecting switch 212 in the form opposite to that at the write access upon the read access. The logic of phase determination at the write/verify controller 206 and the read controller is set in reverse, thereby making it possible to accurately select the memory block target for access by selecting the path in the same form at the path selecting switch 212 in accordance with the phase instruction signal PHY. In this case, a change in the path selection mode or form can easily be realized by providing a circuit for selecting either one of the phase instruction signal at writing and the phase instruction signal at reading in accordance with the operation mode and supplying it to the path selecting switch 212.

According to the tenth embodiment of the present invention as described above, the memory blocks are provided so as to be paired with each other. When data writing is performed on the memory blocks that pair with each other, writing is alternately performed on the two memory blocks and erasure is performed on the other memory blocks. It is thus possible to always write large volumes of data into the corresponding erase memory block and perform writing at high speed.

Incidentally, there may further be provided such a configuration that upon power shutdown, the contents of the table memory 180 is saved into the specific region of the memory array 20, and the saved phase flag is loaded into the table memory at power recovery or power-on (refer to the seventh embodiment). The data access may be executed on a pipeline basis in a manner similar to the ninth embodiment.

Eleventh Embodiment

Figure 59:
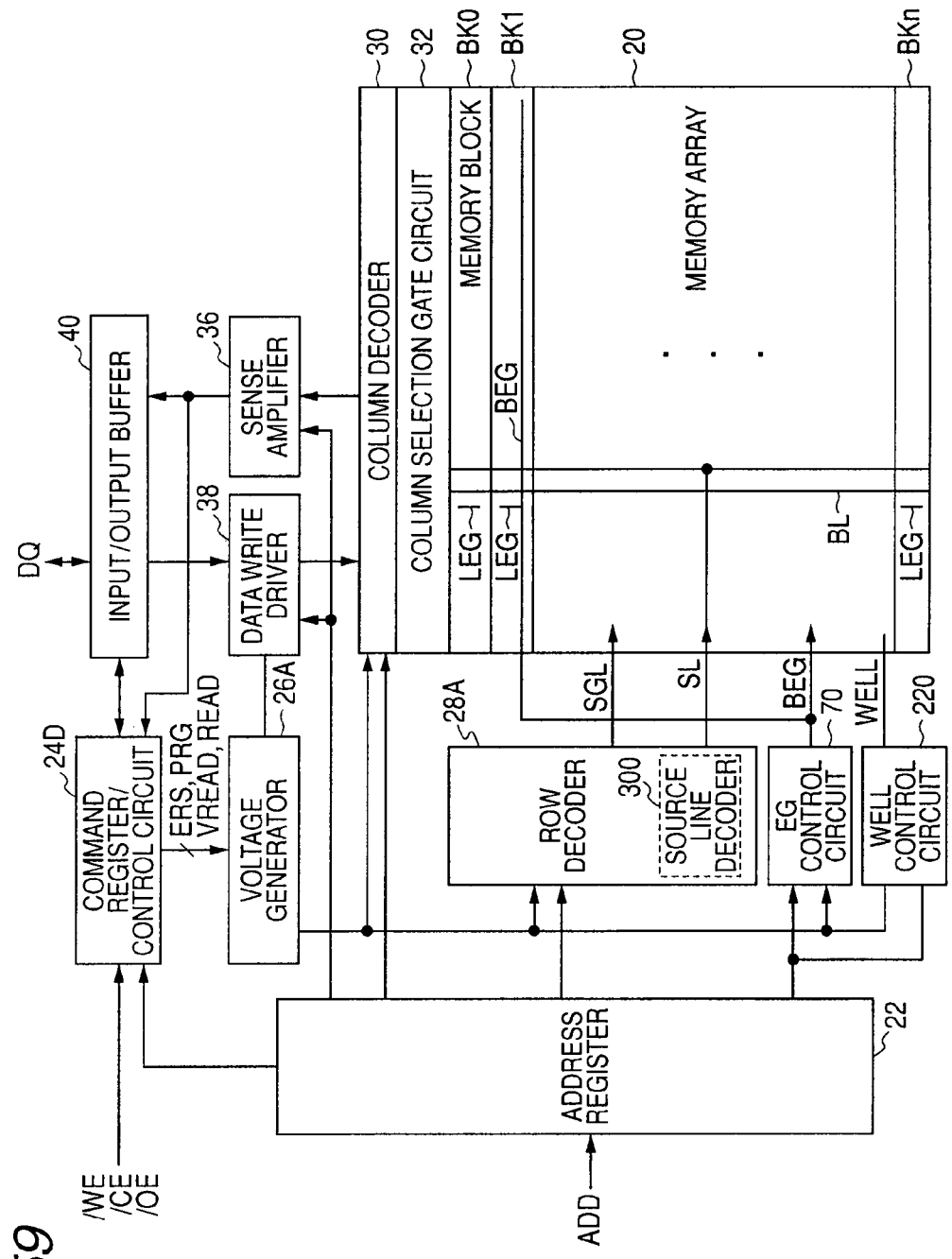
FIG. 59 is a diagram schematically depicting an overall configuration of a semiconductor device according to an eleventh embodiment of the present invention.

FIG. 59 is a diagram schematically showing an overall configuration of a semiconductor device according to an eleventh embodiment of the present invention. In FIG. 59, a selection gate line SGL for selecting a memory cell row in a memory array 20, a block embedded erase gate line BEG and a local embedded gate line LEG are arranged corresponding to each of memory blocks BK0 through BKn. Bit and source lines BL and SL extend in a column direction in association with each memory cell column and are arranged in common to the memory blocks BK0 through BKn.

A row decoder 28A and a source line decoder 300 respectively receive row and column addresses from an address register 22 and thereby drive the selection gate line SGL and the source line SL to a selected state in response to a write operation and a read operation (including a verify operation). An EG control circuit 70 applies an erase high voltage to the block embedded erase gate line BEG for an erase memory block upon erasure.

A well control circuit 220 is provided to set the voltage of a well WLL for every memory block. The well control circuit 220 receives a memory block address from the address register 22 to control a well potential (WELL) in memory block units in a manner similar to the EG control circuit 70 and transfers a well voltage corresponding to the voltage supplied from a voltage generator 26A to a selected memory block and a non-selected memory block respectively.

Since the structure of each memory cell is different from that of the memory cell, which has been used in each of the first through tenth embodiments, as will be described later, a voltage level generated under the control of a command register/control circuit 24D by the voltage generator 26A is different from one used in each of the first through tenth embodiment described up to now. The semiconductor device shown in FIG. 59 is identical in other configuration to the semiconductor device shown in FIG. 23. The same reference numerals are attached to their corresponding portions, and their detailed explanations are omitted. Incidentally, even in the following embodiments, the memory array is equivalent to a memory mat and assumed to be a memory array having a single bank configuration.

Figure 60:
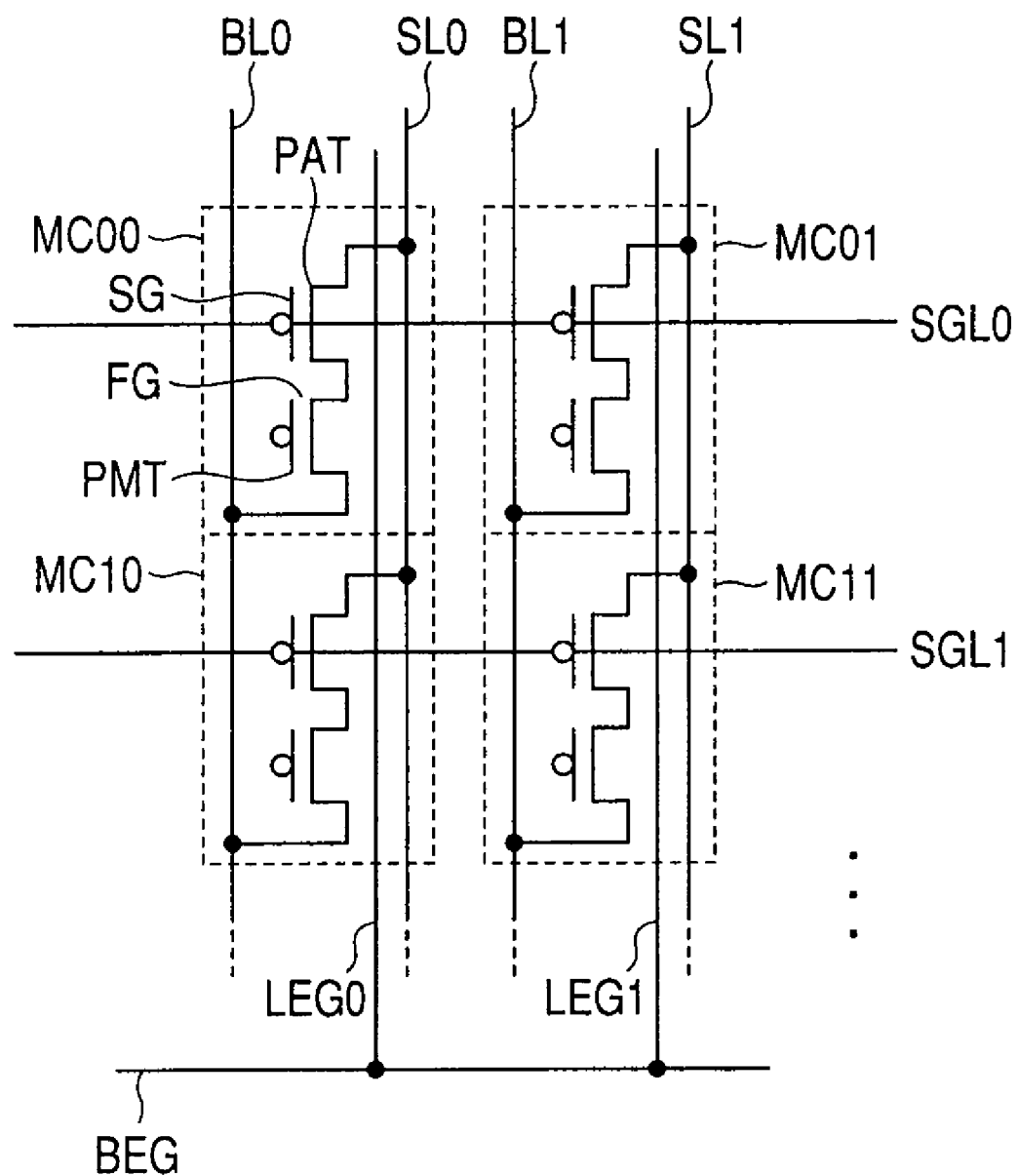
FIG. 60 is a diagram showing an arrangement of memory cells of a memory array in the semiconductor device shown in FIG. 59.

FIG. 60 is a diagram showing one example of an arrangement of memory cells in the memory array 20 shown in FIG. 59. Memory cells MC00, MC01, MC10 and MC11 arranged in two rows and two columns are typically illustrated in FIG. 60. Since these memory cells MC00, MC01, MC10 and MC11 have the same configuration respectively, reference symbols are respectively attached to components at the memory cell MC00 in FIG. 60.

The memory cell MC00 has an access transistor PAT comprised of a P channel MOS transistor coupled in series between a source line SL0 and a bit line BL0, and a memory transistor PMT having a floating gate. The memory transistor PMT has a gate brought to a floating state and used as a floating gate FG with an electric charge stored therein.

The bit lines BL0 and BL1 are arranged corresponding to memory cell columns, and the source lines SL0, SL1, . . . are arranged corresponding to the memory cell columns. Selection gate lines SGL0, SGL1, . . . are arranged corresponding to memory cell rows. The source line SL is coupled to an impurity region of a selection transistor PAT of each memory cell in the corresponding column. The selection gate line SGL is coupled to its corresponding gate of the selection transistor PAT of each memory cell in the corresponding row.

Local embedded gate lines LEG0, LEG1, . . . are arranged in boundary regions of the memory columns in association with the memory columns. The local embedded erase gate lines LEG0 and LEG1 are coupled in common to the corresponding block embedded erase gate line BEG. Each of the source lines SL0 and SL1 is configured by an impurity region of an access transistor PAT and a lined metal wiring (shunt wiring). Each of the local embedded erase gate lines LEG0 and LEG1 is formed in a device isolation region between memory cells. No wiring collision occurs between the source line and the embedded erase gate line.

Figure 61:
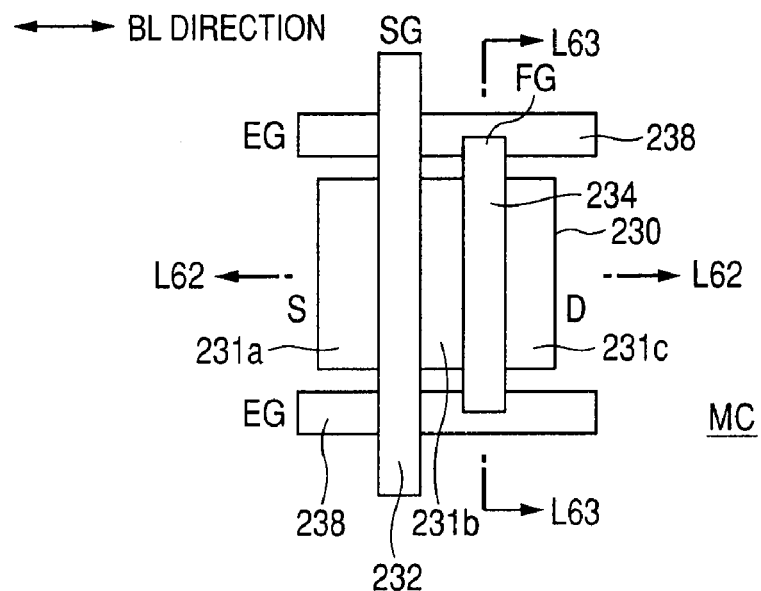
FIG. 61 is a diagram schematically illustrating a planar layout of the memory cell shown in FIG. 60.

FIG. 61 is a diagram schematically showing a planar layout of a memory cell MC. Since each memory cell has the same planar layout, the memory cell is designated at symbol MC in FIG. 61 to represent it typically.

In FIG. 61, the memory cell MC includes an active region 230. The active region 230 includes an impurity region 231a coupled to a source line, an impurity region 231b, and an impurity region 231c coupled to a bit line. The impurity region 231a and the impurity region 231c are respectively shared for adjacent memory cells of the same column.

A selection gate wiring 232, which configures a selection gate SG, is disposed between the impurity regions 231a and 231b as viewed in the direction orthogonal to a BL direction (bit line extending direction). A selection gate line SGL is configured by the selection gate wiring 232.

A charge storage layer 234, which configures a floating gate FG, is formed between the impurity regions 231b and 231c. Each of embedded erase gate wirings 238 each extending consecutively in the BL direction in a device isolation region between adjacent memory cells is formed in the direction orthogonal to the BL direction of the active region 230 of the memory cell MC and configures an embedded erase gate EG with respect to each memory cell MC.

In the case of the arrangement of the memory cell shown in FIG. 61, the source impurity region 231a is coupled to the source line SL, and the drain impurity region 231b is coupled to the bit line BL. A source metal wiring is formed over a device isolation region between memory cell columns using a first metal wiring over the corresponding embedded erase gate wiring. The bit line is formed over the active region 230 using a second metal wiring of a layer above the first metal wiring. Thus, even when the source and bit lines are caused to extend in parallel in the BL direction, no arrangement collision occurs.

Figure 62:
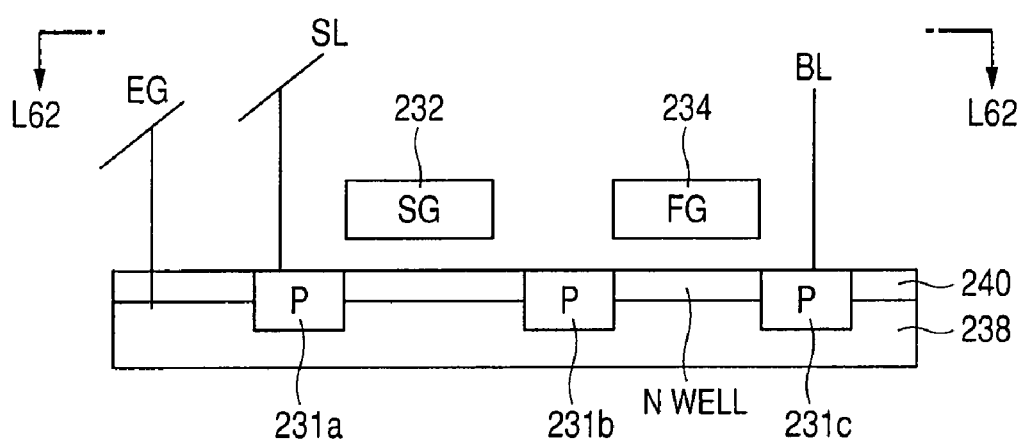
FIG. 62 is a diagram schematically depicting a sectional structure taken along line L62-L62 shown in FIG. 62.

FIG. 62 is a diagram schematically showing a sectional structure taken along line L62-L62 shown in FIG. 61. In FIG. 62, the embedded erase gate wirings 238 are shown together to represent correspondence. In FIG. 62, the P-type impurity regions 231a, 231b and 231c are respectively formed in an active region of the surface of an N well 240 at intervals defined therebetween. The selection gate wiring 232 for forming the selection gate SG is provided between the impurity regions 231a and 231b. The charge storage layer 234 that configures the floating gate FG is disposed in a region defined between the impurity regions 231b and 231c. The charge storage layers 234 are separated from each other and disposed every memory cell.

Incidentally, the impurity regions 231a and 231c are respectively coupled to the source line SL and the bit line BL. The embedded erase gate wiring 238 is coupled to the embedded erase gate EG. In this case, the embedded erase gate EG and the source line (source metal wiring) SL are disposed in positions and wiring layers different from the bit line BL as described above. Therefore, the difference between the positions is shown by oblique lines for coupling wirings in FIG. 62.

Figure 63:
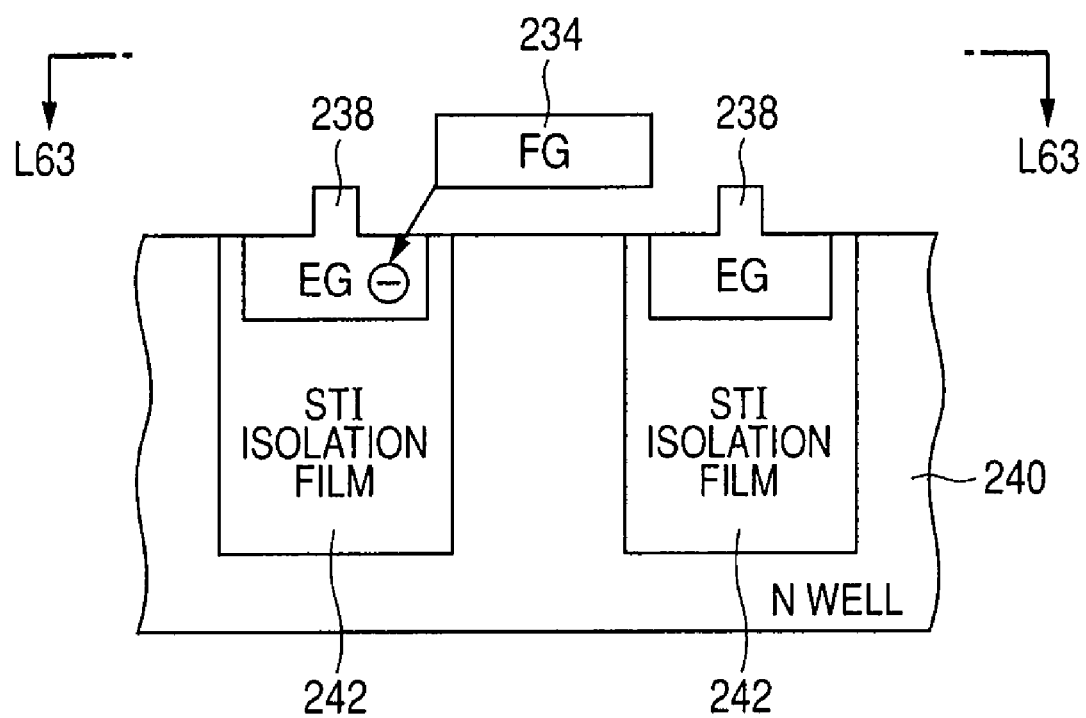
FIG. 63 is a diagram schematically showing a sectional structure taken along line L63-L63 shown in FIG. 61.

FIG. 63 is a diagram schematically showing a sectional structure taken along line L63-L63 shown in FIG. 61. There are provided STI isolation films 242 to isolate memory cells adjacent in the direction orthogonal to the BL direction of each memory cell. The embedded erase gate wirings 238 are formed in the surfaces of the STI isolation films 242. The embedded erase gate wirings 238 have protrusions provided at their tops and adjoin the charge storage layer 234 that configures the floating gate FG. In a manner similar to the embodiments mentioned up to now, electrons stored in the charge storage layer 234 (floating gate FG) are pulled out into the embedded erase gate wirings 238 (embedded erase gate EG) by FN current upon erasure.

As shown in FIGS. 60 through 63, the erasure and writing can be carried out even though each memory cell is configured using the P channel MOS transistor. Although the read operation is possible during the application of the erase voltage as will be described below, the write operation cannot be carried out.

Figure 64:
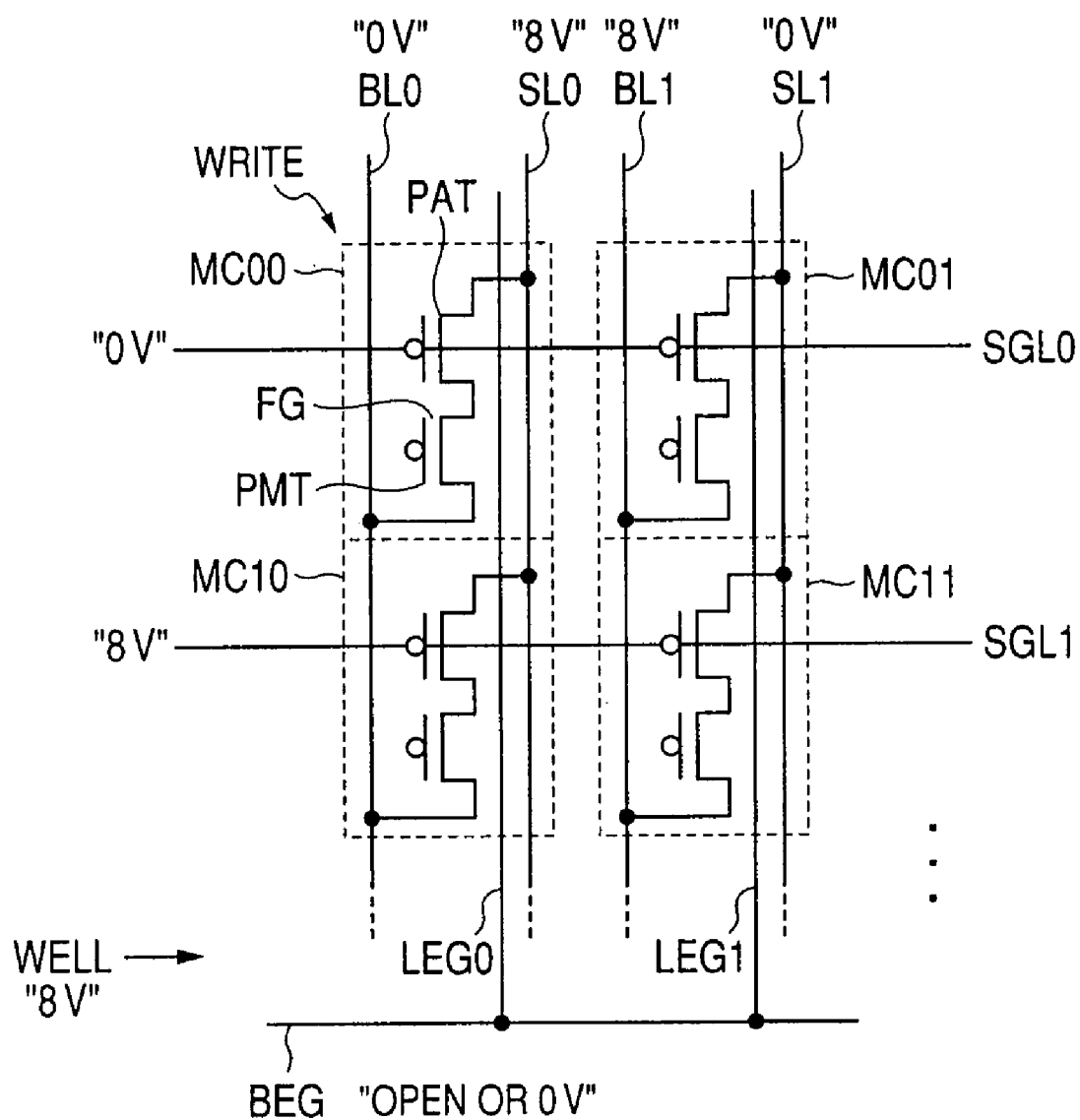
FIG. 64 is a diagram illustrating voltages applied to the memory array shown in FIG. 60 at data writing thereof.

FIG. 64 is a diagram showing voltages applied to the memory cells employed in the eleventh embodiment of the present invention at writing thereof. Consider where writing is performed on a memory cell MC00 in FIG. 64. In this case, 0V is set to a selection gate line SGL0 of a selected row. On the other hand, 8V is applied to a selection gate line SGL1 of a non-selected row. 0V is transferred to a bit line BL0 of a selected column, and 8V is applied to a source line SL0 of the selected column. A bit line BL1 of a non-selected column is set to 8V, and a non-selection source line SL1 is set to 0V. At this time, 8V is set to a well voltage WELL relative to a well region (N well 24), and an embedded erase gate line BEG is set to an open state or 0V.

At the memory cell MC00, its access transistor PAT is of a P channel MOS transistor. The P channel MOS transistor is brought to an on state so that current flows from the source line SL0 to the bit line BL0. At this time, current flows from the source line SL to the P-type impurity region 231b (refer to FIG. 62) lying between the memory transistor PMT and the access transistor PAT through the access transistor PAT. In this case, hot electrons are generated by a high electric field at the drain of the memory transistor PMT, so that electrons are injected into the floating gate FG.

When the memory transistor PMT is of the P channel MOS transistor, the threshold voltage thereof is reduced when electrons are injected into its floating gate, so that the memory transistor PMT is brought to an on state. It is thus possible to set the memory cell MC00 to a write state.

At a memory cell MC01, its memory transistor has a gate (selection gate) and a source both identical in potential and is maintained in an off state. No write current flows into the memory cell MC01. Even at a memory cell MC10, its access transistor (PAT) has a gate and source identical in potential and is maintained in an off state. With regard to a memory cell MC11 as well, the potential at the gate of its access transistor (PAT) is higher than that at its source and hence the memory cell MC1 is placed in an off state. It is thus possible to perform memory and data writing only on each selected memory cell.

At this time, the voltages applied to the N well and impurity regions 231a through 231c by setting the well potential WELL to 8V are 8V at maximum. It is possible to prevent a PN junction between a substrate region and each impurity region from being brought into conduction and perform accurate writing.

Figure 65:
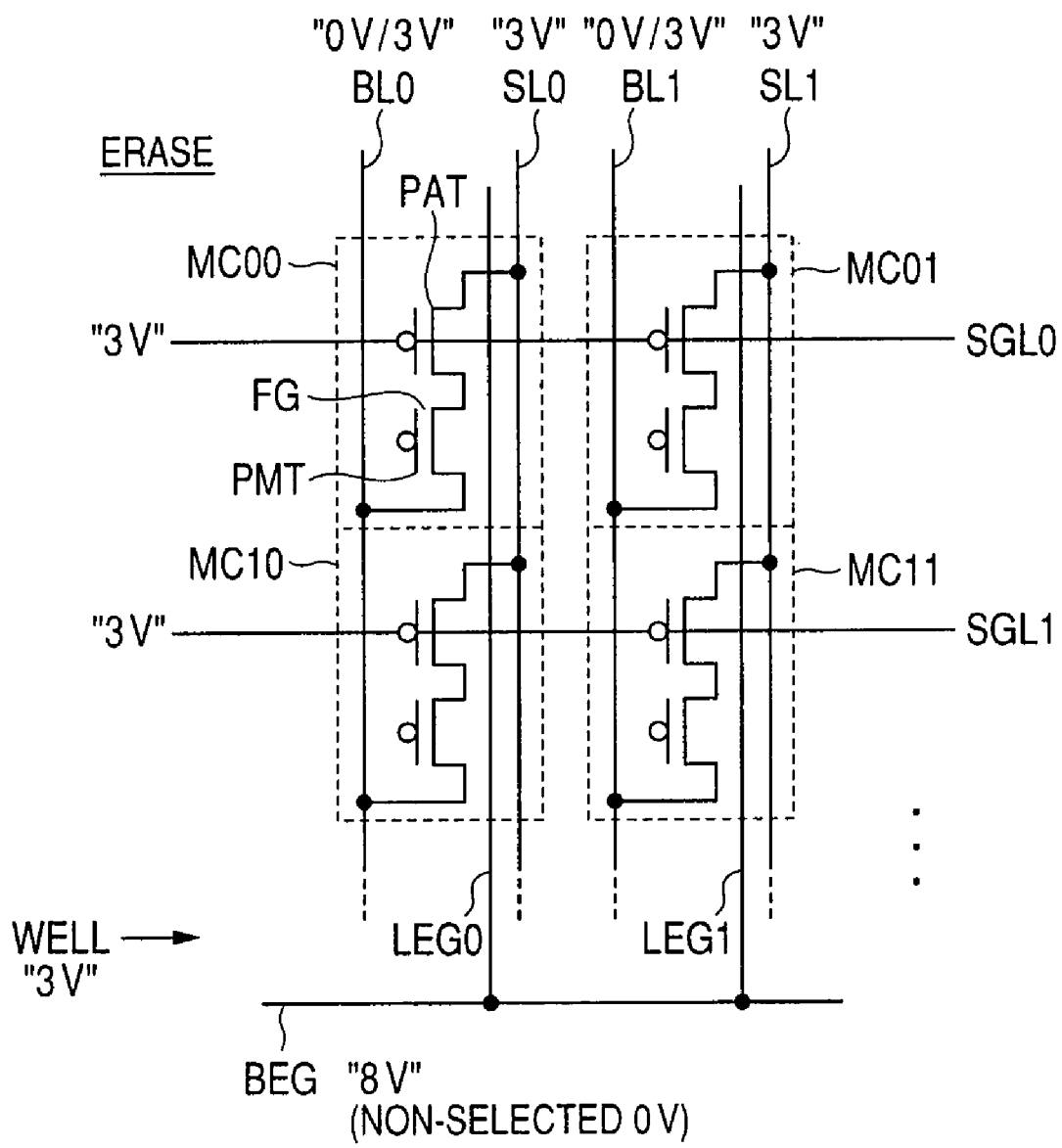
FIG. 65 is a diagram showing voltages applied to the memory array shown in FIG. 62 at erasure thereof.

FIG. 65 is a diagram showing voltages applied to each memory cell at erasure thereof. In the erase mode, the block embedded erase gate line BEG for each selected memory block is set to 8V. All local embedded erase gates LEG, LEG1, . . . are set to 8V. The well voltage WELL, selection gate lines SGL0, SGL1 and source lines SL0 and SL1 are all set to 3V. The bit lines BL0 and BL1 are 0V or 3V depending on the voltage taken where the reading of data is performed in parallel with the erasure. When the data reading is not performed in parallel with the erasure, the voltage on the bit line BL is set to 3V.

Since the voltage of 8V is applied to each of the embedded erase gates EG in the erase mode as shown in FIG. 63, FN current flows due to the coupling between the embedded erase gate EG and the floating gate FG, so that electrons stored in the floating gate FG are discharged into the embedded erase gate EG. Correspondingly, the threshold voltage of the memory transistor PMT becomes high. On the other hand, as for each non-selected memory block, its block embedded erase gate line BEG is set to 0V so that the transfer of electrons from its floating gate FG to the embedded erase gate EG does not occur and hence no erasure is carried out.

Thus, current flows from the source line to the bit line by setting the selection gate line to 0V indicative of the selected state at each of the erase memory block and another memory block upon the erase operation (when the memory transistor is in the on state). Hence, the voltage of the bit line becomes a voltage level approximately equal to the voltage of the source line. On the other hand, when the memory cell is in the erase state, the memory transistor PMT is in the off state. Thus, no current flows from the source line to the bit line and the bit line BL is hence placed in the original ground voltage level. Reading can be performed by detecting this voltage level. When the erase operation is being performed at one memory block, the reading of data can be performed at another memory block. Since the access transistor PAT is maintained in the off state at the corresponding erase memory block, the potential of the bit line BL does not exert any influence on the erase operation.

Figure 66:
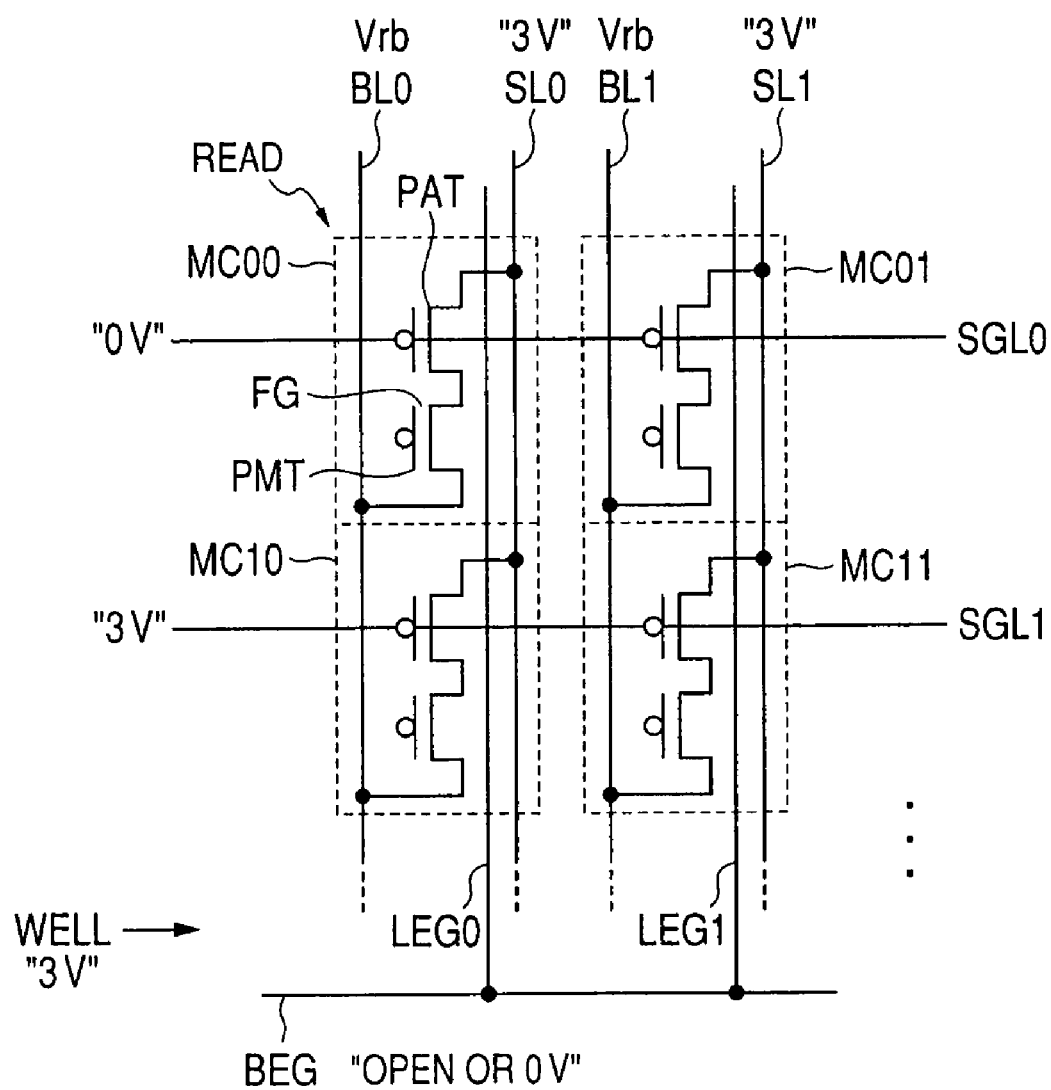
FIG. 66 is a diagram showing voltages applied to the memory array shown in FIG. 62 at reading thereof.

FIG. 66 is a diagram showing voltages applied to the memory cells at data reading. Consider where in FIG. 66, data reading is performed on the corresponding memory cell MC00. In this case, the selection gate line SGL0 is set to 0V, and the selection gate line SGL1 is set to 3V. The source lines SL0 and SL1 are set to 3V, and the well potential WELL is set to 3V. The bit lines BL0 and BL1 are precharged to 0V. At the selected memory cell MC00, its corresponding selection gate line SGL0 is 0V and the potential on the source line SL0 is 3V. Thus, the access transistor PAT is brought to an on state. The memory transistor PMT is in an on state when in a write state. Thus, current flows from the source line SL0 to the bit line BL0, so that a read voltage Vrb on the bit line BL0 becomes approximately equal to the voltage of 3V on the source line SL0. On the other hand, the memory transistor PMT is in an off state when in an erase state. Therefore, no current flows from the source line SL0 to the bit line BL0. Hence, the bit line BL0 is maintained at the precharge voltage level 0V. Detecting the voltage on the bit line BL0 by an unillustrated sense amplifier makes it possible to read data from the memory cell MC00.

Even at the memory cell MC01, the access transistor is placed in an on state in accordance with the voltage on the selection gate line SGL0. Current selectively flows through the bit line BL1 according to stored information of the memory transistor PMT. A voltage level corresponding to the current becomes a read voltage Vry level corresponding to the stored information of the memory transistor PMT.

As shown in FIG. 66, data is read onto the corresponding bit line from the memory cell in one row upon data reading of the memory cell. Thereafter, the reading of data from the selected memory cell is performed by selecting the corresponding bit line BL by the column decoder.

When each of the bit lines BL (BL0, BL1, . . . ) is shared between a plurality of memory blocks as shown in FIGS. 65 and 66, no adverse effect is exerted on the erase operation when the bit line voltage is 0V or 3V upon erasure (influence exerted on the coupling between the floating gate FG and the embedded erase gate EG is small). Accordingly, the reading of data can be performed at another memory block in parallel with a period during which the erase operation is being performed on one memory block.

When, however, data writing is performed as shown in FIGS. 64 and 66, the bit line voltage is set to 0V or 8V, and the source line SL is also set to 0V or 8V. When the bit line BL is set to 8V, a high voltage is applied to the memory transistor PMT, thereby causing a possibility that electrons will be injected into the corresponding floating gate. Particularly when the high voltage of 8V is applied to the bit line BL, the voltages of the impurity region 231c coupled to the bit line and the embedded erase gate EG become equal to each other so that the coupling between the erase gate and the floating gate becomes weak, thus causing a possibility that an erase failure will occur. When the source line SL extends in the column direction and is shaped by a plurality of memory blocks, the voltage different from the voltage at erasure is applied corresponding to write data even for as the voltage on the source line. Thus, the voltage at erasure and the voltage at writing compete with each other, thereby making it unable to perform the erasure and writing in parallel. Accordingly, the writing of data to another memory block in parallel with the erase operation is inhibited.

In this case, the command register/control circuit 24D may be configured in such a manner that when the write command is applied upon the erase operation, its writing is inhibited. As an alternative to the above, it may be configured so as to output a flag to an external device during the execution of the erase operation and notify inhibition of data write access to the external device in a manner similar to the fifth embodiment. Thus, in the eleventh embodiment, the erase operation and the read operation can be executed in parallel at different memory blocks using the configuration similar to that of the previous embodiment 4, 5 or 6. In a manner similar to the first embodiment, erase verify can be executed during the application of the erase voltage. The transistors of the memory cells are of single layer gate transistors together and a manufacturing process therefor is hence simplified.

Incidentally, the source lines SL may extend in the row direction at the respective memory blocks and be disposed corresponding to the memory cell rows.

Twelfth Embodiment

Figure 67:
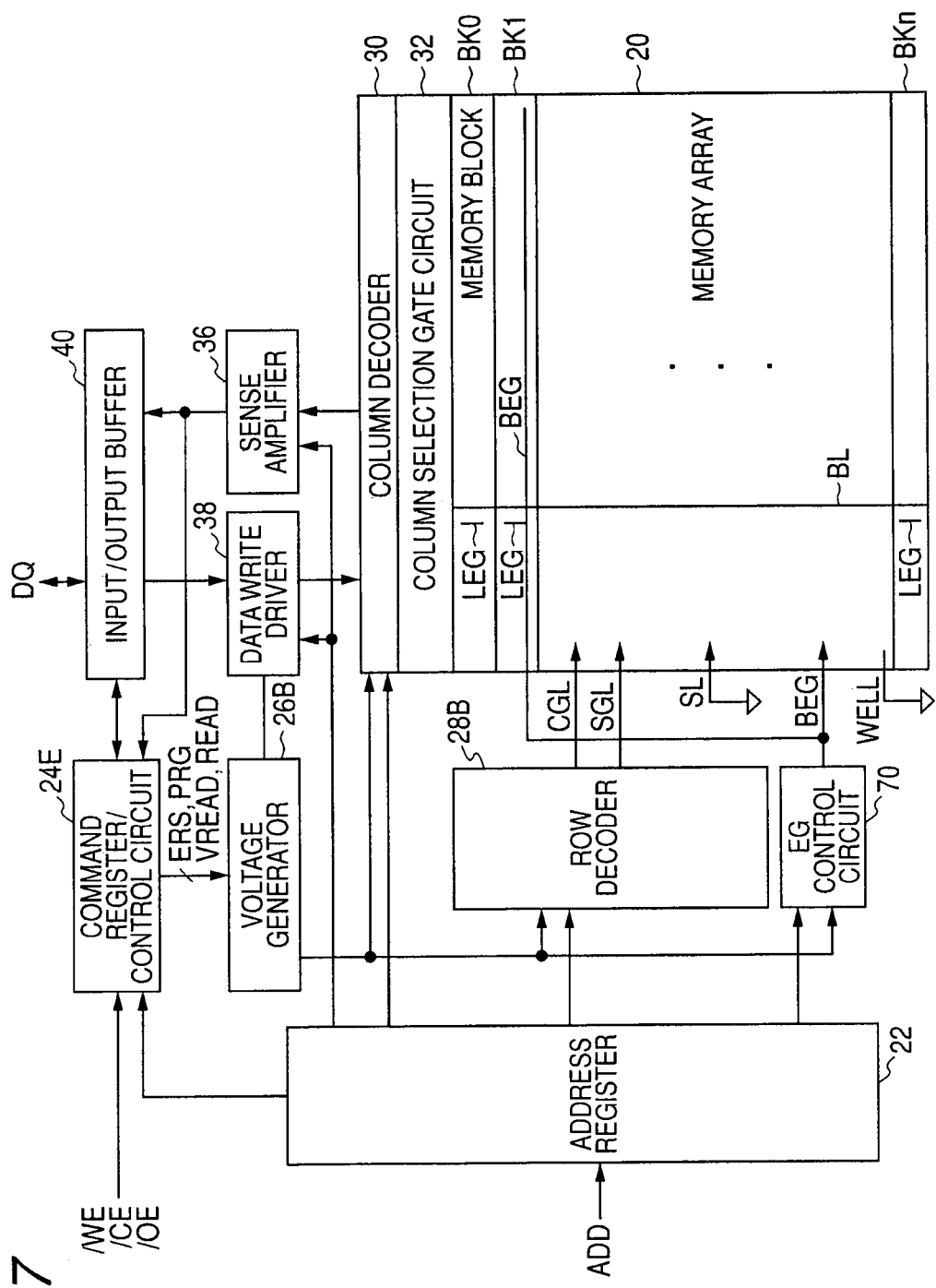
FIG. 67 is a diagram schematically illustrating an overall configuration of a semiconductor device according to a twelfth embodiment of the present invention.

FIG. 67 is a diagram schematically showing an overall configuration of a semiconductor device according to a twelfth embodiment of the present invention. In the configuration shown in FIG. 67, a control gate line CGL, a selection gate line SGL, a source line SL, a block embedded erase gate line BEG and a local embedded erase gate line LEG are arranged in each of memory blocks BK0 through BKn in a memory array 20. The source line SL and well potential WELL are fixed to a ground potential.

Since each of memory cells has the control gate line CGL, selection gate line SGL, source line SL and embedded erase gate line as will be described later, control modes or forms at a write operation, a read operation and an at-erasure verify operation of a command register/control circuit 24B are similar to the embodied modes or forms shown in the fourth through tenth embodiments described up to now. A voltage generator 26B provides different voltage levels generated according to the structure of each memory cell.

The semiconductor device shown in FIG. 67 is identically in other configuration to the semiconductor device shown in FIG. 23. The same reference numerals are attached to their corresponding portions, and their detailed explanations are omitted.

Figure 68:
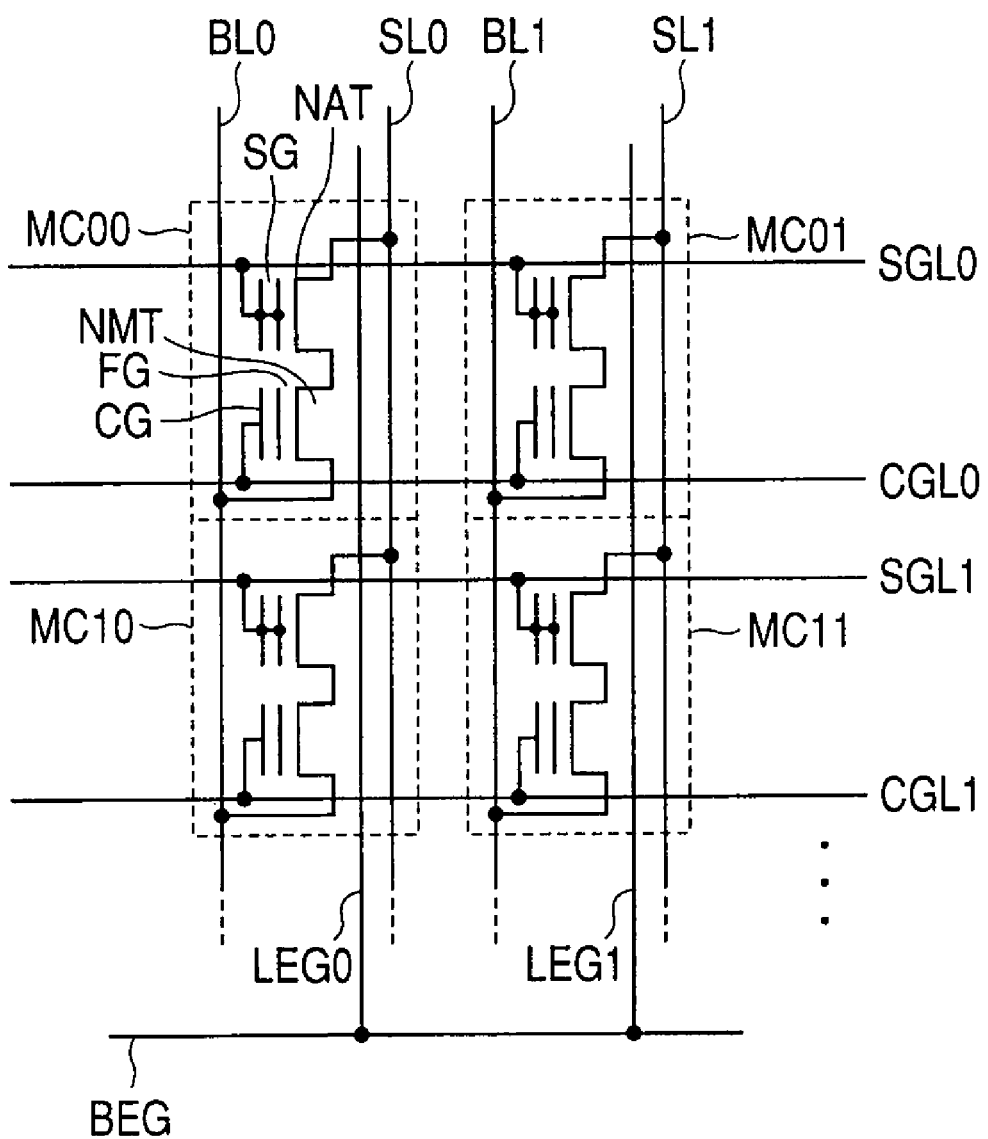
FIG. 68 is a diagram schematically depicting a configuration of a memory array of the semiconductor device shown in FIG. 67.

FIG. 68 is a diagram schematically showing an arrangement of memory cells in the memory array (memory mat) 20 shown in FIG. 67. A layout of memory cells arranged in two rows and two columns is typically illustrated in FIG. 68. Since each of memory cells MC00, MC01, MC10 and MC11 has the same configuration, reference symbols are respectively typically attached to components at the memory cell MC00 in FIG. 69.

The memory cell MC00 has an access transistor NAT and a memory transistor NMT. The memory transistor NMT is of a stacked gate transistor having a control gate CG and a floating gate FG. On the other hand, the access transistor NAT has the same layered or stacked structure as the memory transistor NMT and is used as a selection gate SG with its floating gate and control gate being short-circuited.

The control gate CG of the memory transistor NMT is coupled to its corresponding control gate line CGL (CGL0, CGL1) extending in a row direction. An impurity region of the memory transistor NMT is coupled to bit lines BL0 and BL1 of a corresponding column. The access transistor NAT has the selection gate SG coupled to its corresponding selection gate line SGL (SGL0, SGL1) extending in the corresponding row direction and has an impurity region coupled to its corresponding source line SL (SL0, SL1).

In the arrangement of the memory cells shown in FIG. 68, local embedded erase gate lines LEG0 and LEG1 are provided for the respective memory cells. These local embedded erase gate lines LEG0 and LEG1 are coupled in common to their corresponding block embedded erase gate line BEG and function as embedded erase gates EG of the memory cells.

In the configurations of the memory cells MC (MC00, MC01, MC10 and MC11) shown in FIG. 68, the two memory cells (flash memory cells) each having the same structure are coupled in series. The control gate and floating gate of one of the flash memory cells are electrically coupled to each other and utilized as a selection gate SG. Thus, these access transistor NAT and memory transistor NMT can be formed in the same manufacturing process. Even at the miniaturization of the access transistor NAT, the phenomenon that a control gate electrode wiring thereof punches through its gate electrode can be prevented.

Figure 69:
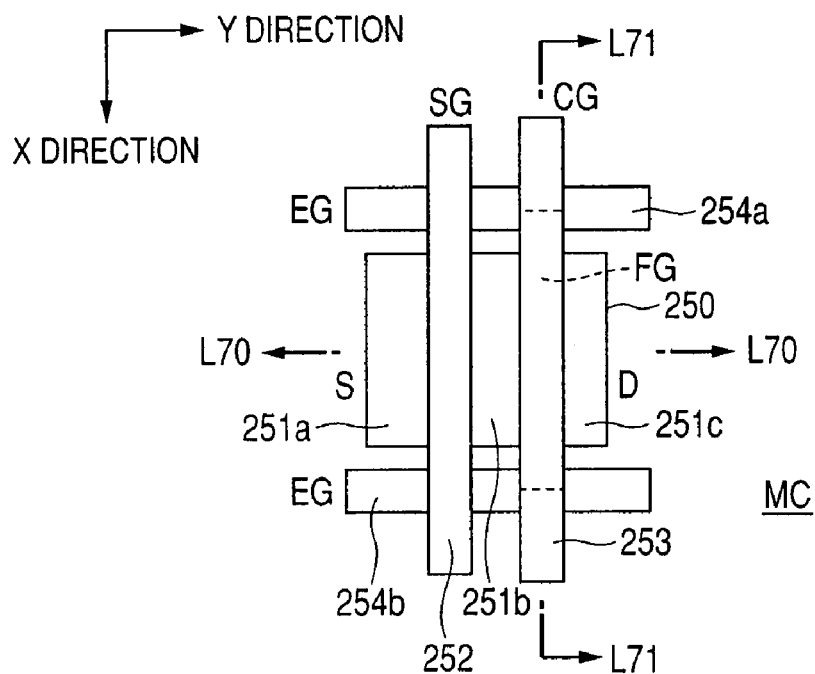
FIG. 69 is a diagram schematically showing a planar layout of a memory cell shown in FIG. 68.

FIG. 69 is a diagram schematically showing a planar layout of each of the memory cells MC (MC00, MC01, MC10 and MC11) shown in FIG. 68. In FIG. 69, the memory cell MC is formed in an active region 250. The active region 250 includes impurity regions 251a, 251b and 251c. A selection gate wiring 252 extending consecutively in an X direction is disposed over an active region defined between the impurity regions 251a and 251b. A control gate wiring 253 extending consecutively in the X direction is disposed over an active region defined between the impurity regions 251b and 251c. The selection gate wiring 252 configures a selection gate line SGL and functions as a selection gate SG of each memory cell. The control gate wiring 253 configures a control gate line CGL and configures a control gate CG of a memory transistor NMT. A floating gate FG is disposed so as to be shown in broken lines below the control gate CG.

An erase gate wiring 254, which configures an embedded erase gate EG at the surface of a device isolation region lying between the memory cells adjacent to each other in the X direction of each memory cell, is provided so as to extend consecutively in a Y direction.

The impurity region 251a is coupled to an unillustrated source line SL, and the impurity region 251c is coupled to an unillustrated bit line BL. When the bit line BL and the source line SL extend in parallel in the Y direction, they are respectively configured by a second metal wiring and a first metal wiring and placed in different positions (for example, the source line is disposed in a layer above the embedded gate wiring 254). Since the source line SL is fixed to a ground voltage, the source line SL may be disposed so as to extend in the row direction.

Figure 70:
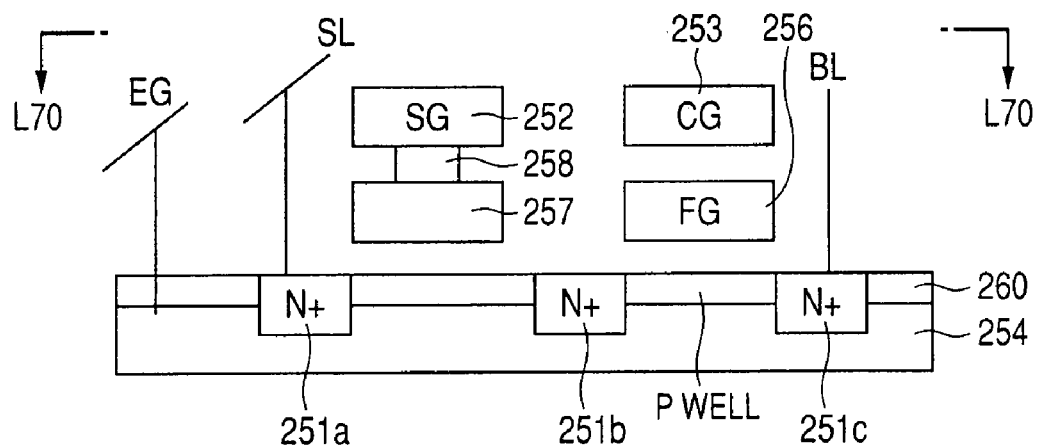
FIG. 70 is a diagram schematically illustrating a sectional structure taken along line L70-L70 shown in FIG. 69.

FIG. 70 is a diagram schematically showing a sectional structure taken along line L70-L70 shown in FIG. 69. In FIG. 70, an embedded erase gate wiring 254 placed in another position is shown together to represent the structure of the memory cell clearly. The active region 250 is formed in the surface of a P well 260, and the impurity regions 251a, 251b and 251c are disposed in the surface thereof at intervals defined therebetween. The selection gate wiring 252 is disposed over the surface of the P well lying between the impurity regions 251a and 251b. The control gate wiring 253 that configures the control gate CG is disposed over the P well surface between impurity regions 251b and 251c.

A gate wiring 257 and a charge storage layer 256 that configures a floating gate FG are respectively provided below the selection gate wiring 252 and the control gate wiring 253. The gate wiring 257 is coupled to the selection gate wiring 252 through a via 258 and disposed so as to extend continuously in the X direction in a manner similar to the selection gate wiring 252. On the other hand, the charge storage layer 256 that configures the floating gate FG is disposed in separate form for each memory cell in association with each memory cell within a memory cell region.

The embedded erase gate wiring 254 is coupled to its corresponding embedded erase gate EG. The impurity region 251a is coupled to its corresponding source line SL. The impurity region 251c is coupled to its corresponding bit line BL. Since these source line SL and embedded erase gate EG are placed in positions different from that of the bit line BL, they are shown with oblique lines being attached to their coupling lines.

Figure 71:
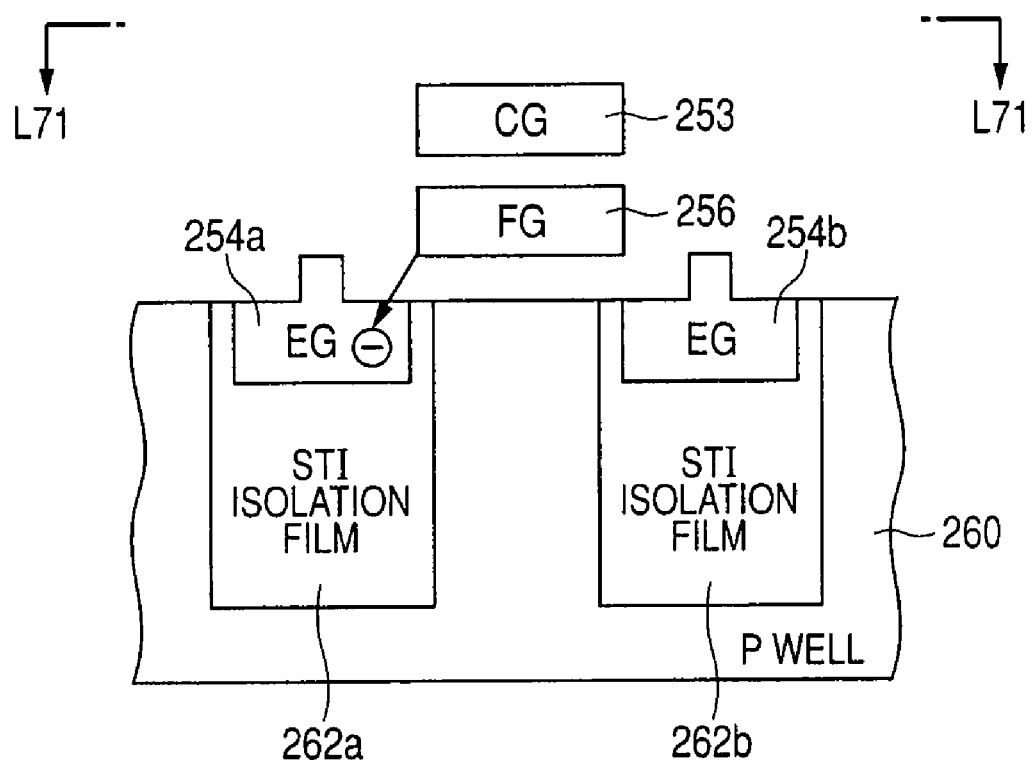
FIG. 71 is a diagram schematically depicting a sectional structure taken along line L71-L71 shown in FIG. 69.

FIG. 71 is a diagram schematically showing a sectional structure taken along lines L71-L71 shown in FIG. 69. As shown in FIG. 71, the memory cell is formed in the surface of the P well 260. The memory cells adjacent to each other in the X direction shown in FIG. 69 are separated from one another by STI isolation films 262a and 262b. The embedded erase gate wirings 254a and 254b are respectively disposed in the surfaces of the STI isolation films 262a and 262b. In a manner similar to the embodiments mentioned up to now, these embedded erase gate wirings 254a and 254b respectively have portions that protrude toward the surface of the P well 260. The charge storage layer 256 that configures the floating gate FG is disposed over the corresponding region between the STI isolation films 262a and 262b. The control gate wiring 253 that configures the control gate CG is disposed so as to extend continuously in the row direction beyond the STI isolation films 254a and 254b. The floating gate FG and the control gate CG are separated from each other by an unillustrated interlayer insulating film.

At erasure, an erase high voltage is applied to the corresponding embedded erase gate EG to thereby pull out electrons from the floating gate FG. Thus, the threshold voltage of the access transistor NAT is reduced.

Figure 72:
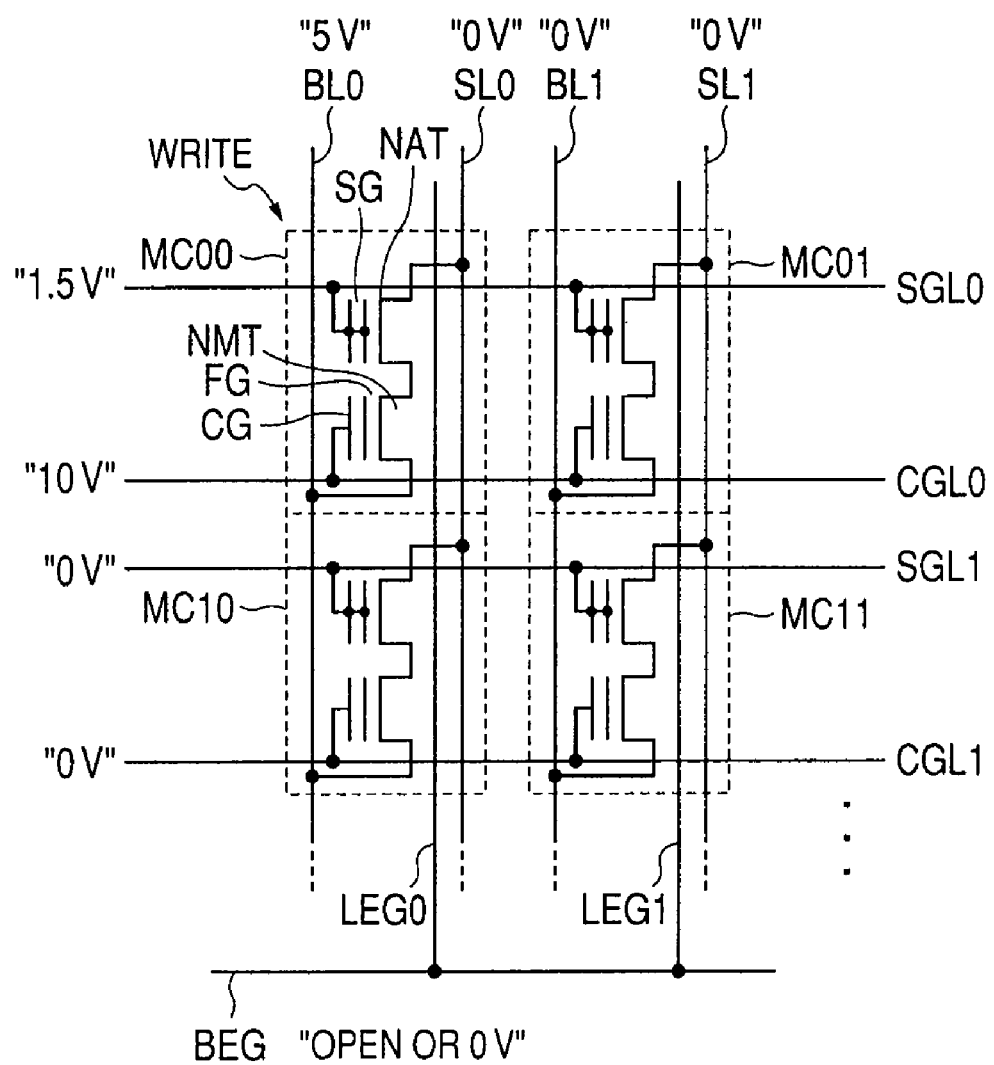
FIG. 72 is a diagram showing voltages applied to the memory array shown in FIG. 68 at writing thereof.
Figure 73:
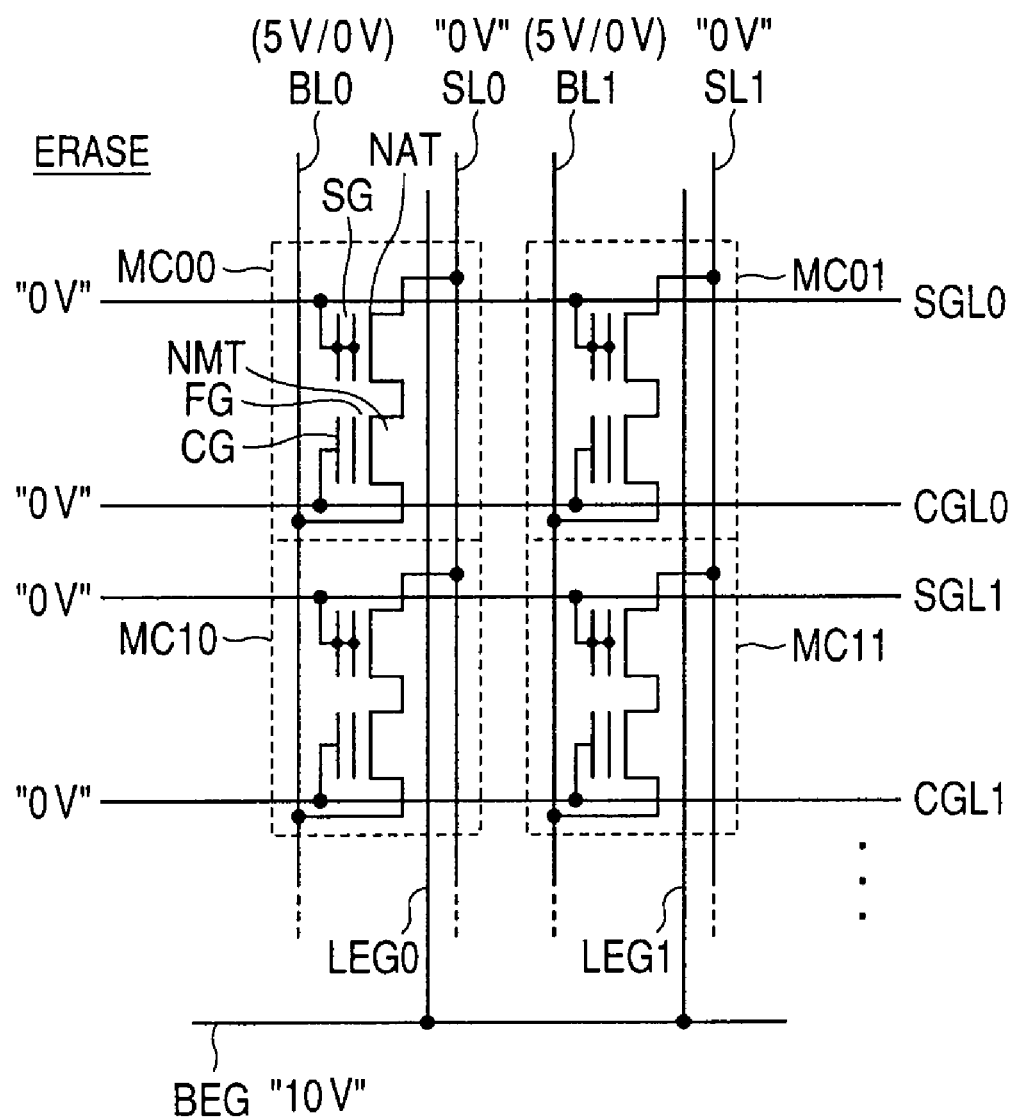
FIG. 73 is a diagram showing one example illustrative of voltages applied to the memory array shown in FIG. 68 at erasure thereof.

FIG. 72 is a diagram showing voltages applied to the memory cells at writing of the semiconductor device according to the twelfth embodiment of the present invention. In FIG. 73, voltages applied where writing is performed on the memory cell MC00 are shown by way of example. In this case, 1.5V is applied to the selection gate line SGL0 and 0V is applied to the selection gate line SGL1. 10V is applied to the control gate line CGL0 and 0V is applied to the control gate line CGL1. 5V is applied to the bit line BL0, and the bit line BL1 and source lines SL0 and SL1 are all set to 0V. The block embedded erase gate line BEG is set to an open state or 0V.

At the memory cell MC00, the access transistor NAT thereof is brought to an on state in this condition. Even at the memory transistor NMT, the high voltage 10V is applied to the control gate CG thereof, so that the memory transistor NMT is brought to an on state. Correspondingly, current flows from the bit line BL0 to the source line SL0. The current that flows from the bit line BL0 is accelerated by a high electric field between the impurity regions 251c and 251d shown in FIG. 70 so that channel hot electrons (CHE) are generated. Thus, the channel hot electrons are attracted onto the positive high voltage of the control gate CG in a control gate direction, followed by being injected into the floating gate FG. Accordingly, the threshold voltage of the memory transistor NMT becomes higher in the write state.

The channel hot electrons are generated because the voltage of 1.5V is applied to the selection gate line SGL0 and the voltage between the bit line BL0 and the source line SL0 is mostly applied to the channel interval of the memory transistor NMT.

FIG. 73 is a diagram showing voltages applied to the memory cells at erasure. In this case, a high voltage of 10V is applied to the corresponding block embedded erase gate line BEG. The source lines SL0 and SL1, selection gate lines SGL0 and SGL1 and control gate lines CGL0 and CGL1 are set to 0V. There is a possibility that the voltage levels of the bit lines BL0 and BL1 will change to 5V or 0V according to the voltage where writing is performed at another memory block. Even in this case, the voltage applied to the control gate CG is 0V at the memory block being placed under erasure. Thus, at the memory block being under erasure, the memory transistor NMT is in an erase state, and the voltage of the selection gate SG is 0V even when the memory transistor NMT is brought to an on state. The access transistor NAT is in an off state and hence no current flows between the bit line and the source line. The voltage on the bit line does not exert any adverse effect on the pulling out of an electrical charge from the flowing gate FG due to the positive high voltage (10V) of the embedded erase gate EG (local embedded erase gate line LEG0, LEG1). Thus, at one erase memory block, the electrical charge is pulled out from the floating gate FG in accordance with a Fowler-Nordheim current to perform erasure. Even though writing is performed at other memory blocks, it is possible to reliably set each memory cell to an erase state at the corresponding erase memory block.

Figure 74:
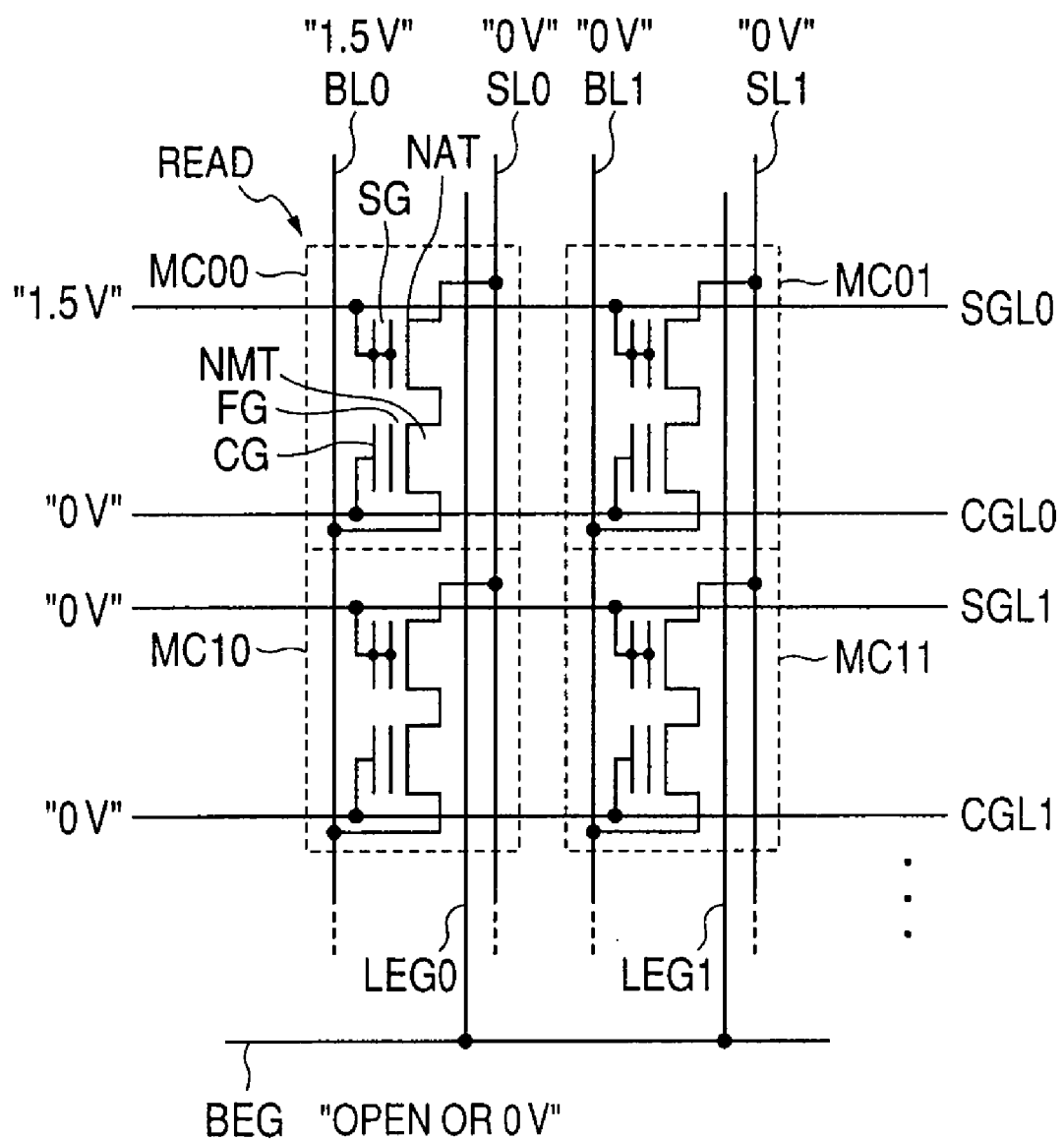
FIG. 74 is a diagram showing one example illustrative of voltages applied to the memory array shown in FIG. 68 at reading thereof.

FIG. 74 is a diagram showing voltages applied to the memory cells at data writing. In FIG. 74, voltages applied where reading from the memory cell MC00 is performed are illustrated by way of example. 1.5V is applied to the selection gate line SGL0. The control gate line CGL0, selection gate line SGL0, control gate line CGL1 and source lines SL0 and SL1 are respectively set to 0V. The bit line BL1 is in a floating state or at a ground voltage (0V) level. A read voltage (e.g., 1.5V) from an unillustrated sense amplifier is applied to the bit line BL0. In this case, the access transistor NAT is brought to an on state at the memory cell MC00. The memory transistor NMT is selectively brought to an on state according to whether it is in either an erase state or a write state, whereby current flows between the bit line BL0 and the source line SL0. The reading of data is carried out by detecting the bit line current by the unillustrated sense amplifier.

Thus, as shown in FIGS. 72 through 74, the embedded erase gates are completely separated from the bit lines. When the erase operation is performed at one memory block, the reading or writing of data can be performed at other memory blocks. Thus, in the semiconductor device according to the twelfth embodiment of the present invention, read or write access can be carried out in parallel with the erase operation in the control forms or modes shown in the preceding first through tenth embodiments.

According to the twelfth embodiment of the present invention as described above, the two transistors each having the stacked gate structure are coupled in series. At one transistor, the control gate and floating gate wiring are electrically coupled to each other such that the transistor is used as the selection access transistor. It is thus possible to realize the stably-operated memory cells without complicating a transistor's manufacturing process. It is also possible to prevent malfunctions such as the occurrence of a short-circuit due to the punching of the gate electrode wiring through the gate electrode at the miniaturization of the single layer gate transistor, etc. Stably-operated memory cells can be realized. Either of writing and reading can be carried out in parallel with the erase operation and high-speed access can hence be performed.

Thirteenth Embodiment

Figure 75:
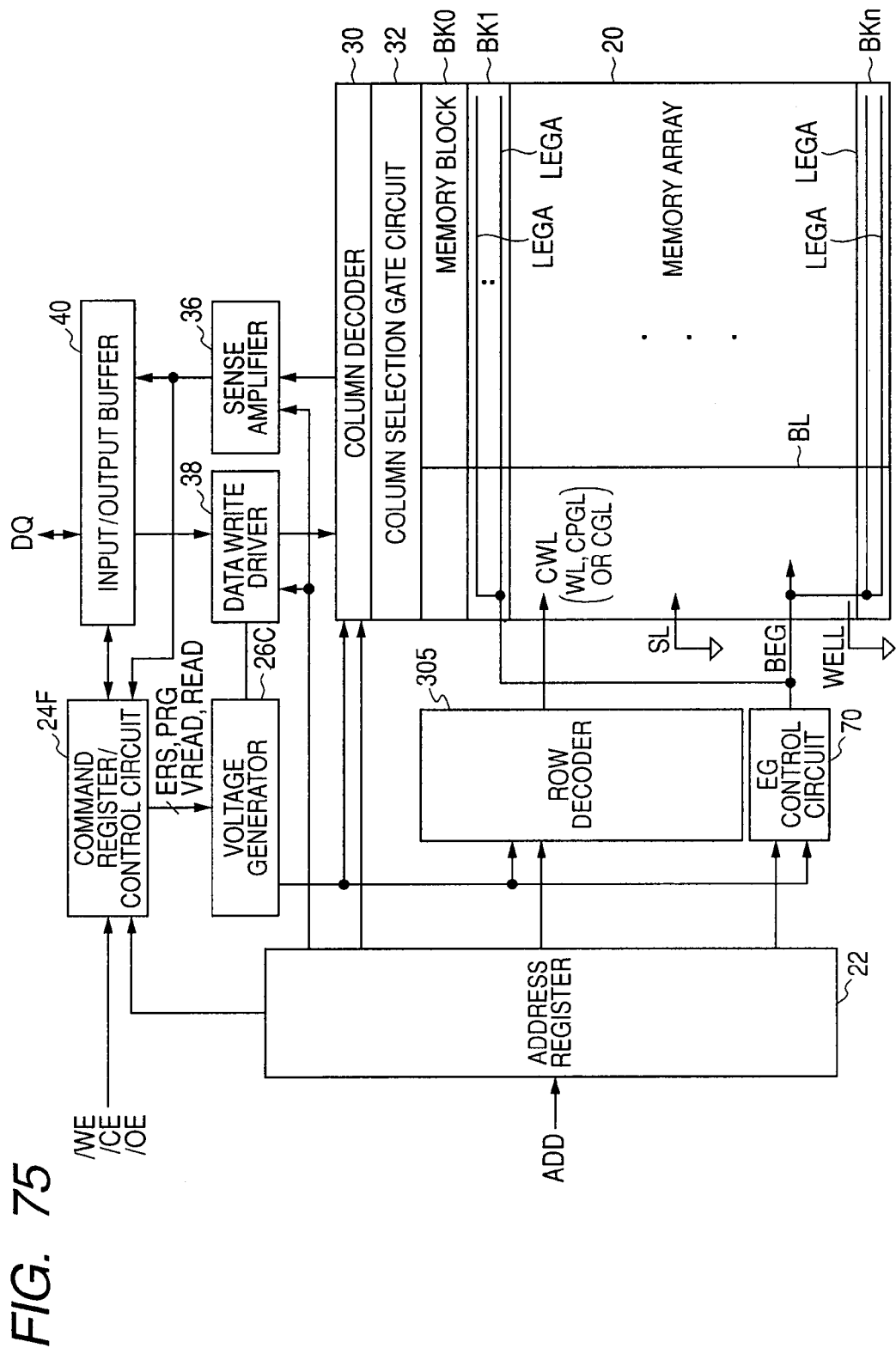
FIG. 75 is a diagram schematically illustrating an overall configuration of a semiconductor device according to a thirteenth embodiment of the present invention.

FIG. 75 is a diagram schematically showing an overall configuration of a semiconductor device according to a thirteenth embodiment of the present invention. The semiconductor device shown in FIG. 75 is different in configuration from the preceding semiconductor device shown in FIG. 23 in the following points. Namely, local erase gate wirings LEGA are arranged in a row direction within memory blocks BK0 through BKn of a memory array 20. The local erase gate wirings LEGA are not embedded wirings, but wirings-on-substrate. The local erase gate wirings LEGA at the respective memory blocks are respectively coupled in block units and set to an erase voltage, a ground voltage or an open state under the control of an EG control circuit 70.

Each row selection line CWL extending from a row decoder 305 is provided corresponding to the structure of each memory cell in the memory array 20. Namely, when the memory cell is of a memory cell having a split gate structure to be described later, the row selection line CWL has a word line WL and a coupling gate line CPGL. Alternatively, the row selection line CWL includes a control gate line CGL as an alternative to it. A source line SL is fixed to a ground voltage level.

Applied voltage levels differ according to the structure of each memory cell in the memory array 20. A command register/control circuit 24F controls an erase operation in a form similar to that of each of the sixth through tenth embodiments mentioned up to now. At a voltage generator 26C, voltages generated therefrom differ according to operation modes.

The semiconductor device shown in FIG. 75 is identical in other configuration to the semiconductor device shown in FIG. 23. The same reference numerals are attached to their corresponding portions, and their detailed explanations are omitted.

Figure 76:
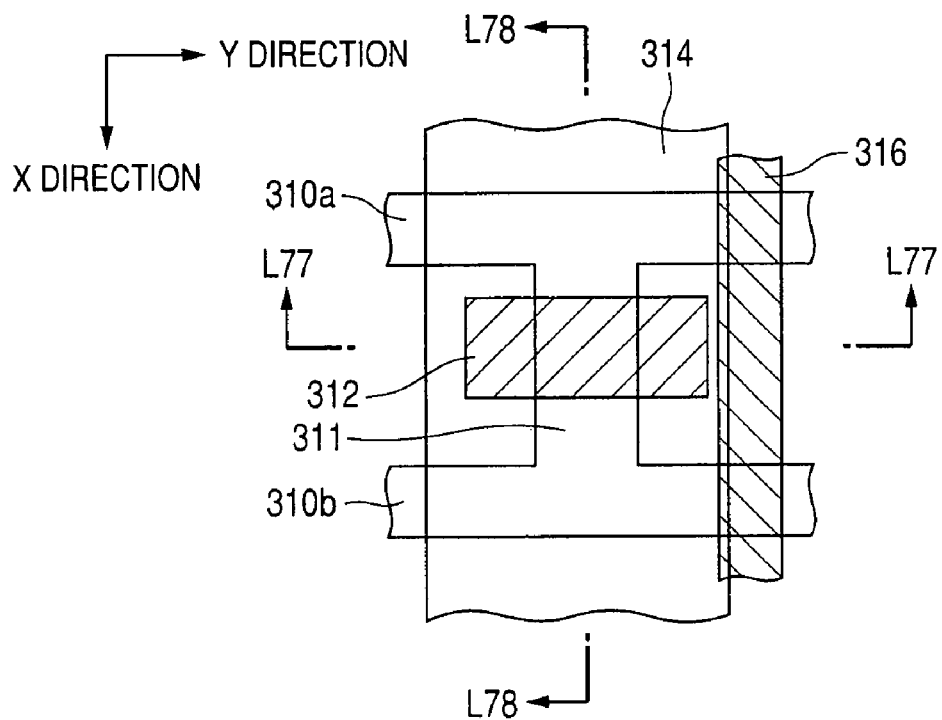
FIG. 76 is a diagram schematically depicting a planar layout of memory cells of the semiconductor device according to the thirteenth embodiment of the present invention.

FIG. 76 is a diagram schematically showing a planar layout of each memory cell employed in the twelfth embodiment of the present invention. In FIG. 76, impurity regions 310a and 310b are disposed opposite to each other so as to extend consecutively in a Y direction (column direction). Theses impurity regions 310a and 310b are coupled to each other by a channel region 311. A floating gate 312 is disposed over the channel region 311. A control gate wiring 314 is disposed over the floating gate 312 so as to overlap with the floating gate 312 and extend consecutively in an X direction. An erase gate wiring 316 is provided adjacent to the control gate wiring 314 and the floating gate 312 to extend consecutively in the X direction in such a manner that part thereof overlaps with the control gate wiring 314.

The impurity regions 310a and 310b are electrically coupled to upper-layer bit and source lines via a contact in an unillustrated region (region between the floating gate 312 and the control gate wiring 314).

The memory cell shown in FIG. 76 is of a so-called memory cell of a split gate structure, having a control gate and an erase gate.

Figure 77:
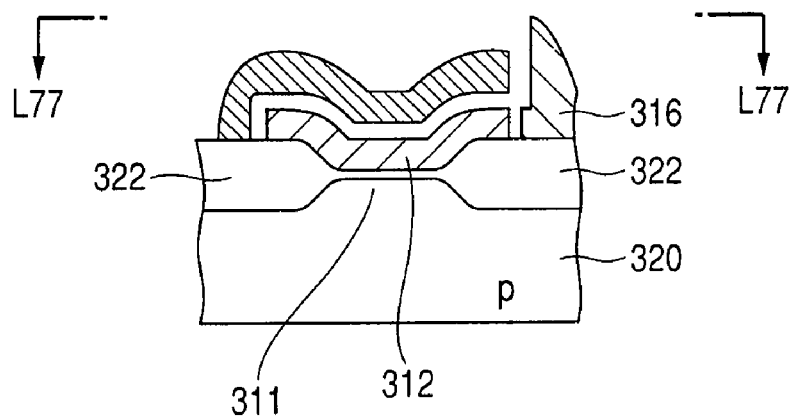
FIG. 77 is a diagram schematically showing a sectional structure taken along line L77-L77 shown in FIG. 76.

FIG. 77 is a diagram schematically showing a sectional structure taken along line L77-L77 shown in FIG. 76. In FIG. 77, the floating gate 312 and the control gate wiring 314 are disposed over a P-type semiconductor substrate region 320 so as to overlap each other. The erase gate wiring 316 is formed in such a manner that the erased gate wiring 316 adjoins the control gate wiring 314 and the floating gate 312 and part thereof overlaps with the control gate wiring. In this region, the channel region 311 has a width defined by device isolation films 322. The erase gate wiring 316 is formed over the device isolation films 322, and the device isolation films 322 separate the memory cells adjacent in the column direction from each other.

A gate insulating film is provided between these control gate wiring 314 and floating gate 312. The erase gate wiring 316 is separated from the control gate wiring 314 and the floating gate 312 by the gate insulating film.

Figure 78:
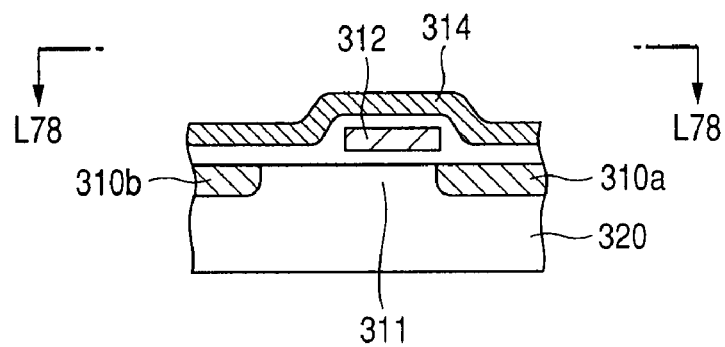
FIG. 78 is a diagram schematically illustrating a sectional structure taken along line L78-L78 shown in FIG. 76.

FIG. 78 is a diagram schematically showing a sectional structure taken along line L78-L78 shown in FIG. 76. In FIG. 78, the impurity regions 310a and 310b are disposed apart from each other at the surface of the semiconductor substrate region 320. The floating gate 312 is formed close to the impurity region 310a over the channel region 31 of the substrate region 320. The control gate wiring 314 is consecutively formed over the floating gate 312.

Figure 79:
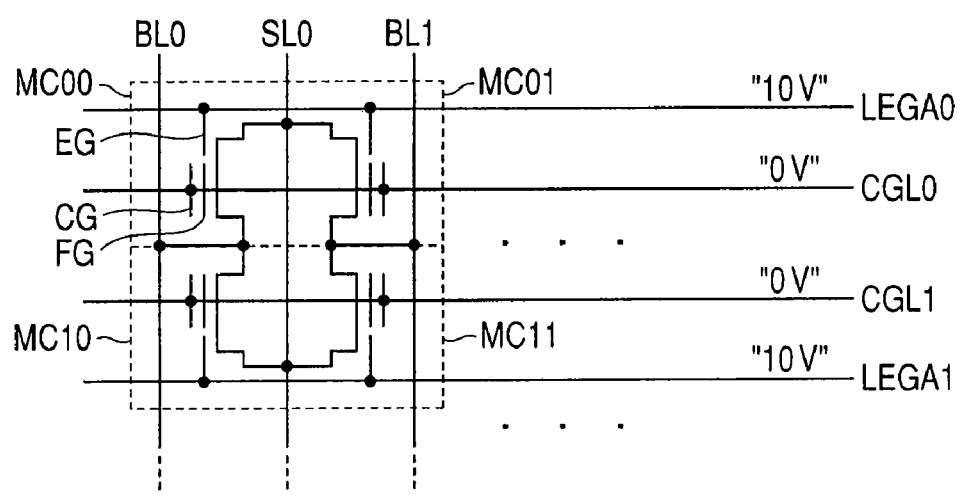
FIG. 79 is a diagram showing one example of an arrangement of memory cells of a memory array shown in FIG. 75.

FIG. 79 is a diagram schematically showing one example of an arrangement of the memory cells in the memory array 20 shown in FIG. 75. Memory cells MC00, MC01, MC10 and MC11 arranged in two rows and two columns are typically illustrated in FIG. 79. A control gate line CGL0 and a local erase gate line LEGA0 are disposed for the memory cells MC00 and MC01 arranged in a row direction. A local erase gate line LEGA1 and a control gate line CGL1 are provided for the memory cells MC10 and MC11 arranged in the row direction. The control gate lines CGL0 and CGL1 are coupled to their corresponding control gates CG of the memory cells MC (MC00, MC01, MC10 and MC11) of the corresponding rows.

On the other hand, the local erase gate line LEGA0 is coupled to the erase gates EG of the memory cells MC of the corresponding row. A floating gate FG is disposed below the control gate CG. The erase gate EG is provided adjacent to the floating gate FG.

Bit lines BL (BL0 and BL1) and a source line SL0 are provided for the memory cells MC arranged in the column direction. The source line SL0 is coupled to an impurity region disposed adjacent to the erase gate EG.

At erasure, a high voltage of, for example, 10V is applied to the corresponding local erase gate line LEGA (either of LEGA0 and LEGA1) in the corresponding row to which the selected memory cells are coupled. The remaining bit line BL, source line SL and control gate line CG are set to 0V. In this condition, the Fowler-Nordheim tunneling current flows between the erase gate EG and the floating gate FG so that electrons accumulated in the floating gate FG are discharged to the local erase gate line LEGA via the erase gate EG, whereby the erasure is carried out. The threshold voltage of the corresponding memory cell transistor at the erasure becomes low.

At writing, a high voltage of, for example, 10V is applied to the control gate line CGL (e.g., CGL0) of the selected row. A write high voltage of, for example, 5V is applied to the bit line BL (e.g., BL0) of the selected column. The source line SL0 is maintained at a ground voltage level. The erase gate line LEGA (LEGA0, LEGA1) is set to 0V. The erase gate EG is formed over the corresponding impurity region of the transistor of the memory cell MC. The erase gate EG does not overlap with the floating gate FG over the channel region. Thus, current flows from the impurity region 310b to the impurity region 310a both shown in FIG. 78 at the memory transistor, so that channel hot electrons are generated by a drain high electric filed, followed by injection of electrons into the floating gate FG.

At each non-selected memory cell, the control gate line CGL is 0V or the bit line BL is 0V. No write current flows and hence the writing of data is not performed.

At data reading, the erase gate line LEGA (LEGA0, LEGA1) is set to 0V and the control gate line CGL of the selected row is supplied with a read voltage (e.g., 1.5V). A read voltage (for example, 1V) is applied to the corresponding bit line BL of the selected column. Current flowing from the bit line to the source line via the selected memory cell is detected by the corresponding sense amplifier to perform the reading of data. At the non-selected memory cell, the corresponding control gate line CGL is 0V or the bit line BL is at a ground voltage level or in a floating state. Hence, no current flows via the non-selected memory cell.

Consider a state in which in the configuration of the corresponding memory block shown in FIG. 79, an erase high voltage of, for example, 10V is applied to the local erase gate lines LEGA0 and LEGA1 as shown in FIG. 79. In such a case, at the erase memory block including the local erase gate lines LEGA0 and LEGA1, the control gate lines CGL0, CGL1, . . . are all set to 0V and the corresponding memory transistor is brought to an off state. As shown in FIG. 78, there is provided a distance between the impurity region 310b and the floating gate 312. When the control gate wiring 314 is at the ground voltage level, no channel is formed. Thus, even if, for example, a write high voltage 5V is applied to the bit line, no current flows into each memory cell target for erasure. Thus, when erasure is being performed on one memory block, it is possible to perform the writing/reading of data to and from another memory block.

Thus, write or read data access can be performed at another memory block in parallel with the erase operation at the memory block, using the memory cells each having the split gate structure such as shown in FIGS. 76 through 78. In this case, any configuration of the preceding first through eleventh embodiments may be used as a control sequence.

Incidentally, the local erase gate lines LEGA0 and LEGA1 are all separated from each other in the configuration shown in FIG. 79. When the voltages thereof can be set individually, the erasure can be executed in units of memory cell rows.

[Modification]

Figure 80:
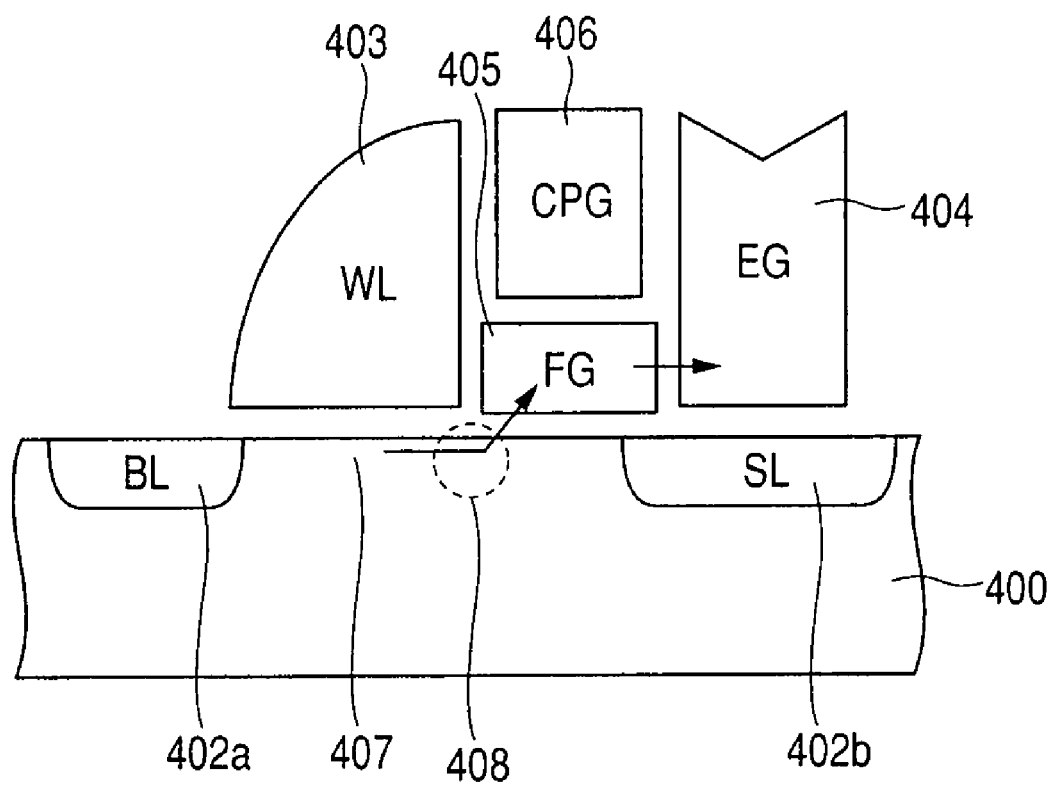
FIG. 80 is a diagram schematically illustrating a sectional structure of each memory cell employed in a modification of the thirteenth embodiment of the present invention.

FIG. 80 is a diagram schematically showing a sectional structure of a memory cell according to a modification of the semiconductor device according to the twelfth embodiment of the present invention. In FIG. 80, the memory cell includes a bit line impurity region 402a and a source line impurity region 402b formed in the surface of a semiconductor substrate region 400 with spacing defined therebetween, a word gate wiring 403 formed close to the bit line impurity region 402a over the substrate region through an unillustrated gate insulating film, a floating gate layer 405 disposed adjacent to the source line impurity region 402b, a coupling gate wiring 406 disposed close to the word gate wiring 403 over the floating gate layer 405, and an erase gate wiring 404 formed close to the coupling gate wiring 406 and the floating gate wiring layer 405 over the source line impurity region 402b.

The word gate wiring 403 configures a word line WL. The floating gate layers 405 respectively configure floating gates FG and are provided every memory cell in separate form. The erase gate wiring 404 configures an erase gate EG, the bit line impurity region 402a is coupled to its corresponding bit line BL, and the source line impurity region 402b is coupled to its corresponding source line SL.

In the memory cell shown in FIG. 80, the word line WL and the erase gate EG are disposed so as to extend continuously in a row direction. Further, a coupling gate CPG is also disposed so as to extend consecutively in the row direction.

Figure 81:
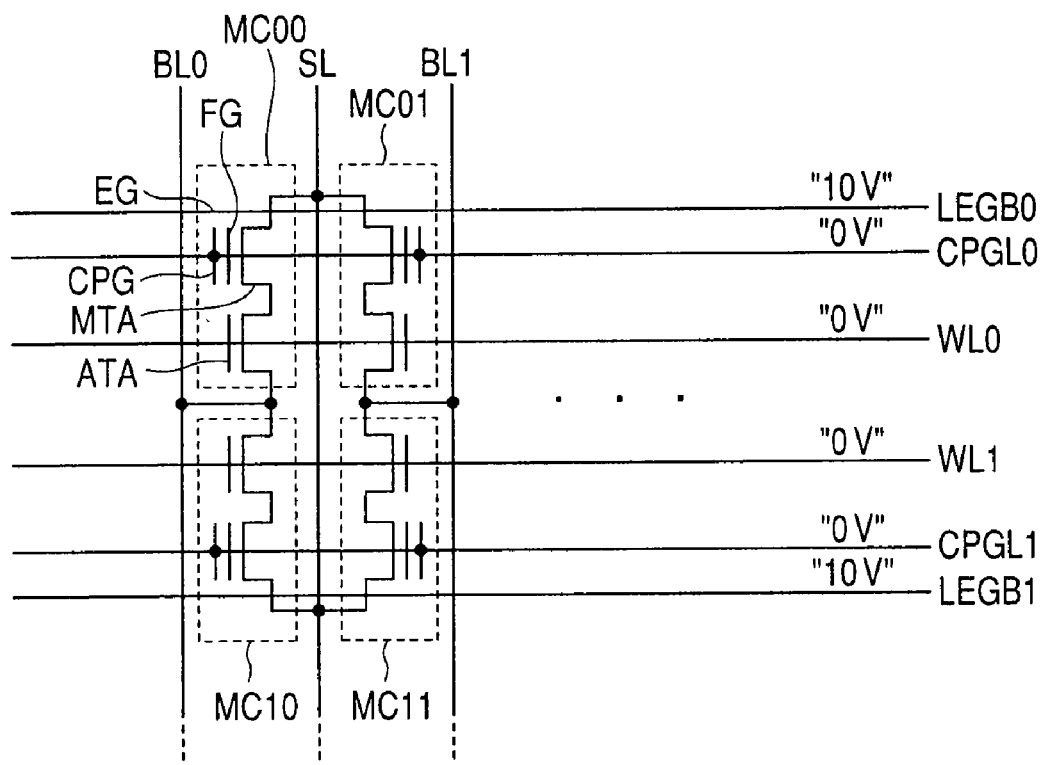
FIG. 81 is a diagram showing one example of an arrangement of an array section of the memory cells shown in FIG. 80.

FIG. 81 is a diagram showing one example of a layout of an array for memory cells. Memory cells MC00, MC01, MC10 and MC11 arranged in two rows and two columns are typically shown in FIG. 81. Since each of the memory cells MC00, MC01, MC10 and MC11 has the same configuration, reference symbols are attached to a configuration diagram of the memory cell MC00 in FIG. 81.

The memory cell MC00 is configured by a series body of an access transistor ATA and a memory transistor MTA. The access transistor ATA is comprised of a MOS transistor having a single layer gate structure. The memory transistor MTA is comprised of a MOS transistor having a stacked structure and includes a coupling gate CPG and a floating gate FG.

At the access transistor ATA, its gate is coupled to a word line WL (WL0, WL1) disposed in its corresponding row. A bit line impurity region is coupled to its corresponding bit line BL (BL0, BL1). A source impurity region is coupled to its corresponding source line SL (SL0, SL1).

At the memory transistor MTA, the coupling gate CPG thereof is coupled to its corresponding coupling gate line CPGL (CPGL0, CPGL1). The floating gate FG thereof is maintained in a floating state. An erase gate EG thereof is coupled to its corresponding erase gate line LEGB (LEGB0, LEGB1) arranged in the corresponding row.

The writing, erasing and reading of data to and from each memory cell shown in FIG. 81 are carried out in the following manner. Namely, as for the selected memory cell at writing, a write high voltage (for example, 5V) is applied to the bit line BL, and a write high voltage (for example, 5V) is applied to the word line WL. A write high voltage (for example, 10V) is applied to the coupling gate CPG. The erase gate EG and the source line SL are maintained at a ground voltage level. In this state, a channel is formed in a channel forming region 407 placed below the word line WL shown in FIG. 80. A gap region 408 exists between the word line WL and the floating gate FG and hence the channel resistance becomes high. Thus, when current flows from the bit line BL to the source line SL, hot electrons are generated by a high electric field at the gap region 408. The hot electrons are attracted onto the high voltage of the coupling gate CPG, so that electrons are injected into the floating gate FG. In the write state, the threshold voltage of the memory transistor is therefore made high.

At the data erasure, the bit line BL, source line SL, word line WL and coupling gate CPG are maintained at a ground voltage (0V), and an erase high voltage (for example, 10V) is applied to the erase gate EG. In this state, the Fowler-Nordheim tunneling current flows between the erase gate EG and the floating gate FG so that the electrons accumulated in the floating gate FG are pulled out to the erase gate EG.

At the memory block targeted for erasure, the erase gate lines LEGB0 and LEGB1 are set to an erase high voltage of, for example, 10V as shown in FIG. 81. On the other hand, the remaining coupling gate lines CPGL (CPGL0 and CPGL1) and word lines WL and WL1) are maintained at 0V, so that the access transistor ATA is maintained in an off state. Thus, even if the writing of data is performed at another memory block and a write high voltage (for example, 5V) is applied to the bit line BL0, for example, the access transistor ATA is in an off state at the memory block target for erasure, and the write operation at another memory block does not exert any adverse effect on the erase operation of the erase memory block.

At data writing, a read voltage (for example, 1.5V) is applied to the bit line BL and a read voltage (for example, 1.5V) is applied to the word line WL. The coupling gate CPG is maintained at the ground voltage level, and the source line SL and erase gate EG are also maintained at the ground voltage. When the corresponding memory cell is in an erase state at this time, the amount of charge accumulated in the floating gate is small and the channel is formed in the channel forming region 407 lying below the floating gate FG. When the corresponding word line WL is selected, current flows from the bit line BL to the source line SL. On the other hand, when the memory cell is in a write state, electrons are injected into the floating gate FG and hence no channel is formed in the channel forming region 407 lying below the floating gate FG. Thus, even if the corresponding word line WL is brought to the selected state, no current flows from the bit line BL to the sore line SL. The current on the bit line BL is detected by the sense amplifier to thereby perform data reading.

Upon this reading, the read voltage of the bit line is 1.5V, for example, which does not exert any adverse effect on the erase operation at the memory block target for erasure.

Thus, even when the word line WL and the erase gate EG are arranged so as to consecutively extend in parallel in the row direction as shown in FIG. 80, write access or read access can be performed at another memory block in parallel with the erase operation of the erase memory block in a manner similar to the first through tenth embodiments mentioned up to now. In this case, the access control sequence employed in any of the first through tenth embodiments may be used.

Thus, if such a memory cell structure that the erase gate is completely separated from the bit line BL is taken as the memory cell structure, then writing or reading can be executed in parallel with the erase operation at another memory block when erasure is performed in memory block units.

When, at this time, the local erase gate lines are respectively separated from each other and the voltages can be set to the individual local erase gate lines, the memory cells of one row can be set as erase units.

According to the thirteenth embodiment of the present invention as described above, the erasure is executed in the memory block units even in the configuration that the word lines and the erase gate lines are arranged in parallel in the row direction, thereby making it possible to execute erasure at one memory block and execute write or read access at another memory block. Thus, high-speed writing/reading can be carried out and access efficiency is hence improved.

A semiconductor device according to the present invention is capable of realizing a memory device and a memory system capable of shortening an erase time efficiently to thereby perform data access by applying the semiconductor device to each individual memory device and a mixed memory integrated over the same semiconductor substrate as logic such as a processor.

What is claimed is:

1. A semiconductor device comprising:
  a plurality of memory cells arranged in rows and columns, said each memory cell including: a memory transistor having a floating gate formed over a substrate region, and a memory gate disposed over the floating gate; an assist gate transistor having an assist gate disposed adjacent to the floating gate and the memory gate and coupled in series to the memory transistor; and an embedded erase gate formed in a surface of a device isolation region formed in the surface of the substrate region, said each memory cell storing therein data on a nonvolatile basis according to an amount of an electrical charge accumulated in the floating gate;
  a plurality of memory gate lines disposed corresponding to the respective rows of the memory cells and coupled to their corresponding memory gates of the memory cells in the corresponding rows;
  a plurality of assist gate lines disposed corresponding to the respective rows of the memory cells and coupled to their corresponding assist gates in the corresponding rows;
  a plurality of embedded erase gate wirings disposed corresponding to the respective columns of the memory cells and coupled to their corresponding embedded erase gates in the corresponding columns;
  a plurality of source lines disposed corresponding to the respective columns of the memory cells and coupled to their corresponding first conduction nodes of the memory transistors of the memory cells in the corresponding columns;
  a plurality of bit lines disposed corresponding to the respective columns of the memory cells and coupled to their corresponding second conduction nodes of the assist gate transistors of the memory cells in the corresponding columns; and
  a control circuit which controls an operation designated to each memory cell designated in accordance with an operation mode instruction and an address signal,
  wherein the control circuit includes: an erase controller which, when an erase operation is designated, designates voltages supplied to the source line, the memory gate line and the embedded erase gate wiring for each selected memory cell and controls the erase operation; and a read controller which designates voltages necessary for reading, supplied to the assist gate line and the bit line for the selected memory cell and controls a read operation,
  wherein the erase controller and the read controller are respectively capable of operation in parallel,
  wherein said semiconductor device includes: a voltage generator which generates a designated voltage in accordance with a voltage selection signal outputted from each of the erase controller and the read controller; an erase circuit which transfers the erase voltage outputted from the voltage generator to the embedded erase gate wiring of each selected memory cell; and a read circuit which supplies the read voltage outputted from the voltage generator to each selected memory cell to read out data stored in the selected memory cell, and
  wherein the read circuit is operation-controlled by the control circuit so as to read the stored data during application of the erase voltage by the erase circuit.

2. The semiconductor device according to claim 1, wherein the read circuit performs data reading for verifying an erase state of each memory cell selected to perform the erase operation.

3. The semiconductor device according to claim 1, wherein the read controller controls the reading of stored data from each non-selected memory cell coupled to a bit line different from a corresponding bit line to which the selected memory cell is coupled.

4. The semiconductor device according to claim 1,
wherein the control circuit further includes an erase verify control circuit for controlling a verify read operation for verifying an erase state of each memory cell selected to perform the erase operation, and
wherein when a read operation is designated in accordance with the operation mode instruction where operation mode instruction indicates an erase operation, the read controller controls the reading of stored data from each non-selected memory cell coupled to the assist gate line of the selected memory cell.

5. The semiconductor device according to claim 1,
wherein the memory cells are divided into a plurality of erase units,
wherein the bit lines are respectively disposed in common to the erase units,
wherein the embedded erase gate wirings are divided into the respective erase units, and
wherein the control circuit further includes a write controller which controls the write circuit in such a manner that writing is performed on each non-selected memory cell of the erase unit different from the erase unit containing the memory cell selected for the erasure in response to the operation mode instruction and the address signal, in parallel with the application of the erase voltage to the memory cell selected for the erasure by the erase controller.

6. The semiconductor device according to claim 1, wherein when the data is read during the application of the erase voltage, the read controller controls the read circuit so as to apply a read voltage during a period shorter than an erase pulse application period for the erasure and apply the read voltage at intervals each shorter than the erase pulse application period.

* * * * *